US012615769B2

(12) United States Patent
Petti et al.

(10) Patent No.: US 12,615,769 B2
(45) Date of Patent: Apr. 28, 2026

(54) THREE-DIMENSIONAL NOR MEMORY STRING ARRAYS OF THIN-FILM FERROELECTRIC TRANSISTORS

(71) Applicant: SUNRISE MEMORY CORPORATION, San Jose, CA (US)

(72) Inventors: Christopher J. Petti, Mountain View, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 758 days.

(21) Appl. No.: 17/817,609

(22) Filed: Aug. 4, 2022

(65) Prior Publication Data

US 2023/0077181 A1     Mar. 9, 2023

Related U.S. Application Data

(60) Provisional application No. 63/240,715, filed on Sep. 3, 2021.

(51) Int. Cl.
*H01L 21/8239* (2006.01)
*G11C 16/04* (2006.01)
(Continued)

(52) U.S. Cl.
CPC ......... *H10B 41/27* (2023.02); *G11C 16/0483* (2013.01); *H10B 41/10* (2023.02);
(Continued)

(58) Field of Classification Search
CPC ........ H10B 43/27; H10B 43/10; H10B 43/20; H10B 43/35; H10B 51/30; H10B 41/27;
(Continued)

(56) References Cited

U.S. PATENT DOCUMENTS

| | | | |
|---|---|---|---|
| 4,213,139 | A | 7/1980 | Rao |
| 4,984,153 | A | 1/1991 | Kregness et al. |

(Continued)

FOREIGN PATENT DOCUMENTS

| | | |
|---|---|---|
| CN | 111799263 A | 10/2020 |
| EP | 1870905 A1 | 12/2007 |

(Continued)

OTHER PUBLICATIONS

"PCT Search Report and Written Opinion, PCT/US2022/039473", Dec. 6, 2022, 14 pages.
(Continued)

*Primary Examiner* — Ajay Ojha
*Assistant Examiner* — Tsz K Chiu

(57) ABSTRACT

A memory structure includes storage transistors organized as horizontal NOR memory strings where the storage transistors are thin-film ferroelectric field-effect transistors (FeFETs) having a ferroelectric gate dielectric layer formed adjacent a semiconductor channel. In some embodiments, the semiconductor channel is formed by an oxide semiconductor material and the ferroelectric storage transistors are junctionless transistors with no p/n junction in the channel. In some embodiments, the ferroelectric storage transistors in each NOR memory string share a first conductive layer as a common source line and a second conductive layer as a common bit line, the first and second conductive layers being in electrical contact with the semiconductor channel. The ferroelectric storage transistors in a multiplicity of NOR memory strings are arranged to form semi-autonomous three-dimensional memory arrays (tiles) with each tile individually addressed and controlled by circuitry in the semiconductor substrate underneath each tile in cooperation with a memory controller.

52 Claims, 27 Drawing Sheets

(51) Int. Cl.

| | |
|---|---|
| *H01L 27/11568* | (2017.01) |
| *H10B 41/10* | (2023.01) |
| *H10B 41/27* | (2023.01) |
| *H10B 43/10* | (2023.01) |
| *H10B 43/27* | (2023.01) |
| *H10D 30/67* | (2025.01) |
| *H10D 30/69* | (2025.01) |
| *H10D 62/10* | (2025.01) |

(52) U.S. Cl.
CPC .............. *H10B 43/10* (2023.02); *H10B 43/27* (2023.02); *H10D 30/6755* (2025.01); *H10D 30/701* (2025.01); *H10D 62/115* (2025.01)

(58) Field of Classification Search
CPC ........ H10B 51/20; H10B 43/40; H10B 69/00; H10B 43/30; H10B 43/50; H10B 41/30; H10B 53/30; H10B 41/20; H10B 51/10; H10B 41/35; H10B 51/00; H10B 12/20; H10B 12/50; H10B 41/10; H10B 63/845; H10B 53/20; H10B 10/12; H10B 41/40; H10B 41/50; H10B 51/40; H10B 63/30; H10B 12/05; H10B 51/50; H10B 53/00; H10B 63/84; H10B 10/00; H10B 12/053; H10B 20/00; H10B 43/00; H10B 43/23; H10B 63/20; H10B 63/34; H10B 12/36; H10B 20/25; H10B 53/10; H10B 63/80; H10B 12/00; H10B 12/315; H10B 12/34; H10B 20/60; H10B 41/23; H10B 41/41; H10B 41/60; H10B 63/10; H10B 10/125; H10B 10/18; H10B 12/0335; H10B 12/0383; H10B 12/09; H10B 12/482; H10B 12/488; H10B 20/40; H10B 41/00; H10B 41/49; H10B 61/22; H10B 12/0385; H10B 12/0387; H10B 12/056; H10B 12/10; H10B 12/30; H10B 12/33; H10B 12/395; H10B 20/10; H10B 20/50; H10B 41/42; H10B 41/46; H10B 41/70; H10B 63/00; H10B 63/22; H01L 21/28291; H10D 64/689; H10D 30/0415; H10D 30/701; G11C 11/223
See application file for complete search history.

(56) References Cited

U.S. PATENT DOCUMENTS

| | | | |
|---|---|---|---|
| 5,388,246 | A | 2/1995 | Kasai |
| 5,583,808 | A | 12/1996 | Brahmbhatt |
| 5,646,886 | A | 7/1997 | Brahmbhatt |
| 5,656,842 | A | 8/1997 | Iwamatsu |
| 5,768,192 | A | 6/1998 | Eitan |
| 5,789,776 | A | 8/1998 | Lancaster et al. |
| 5,880,993 | A | 3/1999 | Kramer et al. |
| 5,915,167 | A | 6/1999 | Leedy |
| 6,040,605 | A | 3/2000 | Sano et al. |
| 6,057,862 | A | 5/2000 | Margulis |
| 6,107,133 | A | 8/2000 | Furukawa et al. |
| 6,118,171 | A | 9/2000 | Davies et al. |
| 6,130,838 | A | 10/2000 | Kim et al. |
| 6,313,518 | B1 | 11/2001 | Ahn et al. |
| 6,314,046 | B1 | 11/2001 | Kamiya et al. |
| 6,362,508 | B1 | 3/2002 | Rasovaky et al. |
| 6,434,053 | B1 | 8/2002 | Fujiwara |
| 6,580,124 | B1 | 6/2003 | Cleeves et al. |
| 6,587,365 | B1 | 7/2003 | Salling |
| 6,609,236 | B2 | 8/2003 | Watanabe et al. |
| 6,627,503 | B2 | 9/2003 | Ma |
| 6,744,094 | B2 | 6/2004 | Forbes |
| 6,754,105 | B1 | 6/2004 | Chang et al. |
| 6,774,458 | B2 | 8/2004 | Fricke et al. |
| 6,873,004 | B1 | 3/2005 | Han et al. |
| 6,881,994 | B2 | 4/2005 | Lee et al. |
| 6,946,703 | B2 | 9/2005 | Ryu et al. |
| 7,005,350 | B2 | 2/2006 | Walker et al. |
| 7,223,653 | B2 | 5/2007 | Cheng et al. |
| 7,307,308 | B2 | 12/2007 | Lee |
| 7,426,141 | B2 | 9/2008 | Takeuchi |
| 7,465,980 | B2 | 12/2008 | Arimoto et al. |
| 7,489,002 | B2 | 2/2009 | Forbes et al. |
| 7,495,963 | B2 | 2/2009 | Edahiro et al. |
| 7,512,012 | B2 | 3/2009 | Kuo |
| 7,524,725 | B2 | 4/2009 | Chung |
| 7,542,348 | B1 | 6/2009 | Kim |
| 7,612,411 | B2 | 11/2009 | Walker |
| 7,709,359 | B2 | 5/2010 | Boes et al. |
| 7,804,145 | B2 | 9/2010 | Shimizu et al. |
| 7,872,295 | B2 | 1/2011 | Park et al. |
| 7,876,614 | B2 | 1/2011 | Kang et al. |
| 7,898,009 | B2 | 3/2011 | Wilson et al. |
| 8,026,521 | B1 | 9/2011 | Or-Bach et al. |
| 8,139,418 | B2 | 3/2012 | Carman |
| 8,178,396 | B2 | 5/2012 | Sinha et al. |
| 8,237,213 | B2 | 8/2012 | Liu |
| 8,242,504 | B2 | 8/2012 | Kim |
| 8,278,183 | B2 | 10/2012 | Lerner |
| 8,304,823 | B2 | 11/2012 | Boescke |
| 8,383,482 | B2 | 2/2013 | Kim et al. |
| 8,395,942 | B2 | 3/2013 | Samachisa et al. |
| 8,604,618 | B2 | 12/2013 | Cooney et al. |
| 8,630,114 | B2 | 1/2014 | Lue |
| 8,743,612 | B2 | 6/2014 | Choi et al. |
| 8,767,436 | B2 | 7/2014 | Scalia et al. |
| 8,767,473 | B2 | 7/2014 | Shim et al. |
| 8,848,425 | B2 | 9/2014 | Schloss |
| 8,878,278 | B2 | 11/2014 | Alsmeier et al. |
| 9,053,801 | B2 | 6/2015 | Sandhu et al. |
| 9,053,802 | B2 | 6/2015 | Mueller |
| 9,105,310 | B2 | 8/2015 | Li et al. |
| 9,158,622 | B2 | 10/2015 | Lee et al. |
| 9,190,293 | B2 | 11/2015 | Wang et al. |
| 9,202,694 | B2 | 12/2015 | Konevecki et al. |
| 9,219,225 | B2 | 12/2015 | Karda et al. |
| 9,230,985 | B1 | 1/2016 | Wu et al. |
| 9,231,206 | B2 | 1/2016 | Tao et al. |
| 9,263,577 | B2 | 2/2016 | Ramaswamy et al. |
| 9,281,044 | B2 | 3/2016 | Ramaswamy et al. |
| 9,299,580 | B2 | 3/2016 | Kong et al. |
| 9,337,210 | B2 | 5/2016 | Karda et al. |
| 9,362,487 | B2 | 6/2016 | Inumiya et al. |
| 9,391,084 | B2 | 7/2016 | Lue |
| 9,412,752 | B1 | 8/2016 | Yeh et al. |
| 9,455,268 | B2 | 9/2016 | Oh et al. |
| 9,472,560 | B2 | 10/2016 | Ramaswamy et al. |
| 9,530,794 | B2 | 12/2016 | Ramaswamy et al. |
| 9,558,804 | B2 | 1/2017 | Mue |
| 9,620,605 | B2 | 4/2017 | Liang et al. |
| 9,633,944 | B2 | 4/2017 | Kim |
| 9,698,152 | B2 | 7/2017 | Peri |
| 9,711,529 | B2 | 7/2017 | Hu et al. |
| 9,748,172 | B2 | 8/2017 | Takaki |
| 9,786,684 | B2 | 10/2017 | Ramaswamy et al. |
| 9,799,761 | B2 | 10/2017 | Or-Bach et al. |
| 9,818,468 | B2 | 11/2017 | Müller |
| 9,818,848 | B2 | 11/2017 | Sun et al. |
| 9,830,969 | B2 | 11/2017 | Slesazeck et al. |
| 9,842,651 | B2 | 12/2017 | Harari |
| 9,865,680 | B2 | 1/2018 | Okumura et al. |
| 9,875,784 | B1 | 1/2018 | Li et al. |
| 9,876,018 | B2 | 1/2018 | Chavan et al. |
| 9,892,800 | B2 | 2/2018 | Harari |
| 9,911,497 | B1 | 3/2018 | Harari |
| 9,941,299 | B1 | 4/2018 | Chen et al. |
| 10,014,317 | B2 | 7/2018 | Peng |
| 10,038,092 | B1 | 7/2018 | Chen et al. |
| 10,043,567 | B2 | 8/2018 | Slesazeck et al. |
| 10,056,393 | B2 | 8/2018 | Schroeder et al. |
| 10,074,667 | B1 | 9/2018 | Higashi |
| 10,090,036 | B2 | 10/2018 | Van Houdt |
| 10,096,364 | B2 | 10/2018 | Harari |

</div>

(56) References Cited

U.S. PATENT DOCUMENTS

| | | | | |
|---|---|---|---|---|
| 10,121,553 | B2 * | 11/2018 | Harari | G11C 16/0483 |
| 10,157,780 | B2 | 12/2018 | Wu et al. | |
| 10,211,223 | B2 | 2/2019 | Van Houdt et al. | |
| 10,211,312 | B2 | 2/2019 | Van Houdt et al. | |
| 10,217,667 | B2 | 2/2019 | Or-Bach et al. | |
| 10,249,370 | B2 | 4/2019 | Harari | |
| 10,254,968 | B1 | 4/2019 | Gazit et al. | |
| 10,283,493 | B1 | 5/2019 | Nishida | |
| 10,319,696 | B1 | 6/2019 | Nakano | |
| 10,355,121 | B2 | 7/2019 | Or-Bach et al. | |
| 10,373,956 | B2 | 8/2019 | Gupta et al. | |
| 10,381,086 | B2 | 8/2019 | Goda et al. | |
| 10,381,370 | B2 | 8/2019 | Shin et al. | |
| 10,381,378 | B1 | 8/2019 | Harari | |
| 10,395,737 | B2 | 8/2019 | Harari | |
| 10,403,627 | B2 | 9/2019 | Van Houdt et al. | |
| 10,418,377 | B2 | 9/2019 | Van Houdt et al. | |
| 10,424,379 | B2 | 9/2019 | Slesazeck et al. | |
| 10,431,596 | B2 | 10/2019 | Herner et al. | |
| 10,438,645 | B2 | 10/2019 | Muell et al. | |
| 10,453,860 | B1 | 10/2019 | Xiao | |
| 10,460,788 | B2 | 10/2019 | Mueller | |
| 10,475,812 | B2 | 11/2019 | Harari | |
| 10,510,773 | B2 | 12/2019 | Ramaswamy et al. | |
| 10,600,808 | B2 | 3/2020 | Schröder et al. | |
| 10,608,008 | B2 | 3/2020 | Harari et al. | |
| 10,608,011 | B2 | 3/2020 | Harari et al. | |
| 10,622,051 | B2 | 4/2020 | Mueller et al. | |
| 10,622,377 | B2 | 4/2020 | Harari et al. | |
| 10,636,471 | B2 | 4/2020 | Ramaswamy et al. | |
| 10,650,892 | B2 | 5/2020 | Noack | |
| 10,651,153 | B2 | 5/2020 | Fastow et al. | |
| 10,651,182 | B2 | 5/2020 | Morris et al. | |
| 10,651,196 | B1 | 5/2020 | Sharangpani et al. | |
| 10,692,837 | B1 | 6/2020 | Nguyen et al. | |
| 10,692,874 | B2 | 6/2020 | Harari et al. | |
| 10,700,093 | B1 | 6/2020 | Kalitsov et al. | |
| 10,720,437 | B2 | 7/2020 | Yoo | |
| 10,825,834 | B1 | 11/2020 | Chen | |
| 10,872,905 | B2 | 12/2020 | Muel | |
| 10,879,269 | B1 | 12/2020 | Zhang et al. | |
| 10,896,711 | B2 | 1/2021 | Lee et al. | |
| 10,937,482 | B2 | 3/2021 | Sharma et al. | |
| 10,950,616 | B2 | 3/2021 | Harari et al. | |
| 11,018,155 | B2 | 5/2021 | Zhu et al. | |
| 11,171,157 | B1 | 11/2021 | Lai et al. | |
| 11,217,494 | B1 * | 1/2022 | Young | H01L 21/02603 |
| 11,411,025 | B2 | 8/2022 | Lai et al. | |
| 2001/0030340 | A1 | 10/2001 | Fujiwara | |
| 2001/0038132 | A1 | 11/2001 | Ahn et al. | |
| 2001/0053092 | A1 | 12/2001 | Kosaka et al. | |
| 2002/0012271 | A1 | 1/2002 | Forbes | |
| 2002/0028541 | A1 | 3/2002 | Lee et al. | |
| 2002/0051378 | A1 | 5/2002 | Ohsawa | |
| 2002/0193484 | A1 | 12/2002 | Albee | |
| 2003/0038318 | A1 | 2/2003 | Forbes | |
| 2004/0214387 | A1 | 10/2004 | Madurawe et al. | |
| 2004/0246807 | A1 | 12/2004 | Lee | |
| 2004/0262681 | A1 | 12/2004 | Masuoka et al. | |
| 2004/0262772 | A1 | 12/2004 | Ramanathan et al. | |
| 2004/0264247 | A1 | 12/2004 | Kim | |
| 2005/0128815 | A1 | 6/2005 | Ishikawa et al. | |
| 2005/0236625 | A1 | 10/2005 | Schuele et al. | |
| 2005/0280061 | A1 | 12/2005 | Lee | |
| 2006/0001083 | A1 | 1/2006 | Bhattacharyya | |
| 2006/0080457 | A1 | 4/2006 | Hiramatsu et al. | |
| 2006/0155921 | A1 | 7/2006 | Gorobets et al. | |
| 2006/0212651 | A1 | 9/2006 | Ashmore | |
| 2006/0261404 | A1 | 11/2006 | Forbes | |
| 2007/0012987 | A1 | 1/2007 | McTeer | |
| 2007/0023817 | A1 | 2/2007 | Dao | |
| 2007/0045711 | A1 | 3/2007 | Bhattacharyya | |
| 2007/0134876 | A1 | 6/2007 | Lai et al. | |
| 2007/0192518 | A1 | 8/2007 | Rupanagunta et al. | |
| 2008/0022026 | A1 | 1/2008 | Yang et al. | |
| 2008/0054346 | A1 | 3/2008 | Saitoh et al. | |
| 2008/0149992 | A1 | 6/2008 | Gidon | |
| 2008/0160765 | A1 | 7/2008 | Lee et al. | |
| 2008/0173930 | A1 | 7/2008 | Watanabe | |
| 2008/0178794 | A1 | 7/2008 | Cho et al. | |
| 2008/0212358 | A1 | 9/2008 | Mitsui | |
| 2008/0239812 | A1 | 10/2008 | Naofumi et al. | |
| 2008/0266960 | A1 | 10/2008 | Kuo | |
| 2008/0291723 | A1 | 11/2008 | Wang et al. | |
| 2008/0301359 | A1 | 12/2008 | Smith | |
| 2009/0057722 | A1 | 3/2009 | Masuoka et al. | |
| 2009/0135651 | A1 | 5/2009 | Kojima et al. | |
| 2009/0140318 | A1 | 6/2009 | Dong | |
| 2009/0157946 | A1 | 6/2009 | Arya | |
| 2009/0237996 | A1 | 9/2009 | Kirsch et al. | |
| 2009/0268519 | A1 | 10/2009 | Ishii | |
| 2009/0279360 | A1 | 11/2009 | Peter et al. | |
| 2009/0290442 | A1 | 11/2009 | Rajan | |
| 2009/0316487 | A1 | 12/2009 | Lee et al. | |
| 2010/0013001 | A1 | 1/2010 | Cho et al. | |
| 2010/0121994 | A1 | 5/2010 | Kim et al. | |
| 2010/0124116 | A1 | 5/2010 | Takashi et al. | |
| 2010/0128509 | A1 | 5/2010 | Kim et al. | |
| 2010/0148215 | A1 | 6/2010 | Schulze et al. | |
| 2010/0207185 | A1 | 8/2010 | Lee et al. | |
| 2010/0219392 | A1 | 9/2010 | Awaya et al. | |
| 2010/0254191 | A1 | 10/2010 | Son et al. | |
| 2010/0327413 | A1 | 12/2010 | Lee et al. | |
| 2011/0003418 | A1 | 1/2011 | Sakata et al. | |
| 2011/0044113 | A1 | 2/2011 | Kim | |
| 2011/0047325 | A1 | 2/2011 | Mishima | |
| 2011/0115011 | A1 | 5/2011 | Masuoka et al. | |
| 2011/0134705 | A1 | 6/2011 | Jones et al. | |
| 2011/0143519 | A1 | 6/2011 | Lerner | |
| 2011/0170266 | A1 | 7/2011 | Haensh et al. | |
| 2011/0208905 | A1 | 8/2011 | Shaeffer et al. | |
| 2011/0298013 | A1 | 12/2011 | Hwang et al. | |
| 2011/0310683 | A1 | 12/2011 | Gorobets | |
| 2012/0063223 | A1 | 3/2012 | Lee | |
| 2012/0146126 | A1 | 6/2012 | Lai et al. | |
| 2012/0182801 | A1 | 7/2012 | Lue | |
| 2012/0208347 | A1 | 8/2012 | Hwang et al. | |
| 2012/0223380 | A1 | 9/2012 | Lee et al. | |
| 2012/0243314 | A1 | 9/2012 | Takashi | |
| 2012/0307568 | A1 | 12/2012 | Banna et al. | |
| 2012/0327714 | A1 | 12/2012 | Lue | |
| 2013/0031325 | A1 | 1/2013 | Nakamoto et al. | |
| 2013/0126957 | A1 | 5/2013 | Higashitani et al. | |
| 2013/0256780 | A1 | 10/2013 | Kai et al. | |
| 2014/0015036 | A1 | 1/2014 | Fursin et al. | |
| 2014/0040698 | A1 | 2/2014 | Loh et al. | |
| 2014/0070289 | A1 | 3/2014 | Tanaka et al. | |
| 2014/0070290 | A1 | 3/2014 | Inumiya et al. | |
| 2014/0075135 | A1 | 3/2014 | Choi et al. | |
| 2014/0112075 | A1 | 4/2014 | Dunga et al. | |
| 2014/0117366 | A1 | 5/2014 | Saitoh | |
| 2014/0151774 | A1 | 6/2014 | Rhie | |
| 2014/0173017 | A1 | 6/2014 | Takagi et al. | |
| 2014/0198575 | A1 | 7/2014 | Dutta et al. | |
| 2014/0213032 | A1 | 7/2014 | Kai et al. | |
| 2014/0229131 | A1 | 8/2014 | Cohen et al. | |
| 2014/0247674 | A1 | 9/2014 | Karda et al. | |
| 2014/0328128 | A1 | 11/2014 | Louie et al. | |
| 2014/0340952 | A1 | 11/2014 | Ramaswamy et al. | |
| 2014/0355328 | A1 | 12/2014 | Muller et al. | |
| 2015/0054507 | A1 | 2/2015 | Gulaka et al. | |
| 2015/0098272 | A1 | 4/2015 | Kasolra et al. | |
| 2015/0113214 | A1 | 4/2015 | Sutardja | |
| 2015/0155876 | A1 | 6/2015 | Jayasena et al. | |
| 2015/0194440 | A1 | 7/2015 | Noh et al. | |
| 2015/0220463 | A1 | 8/2015 | Fluman et al. | |
| 2015/0249143 | A1 | 9/2015 | Sano | |
| 2015/0263005 | A1 | 9/2015 | Zhao et al. | |
| 2015/0340371 | A1 | 11/2015 | Lui | |
| 2015/0372099 | A1 | 12/2015 | Chen et al. | |
| 2016/0013156 | A1 | 1/2016 | Zhai et al. | |
| 2016/0019951 | A1 | 1/2016 | Park et al. | |
| 2016/0035711 | A1 | 2/2016 | Hu | |
| 2016/0086970 | A1 | 3/2016 | Peng | |

(56) References Cited

U.S. PATENT DOCUMENTS

| | | |
|---|---|---|
| 2016/0118404 A1 | 4/2016 | Peng |
| 2016/0141294 A1 | 5/2016 | Peri et al. |
| 2016/0225860 A1 | 8/2016 | Karda et al. |
| 2016/0276360 A1 | 9/2016 | Doda et al. |
| 2016/0300724 A1 | 10/2016 | Levy et al. |
| 2016/0314042 A1 | 10/2016 | Plants |
| 2016/0321002 A1 | 11/2016 | Jung et al. |
| 2016/0322368 A1* | 11/2016 | Sun ..................... G11C 11/223 |
| 2016/0358934 A1 | 12/2016 | Lin et al. |
| 2017/0053906 A1 | 2/2017 | Or-Bach et al. |
| 2017/0062456 A1 | 3/2017 | Sugino et al. |
| 2017/0092370 A1* | 3/2017 | Harari ................... H10D 88/00 |
| 2017/0092371 A1* | 3/2017 | Harari ................. H10D 30/693 |
| 2017/0140807 A1 | 5/2017 | Sun et al. |
| 2017/0148517 A1* | 5/2017 | Harari ................... H10D 62/83 |
| 2017/0148810 A1 | 5/2017 | Kai et al. |
| 2017/0194341 A1 | 7/2017 | Yamada |
| 2017/0213731 A1 | 7/2017 | Yoon et al. |
| 2017/0213821 A1 | 7/2017 | Or-Bach et al. |
| 2017/0358594 A1 | 12/2017 | Lu et al. |
| 2018/0006044 A1 | 1/2018 | Chavan et al. |
| 2018/0095127 A1 | 4/2018 | Pappu et al. |
| 2018/0108416 A1 | 4/2018 | Harari |
| 2018/0144977 A1 | 5/2018 | Yu et al. |
| 2018/0151419 A1 | 5/2018 | Wu et al. |
| 2018/0261613 A1 | 9/2018 | Ariyoshi et al. |
| 2018/0269229 A1 | 9/2018 | Or-Bach et al. |
| 2018/0286918 A1 | 10/2018 | Bandyopadhyay et al. |
| 2018/0330791 A1 | 11/2018 | Li et al. |
| 2018/0331042 A1 | 11/2018 | Manusharow et al. |
| 2018/0342455 A1 | 11/2018 | Nosho et al. |
| 2018/0342544 A1 | 11/2018 | Lee et al. |
| 2018/0366471 A1 | 12/2018 | Harari et al. |
| 2018/0366485 A1 | 12/2018 | Harari |
| 2018/0366489 A1 | 12/2018 | Harari et al. |
| 2018/0374929 A1 | 12/2018 | Yoo |
| 2019/0006009 A1 | 1/2019 | Harari |
| 2019/0006015 A1 | 1/2019 | Norman et al. |
| 2019/0006376 A1* | 1/2019 | Ramaswamy ......... H10B 12/03 |
| 2019/0019564 A1 | 1/2019 | Li et al. |
| 2019/0067327 A1 | 2/2019 | Herner et al. |
| 2019/0148286 A1 | 5/2019 | Or-Bach et al. |
| 2019/0157296 A1 | 5/2019 | Harari et al. |
| 2019/0180821 A1 | 6/2019 | Harari |
| 2019/0206890 A1 | 7/2019 | Harari et al. |
| 2019/0214077 A1 | 7/2019 | Oh et al. |
| 2019/0237470 A1* | 8/2019 | Mine ..................... H10D 30/63 |
| 2019/0238134 A1 | 8/2019 | Lee et al. |
| 2019/0244971 A1 | 8/2019 | Harari |
| 2019/0259769 A1 | 8/2019 | Karda et al. |
| 2019/0303042 A1 | 10/2019 | Kim et al. |
| 2019/0304988 A1 | 10/2019 | Dong et al. |
| 2019/0319044 A1 | 10/2019 | Harari |
| 2019/0325945 A1 | 10/2019 | Linus |
| 2019/0325964 A1 | 10/2019 | Harari |
| 2019/0348424 A1 | 11/2019 | Karda et al. |
| 2019/0355747 A1 | 11/2019 | Herner et al. |
| 2019/0370117 A1 | 12/2019 | Fruchtman et al. |
| 2020/0020718 A1 | 1/2020 | Harari et al. |
| 2020/0051990 A1 | 2/2020 | Harari et al. |
| 2020/0063263 A1 | 2/2020 | Yang et al. |
| 2020/0065647 A1 | 2/2020 | Mulaosmanovic et al. |
| 2020/0075631 A1 | 3/2020 | Dong |
| 2020/0098738 A1 | 3/2020 | Herner et al. |
| 2020/0098779 A1 | 3/2020 | Cernea et al. |
| 2020/0098881 A1 | 3/2020 | Vellianitis |
| 2020/0176468 A1* | 6/2020 | Hemer ............... H10D 30/0413 |
| 2020/0201718 A1 | 6/2020 | Richter et al. |
| 2020/0203378 A1 | 6/2020 | Harari et al. |
| 2020/0219572 A1 | 7/2020 | Harari |
| 2020/0243486 A1 | 7/2020 | Quader et al. |
| 2020/0258897 A1* | 8/2020 | Yan ................... H01L 21/02592 |
| 2020/0350234 A1 | 11/2020 | Shan et al. |
| 2020/0350324 A1 | 11/2020 | Hoffman |
| 2020/0357453 A1 | 11/2020 | Slesazeck et al. |
| 2020/0357455 A1 | 11/2020 | Noack et al. |
| 2020/0357470 A1 | 11/2020 | Noack |
| 2020/0357821 A1* | 11/2020 | Chen ..................... H10B 51/20 |
| 2020/0357822 A1 | 11/2020 | Chen |
| 2020/0365609 A1 | 11/2020 | Harari |
| 2020/0388313 A1 | 12/2020 | Cho et al. |
| 2020/0388711 A1 | 12/2020 | Doyle et al. |
| 2020/0403002 A1 | 12/2020 | Harari |
| 2020/0411533 A1 | 12/2020 | Alsmeier et al. |
| 2021/0005238 A1 | 1/2021 | Mueller |
| 2021/0013224 A1 | 1/2021 | Purayath et al. |
| 2021/0020659 A1 | 1/2021 | Chen |
| 2021/0066502 A1 | 3/2021 | Karda et al. |
| 2021/0074725 A1 | 3/2021 | Lue |
| 2021/0074726 A1 | 3/2021 | Lue |
| 2021/0111179 A1 | 4/2021 | Shivaraman et al. |
| 2021/0175251 A1 | 6/2021 | Zhang et al. |
| 2021/0217775 A1* | 7/2021 | Zhang ................... H10B 51/20 |
| 2021/0242239 A1 | 8/2021 | Lin et al. |
| 2021/0247910 A1 | 8/2021 | Kim et al. |
| 2021/0248094 A1 | 8/2021 | Norman et al. |
| 2021/0265308 A1 | 8/2021 | Norman et al. |
| 2021/0375933 A1 | 12/2021 | Lu et al. |
| 2021/0399015 A1* | 12/2021 | Lin ........................ H10B 51/20 |
| 2021/0407845 A1* | 12/2021 | Wang ................... H10B 43/10 |
| 2022/0013535 A1 | 1/2022 | Lue |
| 2022/0028876 A1 | 1/2022 | Purayath et al. |
| 2022/0028886 A1 | 1/2022 | Pur et al. |
| 2022/0139933 A1 | 5/2022 | Noack |
| 2022/0231049 A1 | 7/2022 | Lin et al. |
| 2022/0246766 A1 | 8/2022 | Manfrini et al. |
| 2022/0254390 A1 | 8/2022 | Gans et al. |
| 2022/0351776 A1 | 11/2022 | Nam et al. |
| 2022/0384459 A1 | 12/2022 | Lu et al. |
| 2022/0393031 A1 | 12/2022 | Ando et al. |
| 2023/0012093 A1 | 1/2023 | Kakushima et al. |
| 2023/0052477 A1 | 2/2023 | Ha et al. |
| 2023/0337428 A1 | 10/2023 | Zhu |

FOREIGN PATENT DOCUMENTS

| | | | |
|---|---|---|---|
| JP | 1998-269789 | A2 | 10/1998 |
| JP | 2004079606 | A | 3/2004 |
| JP | 2006099827 | A1 | 4/2006 |
| JP | 2010108522 | A1 | 5/2010 |
| JP | 2010251572 | A | 11/2010 |
| JP | 2011028540 | A1 | 2/2011 |
| JP | 2012-150876 | A2 | 8/2012 |
| JP | 2000243972 | A2 | 8/2012 |
| KR | 20120085591 | A1 | 8/2012 |
| KR | 20120085603 | A | 8/2012 |
| TW | 318933 | B | 11/1997 |
| TW | 201719665 | A | 6/2017 |
| TW | 201807807 | A | 3/2018 |
| TW | 202002249 | A | 1/2020 |
| WO | WO2009145923 | A1 | 12/2009 |
| WO | 2015025357 | A1 | 2/2015 |
| WO | 2018236937 | A1 | 12/2018 |
| WO | 2019066948 | A1 | 4/2019 |
| WO | 2021/112247 | A1 | 6/2021 |

OTHER PUBLICATIONS

"EP Extended Search Report EP168690149.3", Oct. 18, 2019.
"European Search Report, EP 16852238.1", Mar. 28, 2019.
"European Search Report, EP17844550.8", Aug. 12, 2020, 11 pages.
"Imec Demonstrates Capacitor-less IGZO-Based DRAM Cell With >400s Retention Time", IMEC, Press release, available at https://www.imec-int.com/en/press/imec-demonstrates-capacitor-less-igzo-based-dram-cell-400s-retention-time, Dec. 15, 2020, 15 pages.
"Invitation to Pay Additional Fees (PCT/ISA/206), PCT/US2020/015710", Mar. 20, 2020, 2 pages.
"Invitation to Pay Additional Fees, PCT/US2019/065256", Feb. 13, 2020, 2 pages.
"Notification of Reasons for Refusal, Japanese Patent Application 2018-527740", (English translation), Nov. 4, 2020, 8 pages.

(56) References Cited

OTHER PUBLICATIONS

"Partial European Search Report EP 16869049.3", Jul. 1, 2019, pp. 1-12.

"PCT Search Report and Written Opinion, PCT/US2018/038373", Sep. 10, 2018.

"PCT Search Report and Written Opinion, PCT/US2018/067338", May 8, 2019.

"PCT Search Report and Written Opinion, PCT/US2019/014319", Apr. 15, 2019.

"PCT Search Report and Written Opinion, PCT/US2019/041678", Oct. 9, 2019.

"PCT Search Report and Written Opinion, PCT/US2019/052164", Feb. 27, 2020.

"PCT Search Report and Written Opinion, PCT/US2019/052446", Dec. 11, 2019.

"PCT Search Report and Written Opinion, PCT/US2019/065256", Apr. 14, 2020.

"PCT Search Report and Written Opinion, PCT/US2020/015710", Jun. 9, 2020.

"PCT Search Report and Written Opinion, PCT/US2020/017494", Jul. 20, 2020, 13 pages.

"PCT Search Report and Written Opinion, PCT/US2020/065374", Mar. 15, 2021, 17 pages.

"PCT Search Report and Written Opinion, PCT/US2020/065670", Apr. 5, 2021, 12 pages.

"PCT Search Report and Written Opinion, PCT/US2021/016964", Jun. 15, 2021, 19 pages.

"PCT Search Report and Written Opinion, PCT/US2021/025722", Jun. 15, 2021, 10 pages.

"PCT Search Report and Written Opinion, PCT/US2021/042607", Nov. 4, 2021, 17 pages.

"PCT Search Report and Written Opinion, PCT/US2021/064844", Mar. 8, 2022, 15 paged.

"PCT Search Report and Written Opinion, PCT/US2021/42620", Oct. 28, 2021, 18 pages.

"PCT Search Report and Written Opinion, PCT/US2022/016729", Applicant: SunRise Memory Corporation, May 17, 2022, 20 pages.

Ahn, Min-Ju , et al., "Transparent multi-level-cell nonvolatile memory with dual-gate amorphous indiumgallium-zinc oxide thin-film transistors", Appl. Phys. Lett. 109, 252106; doi: 10.1063/1.4972961., 2016, 6 pages.

Alessandri, Cristobal , et al., "Monte Carlo Simulation of Switching Dynamics in Polycrystalline Ferroelectric Capacitors", IEEE Transactions on Electron Devices, vol. 66, No. 8, doi: 10.1109/TED.2019.2922268., Aug. 2019, pp. 3527-3534.

Ali, T. , et al., "A Multilevel FeFET Memory Device based on Laminated HSO and HZO Ferroelectric Layers for High-Density Storage", IEEE International Electron Devices Meeting (IEDM), 2019, doi: 10.1109/IEDM19573.2019.8993642., Dec. 2019, pp. 28.7.1-28.7.4.

Ali, T. , et al., "High Endurance Ferroelectric Hafnium Oxide-Based FeFET Memory Without Retention Penalty,", IEEE Transactions on Electron Devices, vol. 65, No. 9, doi: 10.1109/TED.2018.2856818.—paper cited in Bae (Berkeley) paper, Sep. 2018, pp. 3769-3774.

Bae, Jong-Ho , et al., "Highly Scaled, High Endurance, Ω-Gate, Nanowire Ferroelectric FET Memory Transistors", IEEE Electron Device Letters, vol. 41, No. 11, doi: 10.1109/LED.2020.3028339.—Sayeef-Berkeley paper on FeFET memory, Nov. 2020, pp. 1637-1640.

Beyer, Sven , et al., "FeFET: A versatile CMOS compatible device with game-changing potential", IEEE International Memory Workshop (IMW), doi: 10.1109/IMW48823.2020.9108150., 2020, pp. 1-4.

Böscke, T.S. , et al., "Ferroelectricity in hafnium oxide: CMOS compatible ferroelectric field effect transistors", 2011 International Electron Devices Meeting, Washington, DC, USA, doi: 10.1109/IEDM.2011.6131606., 2011, pp. 24.5.1-24.5.4.

Chang, Sou-Chi , et al., "Anti-ferroelectric HfxZr1—xO2 Capacitors for High-density 3-D Embedded-DRAM", IEEE International Electron Devices Meeting (IEDM), doi: 10.1109/IEDM13553.2020.9372011., 2020, pp. 28.1.1-28.1.4.

Cho, Min Hoe, et al., "Achieving a Low-Voltage, High-Mobility IGZO Transistor through an ALD-Derived Bilayer Channel and a Hafnia-Based Gate Dielectric Stack", ACS Applied Materials & Interfaces, Apr. 1, 2021, 13 (14), , DOI: 10.1021/acsami.0c22677, 2021, pp. 16628-16640.

Cho, Min Hoe, et al., "Comparative Study on Performance of IGZO Transistors With Sputtered and Atomic Layer Deposited Channel Layer", IEEE Transactions on Electron Devices, vol. 66, No. 4, doi: 10.1109/TED.2019.2899586., Apr. 2019, pp. 1783-1788.

Choi, Seonjun , et al., "A novel three-dimensional NAND flash structure for improving the erase performance", IEICE Electronics Express, 2019 vol. 16 Issue 3, 2019, 6 pages.

De, Sourav , et al., "Ultra-Low Power Robust 3bit/cell Hf0.5Zr0.5O2 Ferroelectric FinFET with High Endurance for Advanced Computing-In-Memory Technology", 2021 Symposium on VLSI Technology, Kyoto, Japan, Jun. 13-19, 2021, Jun. 2021, 2 pages.

Dünkel , "A FeFET based super-low-power ultra-fast embedded NVM technology for 22nm FDSOI and beyond", IEEE International Electron Devices Meeting (IEDM), San Francisco, CA, USA, 2017, doi: 10.1109/IEDM.2017.8268425., 2017, pp. 19.7.1-19.7.4.

Dutta, Sourav , et al., "Logic Compatible High-Performance Ferroelectric Transistor Memory", available at https://arxiv.org/abs/2105.11078, Department of Electrical Engineering, University of Notre Dame, Notre Dame, IN 46556, USA, May 24, 2021, 28 pages.

Florent, K. , "First demonstration of vertically stacked ferroelectric Al doped HfO2 devices for NAND applications", Symposium on VLSI Technology, doi: 10.23919/VLSIT.2017.7998162., 2017, pp. T158-T159.

Florent, K. , et al., "Vertical Ferroelectric HfO2 FET based on 3-D NAND Architecture: Towards Dense Low-Power Memory", IEEE International Electron Devices Meeting (IEDM), San Francisco, CA, 2018, doi: 10.1109/IEDM.2018.8614710., 2018, pp. 2.5.1-2.5.4.

Hendy, Ian , "The Role of Increased Semiconductor Mobility—an IGZO Case Study", Display Daily, available at https://www.displaydaily.com/article/display-daily/the-role-of-increased-semiconductor-mobility-an-igzo-case-study, Apr. 2021, 11 pages.

Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.

Hisain, Hanan Alexandra, et al., "Many routes to ferroelectric HfO2: A review of current deposition methods", J. Vac. Sci. Technol. A 40, 010803 (2022), published Dec. 1, 2021., Dec. 1, 2021, pp. 010803-1-010803-36.

Jeewandara, Thamarasee , et al., "High-speed 3-D memory with ferroelectric NAND flash memory", available at https://techxplore.com/news/2021-01-high-speed-d-memoryferroelectric-nand.html, Jan. 26, 2021, 5 pages.

Kawai, H. , et al., "Design Principle of Channel Material for Oxide-Semiconductor Field-Effect Transistor with High Thermal Stability and High On-current by Fluorine Doping", IEEE International Electron Devices Meeting (IEDM), doi: 10.1109/IEDM13553.2020.9372121., 2020, pp. 22.2.1-22.2.4.

Kim, Min-Kyu , et al., "CMOS-compatible ferroelectric NAND flash memory for high-density, low-power, and high-speed three-dimensional memory", Science Advances, vol. 7, No. 3, eabe 1341, DOI: 10.1126/sciadv.abe1341. (Replacement of polysilicon channel material—use IZO for channel), Jan. 13, 2021, 10.

Kim, Taeho , et al., "Effects of high pressure nitrogen annealing on ferroelectric Hf0.5Zr0.5O2 films", Appl. Phys. Lett. 112, 092906 https://doi.org/10.1063/1.5003369, Mar. 2, 2018, 5 pages.

Kim, N. , et al., "Multi-layered Vertical gate NANO Flash Overcoming Stacking Limit for Terabit Density Storage", Symposium on VLSI Tech. Dig. of Technical Papers, 2009, pp. 188-189.

Kunitake, Hitoshi , et al., "High-temperature Electrical Characteristics of 60nm CAAC-IGZO FET : Comparison with Si FET", International Conference on Solid State Devices and Materials, https://doi.org/10.7567/SSDM.2018.N-3-04, Sep. 2018, pp. 787-788.

(56) References Cited

OTHER PUBLICATIONS

Office Action and Search Report for corresponding Taiwan Patent Application No. 111129734, issued Dec. 8, 2023, 5 pages.

Chan, Chi-Yu , et al., "FeFET Memory Featuring Large Memory Window and Robust Endurance of Long-Pulse Cycling by Interface Engineering using High-k AION", 2020 IEEE Symposium on VLSI Technology, doi: 10.1109/VLSITechnology18217.2020.9265103., 2020, pp. 1-2.

Kim, Hyungwoo , et al., "Two-step deposition of TiN capping electrodes to prevent degradation of ferroelectric properties in an in-situ crystallized TiN/Hf0.5Zr0.5O2/TiN device", Nano Express 3 015004., 2022, 12 pages.

McBriarty, Martin E., et al., "Crystal Phase Distribution and Ferroelectricity in Ultrathin HfO2—ZrO2 Bilayers", Phys. Status Solidi B, 257: 1900285. https://doi.org/10.1002/pssb.201900285, Aug. 21, 82019, pp. 1-25.

Mittmann, T. , et al., "Impact of Oxygen Vacancy Content in Ferroelectric HZO films on the Device Performance", 2020 IEEE International Electron Devices Meeting (IEDM), doi: 10.1109/IEDM13553.2020.9372097., 2020, pp. 18.4.1-18.4.4.

Onaya, Takashi , et al., "Improvement in ferroelectricity of HfxZr1—xO2 thin films using top- and bottom-ZrO2 nucleation layers", APL Materials 7, 061107; https://doi.org/10.1063/1.5096626, 2019, pp. 1-8.

Sato, Yuta , et al., "Source/Drain Contact Engineering of InGaZnO Channel BEOL Transistor for Low Contact Resistance and Suppressing Channel Shortening Effect,", 20th International Workshop on Junction Technology (IWJT), doi: 10.23919/IWJT52818.2021.9609366., 2021, 3 pages.

Wang, Chin-I , et al., "Atomic layer deposited TiN capping layer for sub-10 nm ferroelectric Hf0.5Zr0.5O2 with large remnant polarization and low thermal budget", Applied Surface Science, vol. 570, 2021, 151152, ISSN 0169-4332, https://doi.org/10.1016/j.apsusc.2021.151152., Aug. 9, 2021, pp. 1-8.

Wu, Jixuan , et al., "A Monolithic 3D Integration of RRAM Array with Oxide Semiconductor FET for In-Memory Computing in Quantized Neural Network AI Applications", 2020 IEEE Symposium on VLSI Technology Digest of Technical Papers, Honolulu, HI, USA, Jun. 2020, 4 pages.

* cited by examiner

100

104
104

120 110

109

120 110

104
104
102
101

☐ SiO₂
▨ Oxide Semi

Z ← ⊙ Y → X

100

104
112
104
112

120 110

109

120 110

112
104
112
104
102
101

☐ SiO₂
■ Oxide Semi
▨ SL/DL

Z
Y
X

THREE-DIMENSIONAL NOR MEMORY STRING ARRAYS OF THIN-FILM FERROELECTRIC TRANSISTORS

CROSS REFERENCE TO RELATED APPLICATIONS

This application claims priority to U.S. Provisional Patent Application No. 63/240,715, entitled THREE-DIMENSIONAL NOR MEMORY STRING ARRAYS OF THIN-FILM FERROELECTRIC TRANSISTORS, filed Sep. 3, 2021, which is incorporated herein by reference for all purposes.

This application relates to (i) U.S. non-provisional application ("Application I"), Ser. No. 17/674,137, entitled "Thin-Film Storage Transistor With Ferroelectric Storage Layer," filed on Feb. 17, 2022; (ii) U.S. non-provisional application ("Application II"), Ser. No. 17/812,375, entitled "3-Dimensional Memory String Array Of Thin-Film Ferroelectric Transistors," filed on Jul. 13, 2022; (iii) U.S. non-provisional application ("Application III"), Ser. No. 17/382, 064, entitled "Methods For Fabricating A 3-Dimensional Memory Structure Of NOR Memory Strings," filed on Jul. 21, 2021; and (iv) U.S. non-provisional ("Application IV"), Ser. No. 17/382,126, entitled "Methods for Fabricating A 3-Dimensional Memory Structure of NOR Memory Strings," filed on Jul. 21, 2021.

The present application is also related to U.S. non-provisional patent application ("Application V"), Ser. No. 16/894,596, entitled "Capacitive-Coupled Non-Volatile Thin-Film Transistor Strings in Three Dimensional Arrays," filed on Jun. 5, 2020, which is a continuation of U.S. patent application, Ser. No. 16/107,118, entitled "Capacitive-Coupled Non-Volatile Thin-Film Transistor Strings in Three Dimensional Arrays," filed on Aug. 21, 2018, which is a divisional application of U.S. non-provisional patent application, Ser. No. 15/248,420, entitled "Capacitive-Coupled Non-Volatile Thin-Film Transistor Strings in Three Dimensional Arrays," filed on Aug. 26, 2016, now U.S. Pat. No. 10,121,553, issued Nov. 6, 2018, which is related to and claims priority of (i) U.S. provisional application, Ser. No. 62/235,322, entitled "Multi-gate NOR Flash Thin-film Transistor Strings Arranged in Stacked Horizontal Active Strips With Vertical Control Gates," filed on Sep. 30, 2015; (ii) U.S. provisional patent application, Ser. No. 62/260,137, entitled "Three-dimensional Vertical NOR Flash Thin-film Transistor Strings," filed on Nov. 25, 2015; (iii) U.S. non-provisional patent application, Ser. No. 15/220,375, "Multi-Gate NOR Flash Thin-film Transistor Strings Arranged in Stacked Horizontal Active Strips With Vertical Control Gates," filed on Jul. 26, 2016; and (vi) U.S. provisional patent application, Ser. No. 62/363,189, entitled "Capacitive Coupled Non-Volatile Thin-film Transistor Strings," filed Jul. 15, 2016.

The disclosures of Applications I, II, III, IV, and V are hereby incorporated by reference in their entireties.

FIELD OF THE INVENTION

The present invention relates to high-density memory structures. In particular, the present invention relates to high-density, low read-latency memory structures formed by interconnected thin-film storage elements (e.g., 3-dimensional array of thin-film storage transistors), including those organized as NOR-type memory strings ("NOR memory strings").

BACKGROUND OF THE INVENTION

A NOR-type memory string includes storage transistors that share a common source region and a common drain region, while allowing each storage transistor to be individually addressed and accessed. U.S. Pat. No. 10,121,553 (the '553 Patent), entitled "Capacitive-Coupled Non-Volatile Thin-film Transistor NOR Strings in Three-Dimensional Arrays," issued on Nov. 6, 2018, discloses storage or memory transistors organized as 3-dimensional arrays of NOR memory strings formed above a planar surface of a semiconductor substrate. The '553 Patent is hereby incorporated by reference in its entirety for all purposes. In the '553 Patent, a NOR memory string includes numerous thin-film storage transistors that share a common bit line and a common source line. In particular, the '553 Patent discloses a NOR memory string that includes (i) a common source region and a common drain region both running lengthwise along a horizontal direction and (ii) gate electrodes for the storage transistors each running along a vertical direction. In the present description, the term "vertical" refers to the direction normal to the surface of a semiconductor substrate, and the term "horizontal" refers to any direction that is parallel to the surface of that semiconductor substrate. In a 3-dimensional array, the NOR memory strings are provided on multiple planes (e.g., 8 or 16 planes) above the semiconductor substrate, with the NOR memory strings on each plane arranged in rows. For a charge-trap type storage transistor, data is stored in a charge storage film in each storage transistor. For examples, the charge storage film includes a tunneling dielectric layer, a charge trapping layer and a blocking layer, which can be implemented as a multilayer including silicon oxide, silicon nitride, and silicon oxide, arranged in this order and referred to as an ONO layer. An applied electrical field across the charge storage film adds or removes charge from charge traps in the charge trapping layer, altering the threshold voltage of the storage transistor to encode a given logical state to the storage transistor.

Advances in electrically polarizable materials ("ferroelectric materials"), especially those that are being used in semiconductor manufacturing processes, suggest new potential applications in ferroelectric memory circuits. For example, the article "Ferroelectricity in Hafnium Oxide: CMOS compatible Ferroelectric Field Effect Transistors," by T. S. Böscke et al., published in 2011 *International Electron Devices Meeting (IEDM)*, pp. 24.5.1-24.5.4, discloses a ferroelectric field effect transistor ("FeFET") that uses hafnium oxide as a gate dielectric material. By controlling the polarization direction in a ferroelectric gate dielectric layer, the FeFET may be programmed to have either one of two threshold voltages. Each threshold voltage of the FeFET constitutes a state, for example, a "programmed" state or an "erased" state, that represents a designated logical value. Such an FeFET has application in high-density memory circuits. For example, U.S. patent application, Ser. No. 13/897,037, entitled "Apparatuses having a ferroelectric field-effect transistor memory array and related method," by D. V. Nirmal Ramaswamy et al., filed on May 17, 2013, now U.S. Pat. No. 9,281,044, discloses a 3-dimensional array of FeFETs.

The FeFETs of the prior art, however, suffer from low endurance. For example, the article "Vertical Ferroelectric HfO₂ FET based on 3-D NAND Architecture: Towards Dense Low-Power Memory," by K. Florent et al., published in 2018 *IEEE International Electron Devices Meeting (IEDM)*, 2018, pp. 2.5.1-2.5.4, discloses an endurance of merely $10^4$ cycles. Such low endurance renders the memory circuits practically unsuitable for many memory applications.

SUMMARY OF THE INVENTION

In embodiments of the present invention, a three dimensional memory structure formed above a planar surface of a semiconductor substrate includes multiple stacks of thin-film ferroelectric field-effect transistors (FeFETs) being organized as multiple stacks of NOR memory strings extending along a first direction substantially parallel to the planar surface of the semiconductor substrate. The NOR memory strings of each stack are provided one on top of another along a second direction substantially normal to the planar surface. The FeFETs within each NOR memory string share a common source layer and a common drain layer with each layer extending along the first direction.

In some embodiments, each stack of NOR memory strings includes multiple memory string pairs arranged one on top of another along the second direction, each memory string pair being isolated from the other memory string pairs by a first isolation layer. Furthermore, each memory string pair comprises a first common drain layer, a first common source layer, and a second common drain layer, each layer being arranged spaced apart from the other in the second direction by a second isolation layer. Furthermore, each memory string pair includes a first NOR memory string formed by the first common drain layer and the first common source layer and a second NOR memory string formed by the second common drain layer and the first common source layer.

The memory structure further includes a semiconductor layer provided adjacent each stack of NOR memory strings and in contact with the common source layers and the common drain layers in the respective stack. The semiconductor layer provided between adjacent common source layer and common drain layer in the second direction forms a channel region for the FeFETs of the respective NOR memory string. The memory structure further includes a ferroelectric gate dielectric layer provided adjacent the semiconductor layer and extending along the second direction. Finally, the memory structure further includes multiple conductors provided between adjacent stacks of NOR memory strings and extending along the second direction, each conductor serving as a common gate electrode for respective FeFETs in the NOR memory strings of the adjacent stacks. In some embodiments, the memory structure may further include an interfacial layer between the ferroelectric gate dielectric layer and the semiconductor layer forming the channel.

In some embodiments, the ferroelectric gate dielectric layer includes a ferroelectric polarization layer provided adjacent each conductor as a continuous layer in the second direction.

In yet other embodiments, the semiconductor layer is provided as a continuous layer along the sidewall of each respective stack of NOR memory strings.

In some embodiments, the ferroelectric gate dielectric layer is formed of a doped hafnium oxide material and the semiconductor layer forming the channel region is an oxide semiconductor layer formed of an amorphous oxide semiconductor material.

In some embodiments, the first and second common drain layers and the first common source layer are made partially or substantially of a metallic conductor material.

These and other advantages, aspects and novel features of the present invention, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the FIGS. are not necessarily to scale.

DETAILED DESCRIPTION OF THE INVENTION

Figure 1:
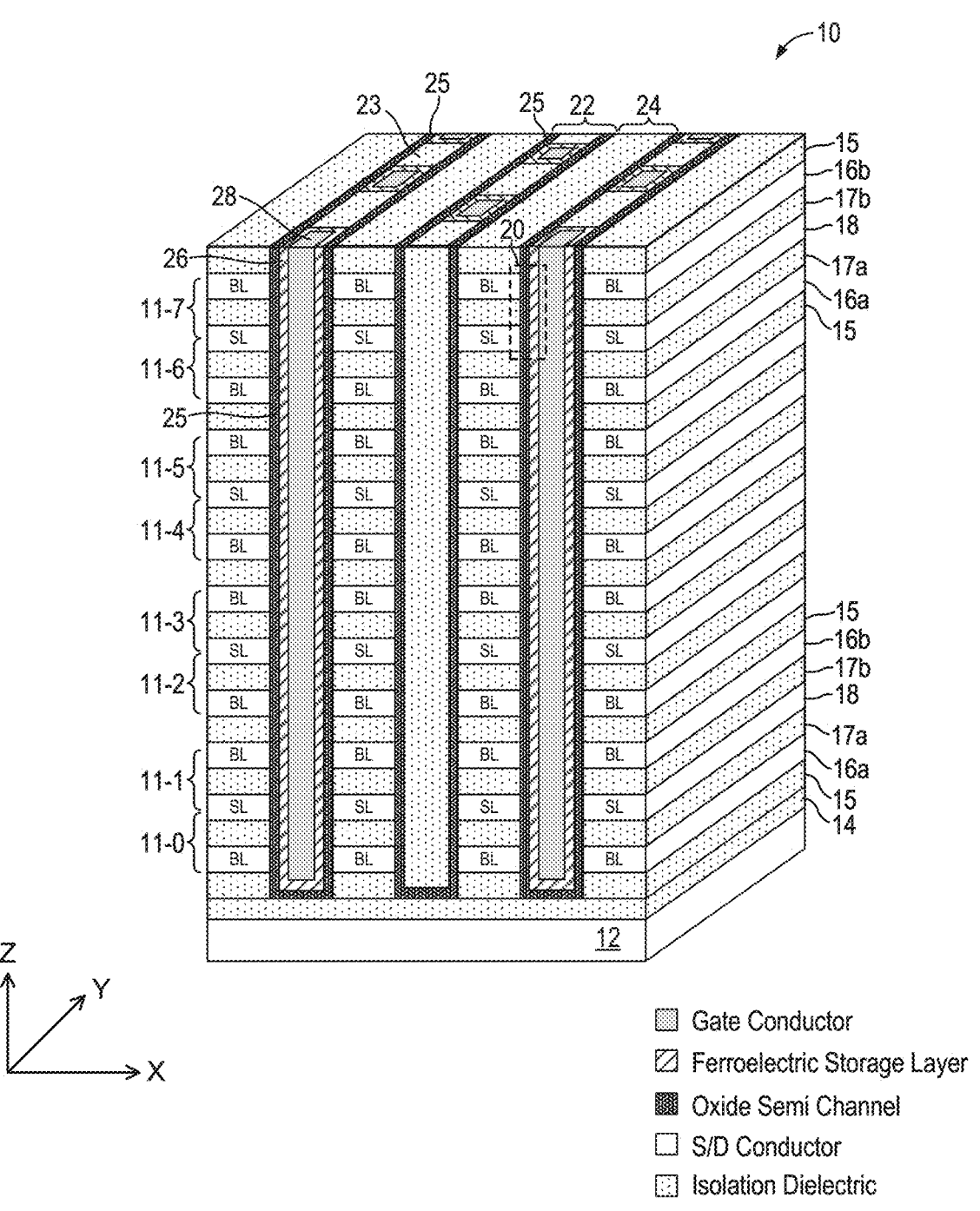
FIG. 1 is a perspective view of a memory structure including a 3-dimensional array of NOR memory strings in embodiments of the present invention.

According to embodiments of the present invention, a memory structure includes storage transistors organized as horizontal NOR memory strings where the storage transistors are thin-film ferroelectric field-effect transistors (FeFETs) having a ferroelectric gate dielectric layer formed adjacent an oxide semiconductor channel region. The ferroelectric storage transistors thus formed are junctionless transistors having no p/n junction in the channel and which the mobile carrier density in the channel is modulated by the polarization of the ferroelectric gate dielectric layer. In embodiments of the present invention, the ferroelectric storage transistors in each NOR memory string share a first conductive layer functioning as a common source line and a second conductive layer functioning as a common bit line, the first and second conductive layers being in electrical contact with the oxide semiconductor channel region. The ferroelectric storage transistors in a NOR memory string are controlled by individual control gate electrodes to allow each storage transistor to be individually addressed and accessed. In some embodiments, the ferroelectric gate dielectric layer is formed of a doped hafnium oxide material and the oxide semiconductor channel region is formed of an amorphous oxide semiconductor material.

In some embodiments, the memory structure includes multiple NOR memory strings organized in a three dimensional array to form a high density memory structure. The three dimensional array of NOR memory strings is organized as stacks of NOR memory strings in a first direction, with NOR memory strings formed one on top of another in a stack in the first direction. The three dimensional array of NOR memory strings is also organized as rows of NOR memory strings in a second direction forming a plane, with the rows of NOR memory strings arranged in one or more parallel planes in first direction. In some embodiments, a pair of adjacent NOR memory strings in a stack share a common source line. The voltage on each shared common source line can be separately applied directly from one or both ends of each source line in the three-dimensional structure. In some embodiments, the shared common source line is electrically floating and the source voltage is applied from the common bit line using pre-charge transistors so as to mitigate congestion of connector wires at the bit-line/source-line end staircases in the three-dimensional structure. Furthermore, in some embodiments, the oxide semiconductor channel region is formed as a continuous layer at least in the first direction across multiple NOR memory strings formed in a stack. In this manner, the NOR memory strings can be constructed using simplified fabrication process steps with reduced aspect ratios for anisotropic etching of trenches through multiple layers of memory strings to form a high density memory structure with compact dimensions.

The ferroelectric storage transistors, as described herein, provide high endurance, long data retention, and relatively low voltage operations for both erase (under 5.0 volts) and programming (e.g., under –5.0 volts) operations. By combining the ferroelectric or polarization characteristics with the 3-dimensional organization (e.g., as the thin-film NOR memory strings described herein), the memory structure of ferroelectric storage transistors of the present invention achieves the additional benefits of high-density, low-cost memory arrays with the advantages of high-speed, randomly accessed memory circuits with low read latency. These and other advantages of the memory structure of the present invention will be described further in the following description.

In the present description, to facilitate reference to the figures, a Cartesian coordinate reference frame is used, in which the Z-direction is normal to the planar surface of the semiconductor surface and the X-direction and the Y-directions are orthogonal to the Z-direction and to each other, as indicated in the figures.

Furthermore, the drawings provided herein are idealized representations to illustrate embodiments of the present disclosure and are not meant to be actual views of any particular component, structure, or device. The drawings are not to scale, and the thickness and dimensions of some layers may be exaggerated for clarity. Variations from the shapes of the illustrations are to be expected. For example, a region illustrated as a box shape may typically have rough and/or nonlinear features. Sharp angles that are illustrated may be rounded. Like numerals refer to like components throughout.

Memory Structure

FIG. 1 is a perspective view of a memory structure including a 3-dimensional array of NOR memory strings in embodiments of the present invention. The memory structure can be used to implement part of a semiconductor memory device in some examples. Referring to FIG. 1, a memory structure 10 includes a number of alternating conductive and isolation layers formed on a planar surface of a semiconductor substrate 12. For example, in some embodiments, the isolation layers can be insulating dielectric layers. In the present description, a pair of conductive layers with an interleaving isolation layer are referred to as an active layer 11. A buffer layer 14 may be provided between the semiconductor substrate 12 and the active layers 11 formed on the substrate. In some embodiments, the buffer layer 14 may be a silicon oxycarbide (SiOC) layer or a silicon oxide $(SiO_2)$ layer. The active layers 11, including alternating conductive and isolation layers, are formed one on top of another in the Z-direction (i.e., along a direction normal to the planar surface of the substrate 12). The active layers 11 are divided in the X-direction into narrow strips ("active strips") 24 that are stacked one on top of another to form stacks of active strips ("active stacks") extending in the Y-direction. As thus formed, each active strip 24 form a NOR memory string of ferroelectric storage transistors 20 extending in the Y-direction.

Each active layer 11 includes a first conductive layer 16 functioning as a common bit line for the NOR memory string and a second conductive layer 18 functioning as a common source line for the NOR memory string. The first and second conductive layers 16, 18 are separated by an isolation layer 17, which can be a dielectric layer in some embodiments. For example, the isolation layer can be a silicon oxide layer in some embodiments. In the present illustration, eight active layers 11-0 to 11-7 are provided. A salient feature of the memory structure 10 is that pairs of adjacent active layers 11 share a common source line 18 such that a memory structure of N active layers includes N common bit lines but only N/2 common source lines. For instance, the pair of adjacent active layers 11-0 and 11-1 include (i) a first conductive layer 16a forming the common bit line of a first NOR memory string, (ii) an isolation layer 17a, (iii) a second conductive layer 18 forming the common source line of the first NOR memory string and a second NOR memory string, (iv) an isolation layer 17b, and (v) a first conductive layer 16b forming the common bit line of the second NOR memory string. As thus configured, in memory structure 10, pairs of adjacent active layers form pairs of NOR memory strings that share a common source line 18. A pair of adjacent active layers is separated from the other pairs by an isolation layer 15, such as an insulating dielectric layer.

Subsequent processing steps form oxide semiconductor channel regions 25, ferroelectric gate dielectric layers 26 and gate electrodes 28 in narrow trenches 22 between the separated active stacks. Another salient feature of the memory structure 10 is that each oxide semiconductor channel region 25 is formed as a continuous layer along the sidewall of an active stack, across the multiple NOR memory strings in the active stack in the X-direction. In some embodiments, each oxide semiconductor channel region 25 is a continuous layer along the sidewalls of a pair of adjacent stacks sharing a narrow trench 22. An oxide semiconductor channel region 25 is isolated from another oxide semiconductor channel region 25 formed in another narrow trench 22.

In embodiments of the present invention, the gate electrodes 28 and the ferroelectric gate dielectric layers 26 are formed as columnar structures extending in the Z-direction. In the present example, ferroelectric gate dielectric layer 26 encircles a gate electrode 28 in the columnar structure. In the present description, the gate electrodes 28 are also referred to as "local word lines" and a gate electrode 28 encircled by a ferroelectric gate dielectric layer 26 is collectively referred to as "a local word line (LWL) structure." Local word line structures formed in each trench 22 are isolated from each other by a dielectric material 23. A ferroelectric storage transistor 20 is formed at the intersection of an active strip 11 with the channel region 25 and an LWL structure. Accordingly, ferroelectric storage transistors 20 are formed on both sides of the active strip. In the present illustration, the LWL structures are formed staggered in adjacent trenches 22 so that storage transistors 20 formed on both sides of the active strip are offset from each other in the Y-direction along the NOR memory string. In particular, the isolation layer 15 between pairs of NOR memory strings and isolation layers 17a, 17b between adjacent source line and bit line provides isolation to decouple the ferroelectric storage transistors formed on the two sides of the same active strip. As thus configured, along each active strip (in the Y-direction), the ferroelectric storage transistors 20 that share the common source line 18 and the common bit line 16 form a NOR memory string (also referred as a "Horizontal NOR memory string" or "HNOR memory string").

In the 3-dimensional array of NOR memory strings thus formed, the ferroelectric storage transistors 20 are junction-less transistors that do not include p/n junction as the drain or source region in the channel. Instead, the first conductive layer 16 (common bit line) serves as the drain region and the second conductor layer 18 serves as the source region of the ferroelectric storage transistor 20. Accordingly, a NOR memory string includes ferroelectric storage transistors 20 that share a common drain region (the common bit line 16) and a common source region (the common source line 18).

In some embodiments, the first and second conductive layers 16 and 18 are each formed using a metal layer or a low resistivity metallic conductive material, such as molybdenum (Mo), tungsten (W), tungsten nitride (WN), ruthenium or titanium tungsten alloy (TiW). In some embodiments, the isolation layer 15 and 17 may be formed as a silicon oxide layer ($SiO_2$). In other embodiments, the isolation layer 15 may be formed by other isolation dielectric materials, such as silicon nitride. In some embodiments, the ferroelectric gate dielectric layer is formed of a doped hafnium oxide material, such as zirconium-doped hafnium oxide (HfZrO or "HZO"). In some embodiments, the hafnium oxide can be doped with silicon (Si), iridium (Ir) or lanthanum (La). In some embodiments, the oxide semiconductor channel region is formed of an amorphous oxide semiconductor material, such as indium gallium zinc oxide (IGZO).

To complete the memory circuit, various types of circuits are formed in or at the surface of the semiconductor sub-strate 12 to support the memory operations of the HNOR memory strings. Such circuits are referred to as "circuit under array" ("CuA") and may include analog and digital circuits. For example, the memory operations may include read and write operations. In the present description, a write operation to the memory circuit includes an erase and a program operation, referring to changing the polarization states or polarization directions of the ferroelectric dielectric layer from one polarization state to another. Furthermore, in some embodiments, the memory operations include a refresh operation. In some embodiments, the circuit under array supports the memory operations of the memory circuit, including erase, program, read and refresh operations.

In some embodiments, the circuit under array includes various voltage sources or voltage generators for generating operating voltages, such as power supply voltages, ground voltages, programming, erase or read voltages, or reference voltages. The circuit under array may further include word line driver circuits, bit line driver circuits, and input/output driver circuits. The circuit under array may further include address decoders for decoding address signals to select designated storage transistors, sense amplifiers to read stored data from the selected storage transistors, latches and registers, such as shift registers, or other memory elements. The circuit under array may further include various logic circuits, such as inverters, NAND, NOR, Exclusive-Or and other logic gates. In some embodiments, the circuit under array includes state machines, micro-sequencers, and data processing circuitry. For example, in one embodiment, the circuit under array includes a state machine for managing the memory operations (e.g. read, erase, program and refresh operations) at the memory circuit.

In some embodiments, other conductive layers may be arranged above or below the memory structure 10 to provide control signals, such as the word line signals, to the array of ferroelectric storage transistors. In some embodiments, the conductive layers may be arranged to connect the circuit under array to the common bit lines of the NOR memory strings and to the local word lines to support the memory operation. In one embodiment, the conductive layers may be provided for routing control and data signals among the NOR memory strings and the circuit under array. As thus configured, the circuit under array supports memory opera-tions of the NOR memory strings and implements erase, program and read operations for the NOR memory strings autonomously in response to erase, program and read com-mands provided to the memory structure. In one example, the write operation to the ferroelectric storage transistors includes an erase operation followed by a program opera-tion.

In some embodiments, the memory structure 10 is coupled to a memory controller a separate semiconductor substrate and electrically connected to the memory structure using one or more integration techniques, including, for example, hybrid bonds, TSVs, exposed contacts and other suitable interconnect techniques. The memory controller provides commands, such as erase, program and read com-mands, to the circuit under array, usually with accompany-ing information, such as the memory cell address and write data for the write operation. The memory structure, using the circuit under array, performs the memory operation autono-mously in response to the received command.

In embodiments of the present disclosure, the memory structure 10 represents a modular memory unit, referred to as a "tile," and a memory device is formed using an array of the modular memory units. In one exemplary embodiment, a memory device is organized as a two-dimensional array of tiles, where each tile includes a three-dimensional array of ferroelectric storage transistors with support circuitry for each tile formed under the respective tile. More specifically, the support circuitry for the ferroelectric storage transistors of each tile is provided for modularity in the portion of the semiconductor substrate underneath each tile. In this manner, each modular memory unit (or tile) operates semi-autonomously to perform its own memory operations, such as erase, program, read and refresh operations. As a result, a memory device includes an array of tiles where each tile can be individually addressed and controlled by the circuit under array (CuA) formed underneath each tile. In particular, with the tile-based CuA provided for each tile, each tile in the array of tiles can be accessed independently of each other with memory operations being performed on multiple tiles concurrently. In some embodiments, the tile-based circuit under array (CuA) is formed in the semiconductor substrate using a first fabrication process and then the semiconductor substrate with the tile-based support circuits formed thereon is provided in a second fabrication process to form the thin-film storage transistors.

The memory device may be coupled to a memory controller to form a memory module. The memory controller can be a controller integrated circuit, sometimes referred to as a "chiplet." Alternately, the memory controller may be embedded or implemented in a general purpose integrated circuit (e.g. a central processing unit (CPU) or a graphic processing unit (GPU)). The memory controller implements management functions for the memory device. In some embodiments, the memory controller provides commands, such as activate, read, erase, program, commit and refresh commands, to the memory device and accompanying command information, such as memory address and write data. The memory controller may also provide host interface functions, implementing memory interfaces for host access and other system functions, where applicable. The memory controller operates in cooperation with the circuit under array of each tile to enable the semi-autonomous memory operations at each tile and concurrent memory operations over large number of tiles. A memory device formed with an array of tiles realizes a high speed and high capacity memory with capabilities for parallel access to storage transistors in the multiple tiles.

Figure 2:
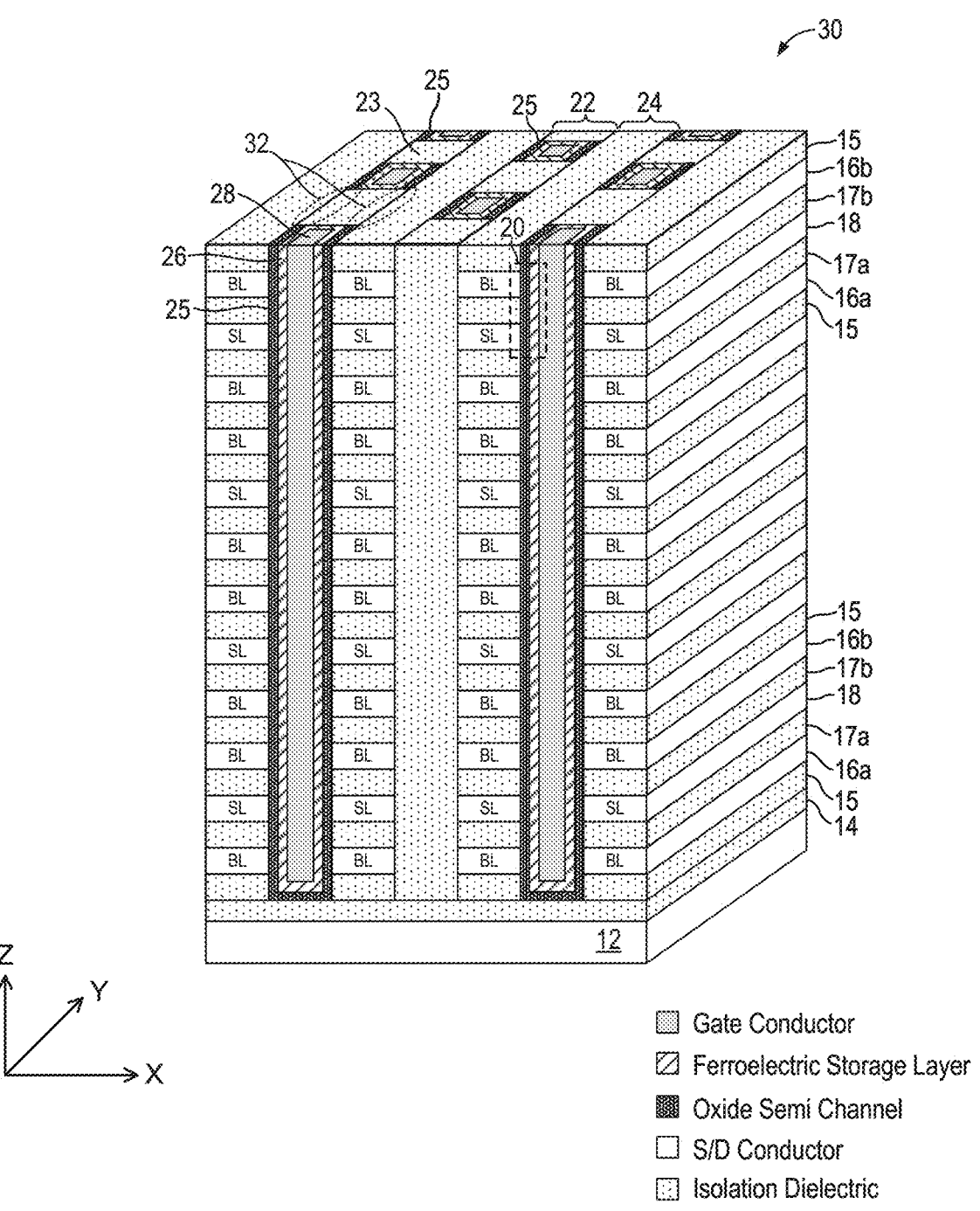
FIG. 2 is a perspective view of a memory structure including a 3-dimensional array of NOR memory strings in alternate embodiments of the present invention.

In the embodiment shown in FIG. 1, the memory structure 10 includes oxide semiconductor channel regions 25 that are each formed as a continuous layer in the Y direction along the sidewall of an active stack of NOR memory strings. In other embodiments, the oxide semiconductor channel regions 25 may be separated between adjacent LWL structures, as shown in FIG. 2. FIG. 2 is a perspective view of a memory structure including a 3-dimensional array of NOR memory strings in alternate embodiments of the present invention. Like elements in FIGS. 1 and 2 are given like reference numerals to simplify the discussion. Referring to FIG. 2, a memory structure 30 is constructed in substantially the same manner as the memory structure 10 of FIG. 1 except for the formation of the oxide semiconductor channel regions 25. In memory structure 30, the oxide semiconductor channel regions 25 formed in a narrow trench 22 are separated or singulated at each LWL structure, as indicated by the dotted circles 32. That is, the oxide semiconductor channel region 25 is only provided adjacent each columnar structure of ferroelectric gate dielectric layer 26 and gate electrode 28. The oxide semiconductor channel region 25 is removed between adjacent LWL structures, which has the effect of eliminating parasitic devices that may be formed in the areas between LWL structures.

Figure 3:
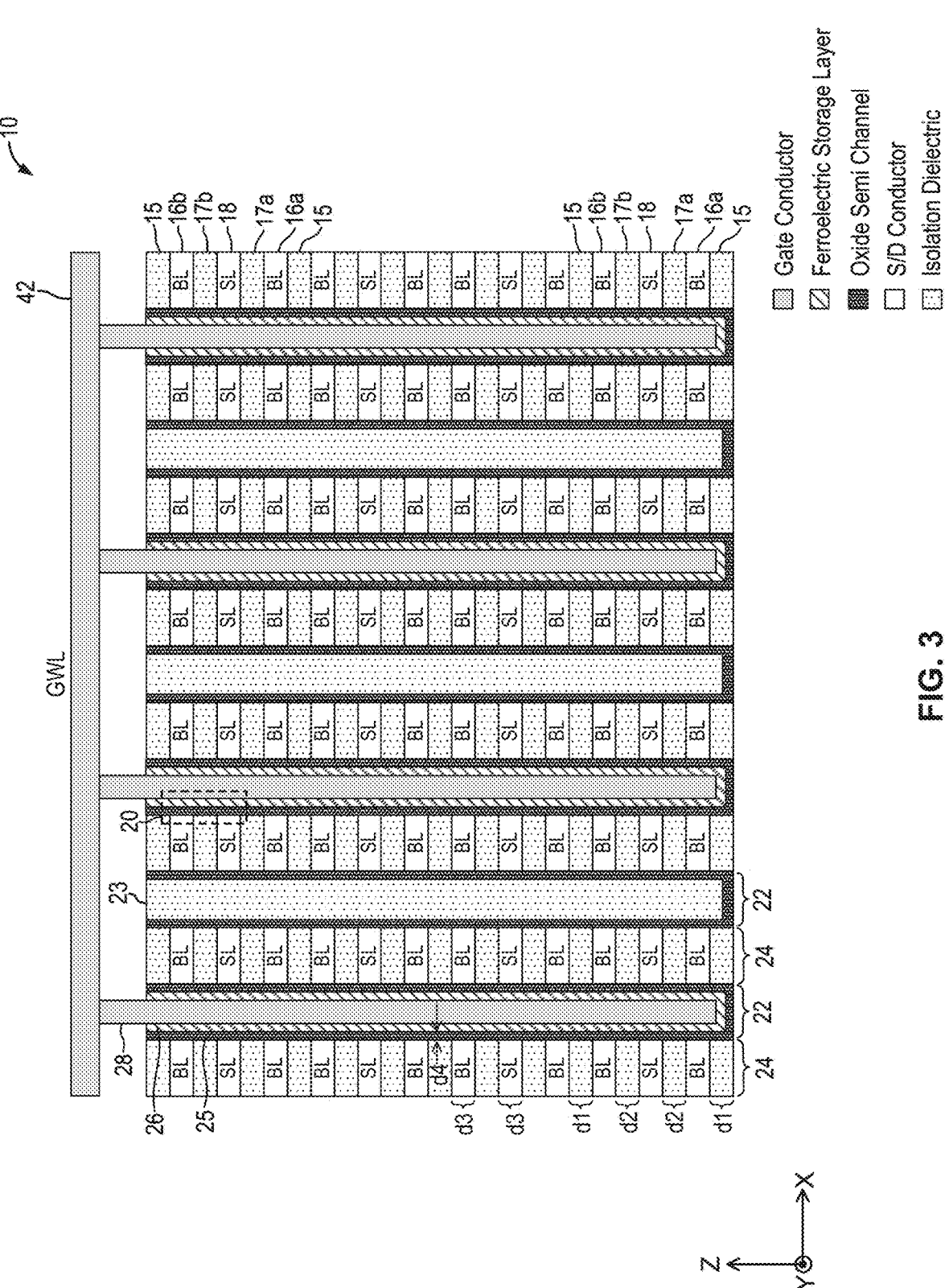
FIG. 3 is a cross-sectional view of a portion of the memory structure of FIG. 1 including the 3-dimensional array of NOR memory strings in embodiments of the present invention.

FIG. 3 is a cross-sectional view of a portion of the memory structure of FIG. 1 including the 3-dimensional array of NOR memory strings in embodiments of the present invention. Like elements in FIGS. 1 and 3 are given like reference numerals to simplify the discussion. Referring to FIG. 3, the memory structure 10 includes the three dimensional array of NOR memory strings of ferroelectric storage transistors formed on a semiconductor substrate (omitted in FIG. 3 for simplicity). In the present embodiment, a pair of active stacks of NOR memory strings bordering the same narrow trench 22 share a common oxide semiconductor channel region 25, a ferroelectric gate dielectric layer 26 and a gate electrode 28 at each LWL structure. That is, the oxide semiconductor channel region 25 is continuous along the bottom portion of the narrow trench 22. The oxide semiconductor channel region 25 formed in one narrow trench 22 is isolated from the oxide semiconductor channel region 25 formed in the other narrow trenches 22. Each active stacks 24 have ferroelectric storage transistors 20 formed on both sides of the stack. In the case the LWL structures are staggered in the Y-direction, adjacent narrow trenches 22 have storage transistors that are formed offset from each other in the Y-direction such that an active stack 24 does not include storage transistors that are formed directly across the active stack in the X-direction. Dielectric material 23 is formed in the trenches 22 between the LWL structures.

An oxide semiconductor channel region realizes many advantages in the 3-dimensional array of NOR memory strings of the present invention. First, an oxide semiconductor channel region typically has high mobility for greater switching performance and without concern for electron or hole tunneling. Second, the storage transistors of the NOR memory strings with the oxide semiconductor channel region become junctionless transistors, thereby eliminating the need to provide polysilicon source-drain layers in the memory structure. As a result, the stack height of the 3-dimensional array of NOR memory strings is greatly reduced as compared to traditional memory array with the same number of planes or layers of NOR memory strings. Furthermore, in embodiments of the present invention, the stack height of the NOR memory strings is further reduced by sharing a common source line between adjacent active layers. As a result, a high density but yet compact memory structure is realized.

In memory structure 10, each pair of active layers (in the Z-direction) includes a first common bit line (first conductive layer 16a) and a common source line (second conductive layer 18), separated by an isolation layer 17a, and a second common bit line (first conductive layer 16b), separated from the common source line 18 by an isolation layer 17b, to form first and second NOR memory strings. Each pair of first and second NOR memory strings are separated from the other pairs in the Z-direction by an isolation layer 15.

In the present embodiment, the isolation layer 15 has a thickness of d1 in the Z-direction and the isolation layer 17a, 17b has a thickness of d2 in the Z-direction. The thickness d1 is selected to provide sufficient isolation of adjacent common bit lines in the active stack. The thickness d2 between a common bit line and a common source line defines the channel length of the ferroelectric storage transistor 20. In the present embodiment, the first and second conductive layers 16, 18 have the same thickness of d3 in the Z-direction. In other embodiments, the first and second conductive layers 16, 18 can have different thicknesses in the Z-direction. Furthermore, in the present embodiment, the oxide semiconductor channel region 25 has a thickness d4 in the X-direction between the ferroelectric gate dielectric layer 26 and the source line/bit line in the active stack 24 which defines the depth of the channel region.

In some embodiments, the thickness d1 is in the range of 30-50 nm and has a value of 30 nm in one example. In some embodiments, the thickness d2 is in the range of 30-80 nm, and has a value of 50 nm in one example. In some embodiments, the thickness d3 is in the range of 30-40 nm, and has a value of 40 nm in one example. In one exemplary embodiment, the stack height for a pair of adjacent NOR memory string is 250 nm. A memory structure including a stack of 8 NOR memory strings can be formed with a stack height of 1000 nm only, which is a significant reduction from known memory structures, such as those formed using polysilicon channels. The stack height reduction has the effect of reducing the aspect ratio for the etching process to form narrow trenches between the active stacks during the fabrication process, as will be described in more detail below.

In some embodiments, the oxide semiconductor channel region 25 has a thickness d4 of 8-15 nm he X-direction. In one example, the oxide semiconductor channel region 25 may have a thickness of 10 nm. In some embodiments, the ferroelectric gate dielectric layer 26 has a thickness of 3-7 nm in the X-direction. In one example, the ferroelectric gate dielectric layer 26 may have a thickness of 4 nm. In some embodiments, the active stack 24 has a width in the X-direction of 60 nm and the narrow trench in which the LWL structure is formed has a width in the X-direction of 70 nm. In some embodiments, the gate electrode has a thickness of about 55 nm in the X-direction. In the present description, the dimensions are provided merely for illustrative purposes and are not intended to be limiting. In actual implementation, any suitable thicknesses or dimensions may be used.

In the memory structure 10 of FIG. 3, the 3-dimensional array of NOR memory strings includes ferroelectric storage transistors 20 that are formed on both side edges along the lengths (Y-direction) of each active strip, with vertical local word lines 28 being provided along both side edges in staggered arrangement in the Y-direction. High density is achieved by sharing the local word lines 28 between adjacent active stacks where each local word line 28 serves as the gate electrode to vertically aligned ferroelectric storage transistors 20 of the active strips of each active stack. The vertical local word lines 28 may be contacted by interconnection conductors 42 (also referred to as "global word lines") provided above or below the 3-dimensional array of NOR memory strings. In one embodiment, the global word lines 42 run along a direction (X) that is transverse to the lengths (Y) of the contacted active strips 24. The global word lines 42 connects the local word lines 28 to the support circuits formed in the circuit under array (CuA) of the semiconductor substrate 12, such as the word line driver circuits.

Memory Circuit and Operation

Figure 4:
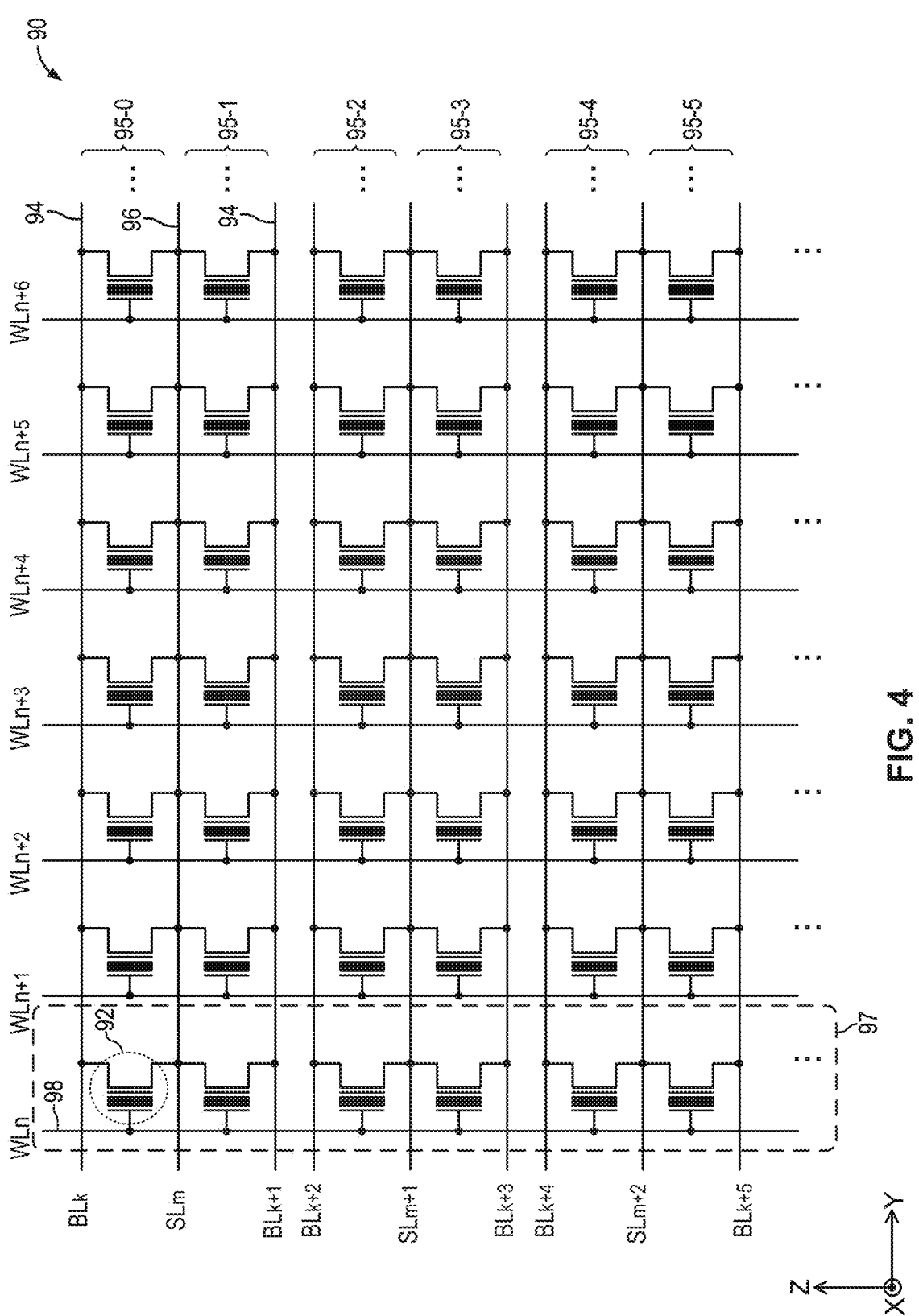
FIG. 4 is a circuit representation of a 3-dimensional array of NOR memory strings in embodiments of the present invention.

FIG. 4 is a circuit representation of a 3-dimensional array of NOR memory strings in embodiments of the present invention. In particular, FIG. 4 illustrates a portion of the NOR memory strings which can be constructed from the memory structures of FIGS. 1-3 described above. Referring to FIG. 4, a memory array 90 includes ferroelectric storage transistors 92 arranged in NOR memory strings 95, including NOR memory strings 95-0 to 95-5. Each NOR memory string 95 includes ferroelectric storage transistors 92 that are connected across a common bit line BL 94 (e.g. BLk to BLk+5) and a common source line SL 96 (e.g. SLm to SLm+2), with each ferroelectric storage transistor 92 in each NOR memory string 95 being controlled by a respective word line WL 98 (e.g. WLn to WLn+6). More specifically, each ferroelectric storage transistor 92 in a NOR memory string 95 has a gate terminal connected to the word line WL 98, a drain terminal connected to the bit line BL 94, and a source terminal connected to a source line SL 96.

Memory array 90 includes NOR memory strings formed in an active stack, with each NOR memory strings 95-0 to 95-5 being located on a different plane of the 3-dimensional memory structure. Ferroelectric storage transistors 92 in a column across the multiple NOR memory strings are controlled by a common word line WL 98, also referred to as a local word line or LWL. FIG. 4 illustrates a portion of the NOR memory strings including ferroelectric storage transistors 92 connected to word lines WLn to WLn+6. In practice, there may be thousands of word lines (e.g. 4096 word lines) in the memory array, resulting in thousands of randomly accessible ferroelectric storage transistors in a NOR memory string. The memory array 90 includes a control circuit for controlling the read, write and refresh operations of the memory array. For example, the control circuit can be formed in the semiconductor substrate 12 under the memory array, as shown in FIG. 1, and is referred to as a circuit under array or CuA.

In memory array 90, adjacent NOR memory strings 95 share a common source line SL. For instance, NOR memory strings 95-0 and 95-1 share the common source line SLm, while NOR memory strings 95-2 and 95-3 share the common source line SLm+1. By sharing the common source line between an adjacent pair of NOR memory strings, the number of conductive layers for forming the active stack is reduced, as compared to the case when each NOR memory string has its own common source line. In alternate embodiments, the memory array can be constructed with each NOR memory string 95 having its own common source line and common bit line, without sharing the common source line with another NOR memory string.

In some examples, the memory array 90 may be organized in memory pages where a memory page refers to a group of storage transistors that are accessed together for read and write operations. In the present embodiment, a memory page 97 includes storage transistors arranged in a column across the multiple planes of the memory array 90 and sharing a common word line 98. That is, a memory page 97 includes storage transistors in an active stack of NOR memory strings 95-0 to 95-5 that are connected to the same word line 98 (e.g. word lines WLn). In actual implementation, a memory page may include ferroelectric storage transistors 92 in one or more columns across multiple planes of NOR memory strings associated with the same continuous oxide semiconductor channel and sharing the same word line.

In memory array 90, the source line 96 is electrically floating, that is, the source line 96 is not directly connected to any electrical potential. In practice, the source line 96 maintains a relatively constant voltage through the parasitic capacitance at the source terminals, such as the parasitic capacitance between the source terminals and the gate terminals of the storage transistors. More specifically, the parasitic capacitance intrinsic to each NOR memory string (e.g., the distributed capacitance between the common source terminal of a NOR memory string and its multiple associated local word lines) may be used as a virtual voltage source, under some operating conditions, to provide a common source voltage. In the present description, the source line 96 is sometimes referred to as being connect to a virtual ground. In some examples, the source voltage can be set to a desired voltage value through a pre-charge operation and the source line can then be left floating after the pre-charge operation. In one embodiment, the pre-charge operation set the common bit line to a desired voltage and then the precharge transistor is momentarily turned on to short the common bit line to the common source line to transfer the bit line voltage to the source line. As a result, the common source line is charged from the voltage on the common bit line to a voltage equal to the voltage provided on the bit line. After the precharge operation is complete, the precharge transistors are turned off. The common source line maintains a relatively constant voltage through the parasitic capacitance at the source terminals, such as the parasitic capacitance between the source terminals and the gate terminals of the storage transistors in the NOR memory string. In other embodiments, the source line 96 can be provided with a given voltage potential, such as the ground voltage, by a voltage source.

In embodiments of the present invention, the ferroelectric storage transistors 92 are thin-film ferroelectric field-effect transistors. More specifically, a ferroelectric field-effect transistor (also referred to as FeFET) is formed by using a ferroelectric material as the gate dielectric layer between the gate conductor, usually a metal layer, and the channel of a field-effect transistor. In some embodiments, the ferroelectric storage transistor may further include an interface dielectric layer adjacent the channel and the ferroelectric gate dielectric layer. The ferroelectric storage transistor realizes memory function by storing data as polarization states in the ferroelectric gate dielectric layer. In particular, a voltage applied between the gate conductor and the channel induces electrical polarization in the ferroelectric gate dielectric layer, which polarization can be reversed with application of a voltage in the opposite polarity. The ferroelectric gate dielectric layer retains the induced polarization state after removal of the applied gate voltage, realizing the memory function of the ferroelectric storage transistor. For instance, ferroelectric storage transistors can be applied to form non-volatile memory cells where data is stored in the ferroelectric gate dielectric layer as two stable, remanent polarization states.

The induced polarization states of the ferroelectric gate dielectric layer change the threshold voltage of the ferroelectric storage transistor. The change or shift in the threshold voltage of the ferroelectric storage transistor due to the different polarization states can be used to represent data in different logical states. For example, two logical states (e.g., "0" and "1") can be represented by the higher and lower threshold voltages of the ferroelectric storage transistor as a result of two induced electrical polarization states in the ferroelectric gate dielectric layer. In other embodiments, more than two polarization states can be induced in the ferroelectric gate dielectric layer, such as by applying two or more different voltage ranges across the ferroelectric gate dielectric layer. In this manner, the ferroelectric storage transistor can be operated to store data in more than two logical states. For example, a tristate would provide three threshold voltage states corresponding to 1.5 bits stored in each cell, or quad states (00, 01, 10, 11) corresponding to 2 bits stored in one ferroelectric memory cell, and so on, up to a continuum of analog states. This analog continuum of states would be advantageous in artificial intelligence and machine learning applications.

In embodiments of the present invention, the three-dimensional array of NOR memory strings of ferroelectric storage transistors can be applied to implement a non-volatile memory device or a quasi-volatile memory device. For example, a quasi-volatile memory has an average retention time of greater than 100 milliseconds, such as about 10 minutes or a few hours, whereas a non-volatile memory device may have a minimum data retention time exceeding a few days to a few years. In one embodiment, the ferroelectric storage transistor has a data retention time longer than 1 hour and a program/erase cycle endurance greater than $10^8$ program/erase cycles. For example, the ferroelectric storage transistor may have a data retention time of a few hours and a program/erase cycle endurance of around $10^{11}$. Such a ferroelectric storage transistor can be used to form a quasi-volatile memory device where the refresh intervals can be on the order of hours, significantly longer than the refresh intervals of DRAMs which require much more frequent refreshes, such as in tens of milli-seconds. In some embodiments, multiple three-dimensional arrays of ferroelectric storage transistors ("tiles") may be used to form a quasi-volatile memory device with high memory capacity.

The ferroelectric storage transistor stores data in the ferroelectric gate dielectric layer. In operation, an applied electric field of a first polarity, such as by applying a voltage of the first polarity at the gate terminal relative to the source terminal, induces a first polarization state in the ferroelectric gate dielectric layer. Meanwhile, the application of an electric field of a second polarity, opposite the first polarity, such as by applying a voltage of the second polarity at the gate terminal relative to the source terminal, induces a second polarization state in the ferroelectric gate dielectric layer. The first polarization state shifts the threshold voltage $V_t$ of the ferroelectric storage transistor to a lower value, which can be used to encode a first logical state, such as a logical "1" state. Alternately, the second polarization state shifts the threshold voltage $V_t$ of the ferroelectric storage transistor to a higher value, which can be used to encode a second logical state, such as a "0" state. In the present description, shifting the threshold voltage $V_t$ of the ferroelectric storage transistor to a higher value (logical "0") is referred herein as a program operation and shifting the threshold voltage $V_t$ of the ferroelectric storage transistor to a lower value (logical "1") is referred herein as an erase operation.

In some embodiments, the pre-charge operation described above can be used to set the source line and bit line voltages of a NOR memory string to voltages that are more negative than the voltage on the local word line (for example during an erase operation), or more positive than the voltage on the local word line (for example during a program operation) are advantageous because the erase or program polarization states of the ferroelectric storage transistors are somewhat symmetrical in that the cell polarization can be readily reversed by reversing the voltage of the source and drain terminals as one electrode and the voltage of the local word line as the second electrode. In some embodiments, each string of ferroelectric storage transistors, by virtue of being thin-film-transistors, as opposed to a single crystalline transistors formed within the semiconductor substrate, does not require a hard wire connection to the ground potential of the semiconductor substrate for any of its common source, common drain, or common channel. Instead, both polarization states can be imposed on the FeFET with only positive voltages (or only negative voltages) applied to the local word lines or the common source/common drain. This single voltage polarity feature simplifies the process flow for the control/logic transistors formed in the substrate, and allows optimized operation because ferroelectric polarization states typically have a voltage hysteresis that can go from negative voltages (erased state) to positive voltages (programmed state).

In embodiments of the present invention, the ferroelectric storage transistors are formed using an oxide semiconductor channel. For example, the oxide semiconductor channel can be formed using an amorphous oxide semiconductor material, such as indium gallium zinc oxide (InGaZnO or "IGZO"). An oxide semiconductor channel region has the advantage of a high mobility for greater switching performance and without concern for electron or hole tunneling. For example, an IGZO film has an electron mobility of 10.0-100.0 $cm^2/V$, depending on the relative compositions of indium, gallium and zinc. The oxide semiconductor channel forms an N-type, unipolarity channel region where the conductive layers $16a$, $18$, $16b$ (FIG. 1) forming the source and drain terminals directly contact the channel region. The ferroelectric storage transistor thus formed is a depletion mode device where the transistor is normally on and can be turned off by depleting the N-type carriers in the channel region. The threshold voltage of the ferroelectric storage transistor is a function of the thickness d4 (FIG. 3) of the oxide semiconductor channel region 25. That is, the threshold voltage of the ferroelectric storage transistor is the amount of voltage necessary to deplete the thickness d4 of the oxide semiconductor channel region to shut off the ferroelectric storage transistor.

Exemplary operation conditions of the three-dimensional NOR memory strings of ferroelectric storage transistors will now be described with reference to FIGS. 5-7. In embodiments of the present invention, the write operation to the NOR memory strings is carried out by first performing an erase operation followed by a program operation. In the present embodiment, the erase operation is applied to all the storage transistors in a memory page to set all the storage transistors to the first logical state and the subsequent program operation is applied to selected storage transistors in the memory page to program the selected storage storages to the second logical state.

Figure 5:
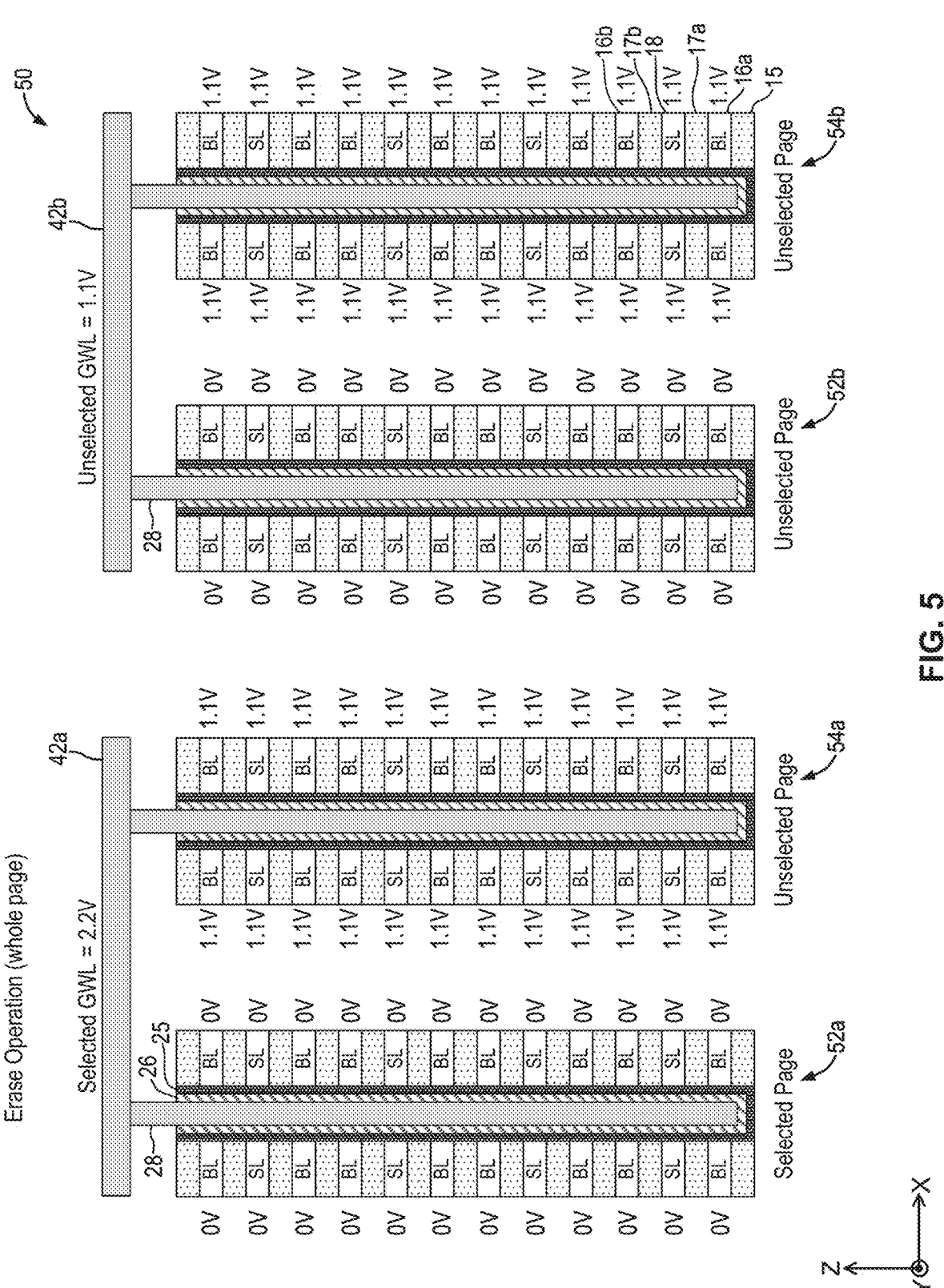
FIG. 5 illustrates an erase operation that can be implemented in the 3-dimensional array of NOR memory strings in embodiments of the present invention.

FIG. 5 illustrates an erase operation that can be implemented in the 3-dimensional array of NOR memory strings in embodiments of the present invention. Referring to FIG. 5, a memory array 50 is illustrated with a first portion of a set of NOR memory strings belonging to a selected global word line (GWL) $42a$ and a second portion of the same set of NOR memory strings belonging to an unselected global word line $42b$. In actual implementation, the first and second portions of the NOR memory strings illustrate ferroelectric storage transistors formed on the same set of NOR memory strings (same set of active stacks) but associated with different local word lines 28. That is, the first and second portions of the NOR memory strings illustrate ferroelectric storages transistors in different locations in the Y-direction along the NOR memory stings.

As described above, the global word lines $42a$, $42b$ are interconnect conductors connecting the word line signal to one or more local word lines 28 coupled to NOR memory strings formed in one or more active stacks. The first portion of the NOR memory strings illustrates ferroelectric storage transistors belonging to the selected global word line $42a$ and are arranged in the same plane in the X-direction. The ferroelectric storage transistors in the first portion belong to a memory page $52a$ and a memory page $54a$, which are memory pages formed in the same plane but in different positions in the X-direction. The second portion of the NOR memory strings illustrates ferroelectric storage transistors belonging to the unselected global word line $42b$ and are arranged in the same plane in the X-direction. The ferroelectric storage transistors in the second portion belong to a memory page $52b$ and a memory page $54b$, which are memory pages formed in the same plane but in different positions in the X-direction. In particular, the ferroelectric storage transistors in the page $52b$ belong to an unselected page in the same NOR memory strings as the selected page $52a$. That is, memory page $52a$ and memory page $52b$ belong to the same set of NOR memory strings but in different positions in the Y-direction. Therefore the bit lines and source lines of pages $52a$, $52b$ are biased to the same voltage levels but page $52b$ is associated with the unselected global word line $42b$. Meanwhile, memory pages $54a$ and $54b$ are associated with the same NOR memory strings but in different positions in the Y-direction. Memory page $54a$ is connected to the selected global word line $42a$ and memory page $54b$ is connected to the unselected global word line $42b$.

In the present embodiment, a memory page includes ferroelectric storage transistors in two adjacent stacks of NOR memory strings sharing a common word line and further sharing the same continuous oxide semiconductor channel region. In one embodiment, the memory array 50 includes 8 layers NOR memory strings and a memory page includes at least 16 ferroelectric storage transistors (or 16 bits) across two adjacent active stack of NOR memory strings. In other embodiments, the oxide semiconductor channel can be separated at the bottom of each narrow trench 22. In that case, ferroelectric storage transistors in each stack of NOR memory strings form its own memory page. For example, with the oxide semiconductor channel separated at the bottom of the narrow trench, the memory array 50 may include a memory page of 8 ferroelectric storage transistors (or 8 bits) across one active stack of 8 layers of NOR memory strings.

In the present embodiment, the erase operation erases a memory page of ferroelectric storage transistors. In some example, this is referred to as a block erase operation. For instance, the erase operation erases all the ferroelectric storage transistors associated with the selected global word line $42a$ in the selected page $52a$. To erase the ferroelectric storage transistor in the selected page $52a$, a word line voltage that is more positive than the source line and bit line voltages is used. In some embodiments, the source line voltage and bit line voltage are both set to 0V and the selected global word line $42a$ is driven to 2-3V. In the present example, the selected global word line $42a$ is driven to 2.2V. To inhibit erase on the other unselected ferroelectric storage transistors, the unselected global word line $42b$ is biased to a positive voltage lower than the voltage of the selected global word line $42a$. For example, the unselected global word line $42b$ is biased to half the voltage of the selected global word line $42a$, such as 1.1V. The source line voltage and the bit line voltage of the unselected page $54a$, $54b$ are driven to the same voltage as the unselected global word line $42b$ (e.g. 1.1V), which results in a gate-to-source voltage of 0V across these unselected ferroelectric storage transistors. For the ferroelectric storage transistors in the page $52b$, the source line and bit line are biased to 0V, by virtue of being the same set of NOR memory strings as the selected page $52a$. However, these unselected ferroelectric storage transistors will not be erased as their gate terminals are biased to the unselected global word line voltage (e.g. 1.1V) and the gate-to-source voltage across these unselected ferroelectric storage transistors is not sufficient to flip the polarization state of the transistors. As a result, only the ferroelectric storage transistors in page 52a are erased. In the present description, ferroelectric storage transistors that have been erased have a first logical state of "1".

Figure 6:
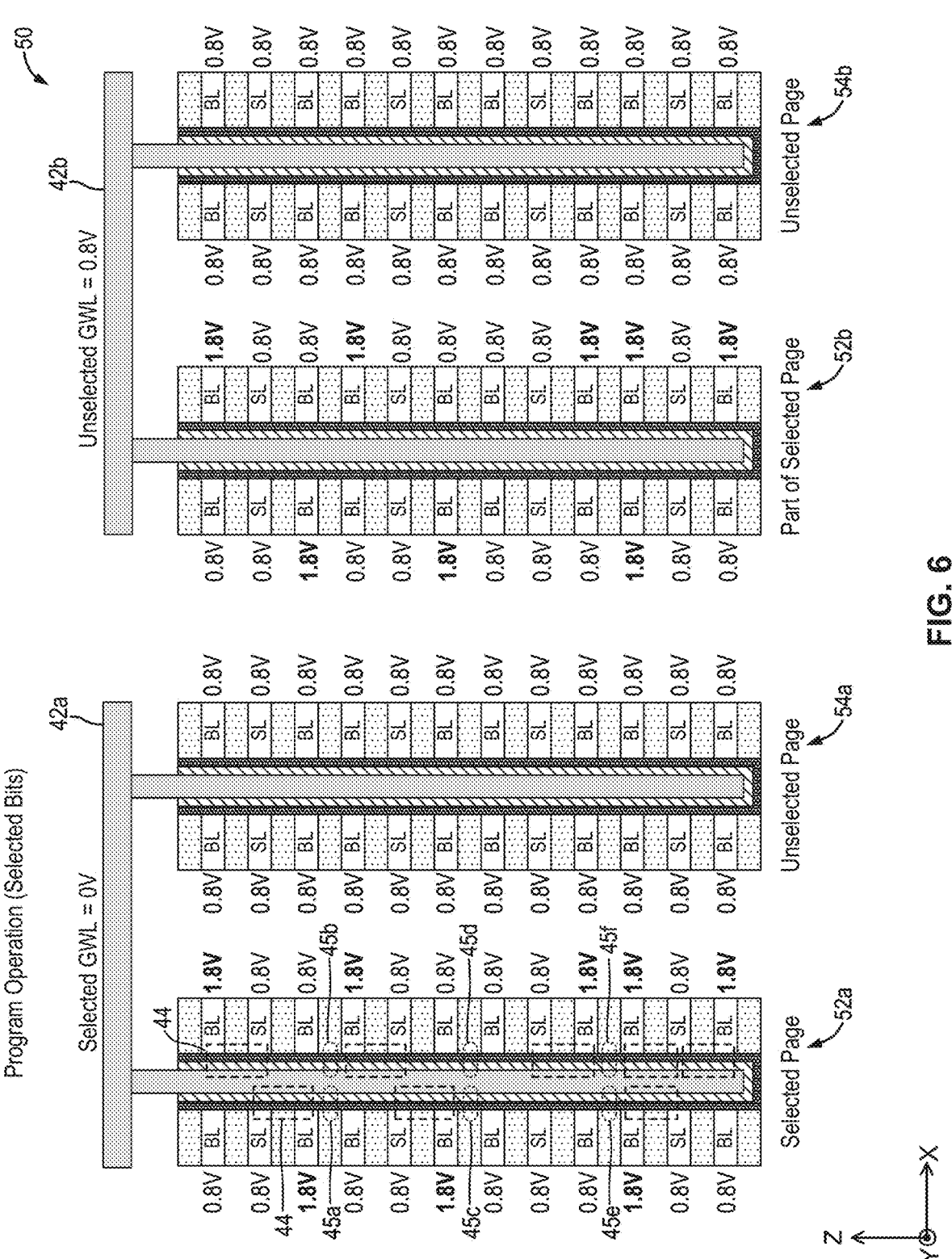
FIG. 6 illustrates a program operation that can be implemented in the 3-dimensional array of NOR memory strings following the erase operation in FIG. 5 in embodiments of the present invention.

FIG. 6 illustrates a program operation that can be implemented in the 3-dimensional array of NOR memory strings following the erase operation in FIG. 5 in embodiments of the present invention. Referring to FIG. 6, after the ferroelectric storage transistors in the selected page 52a have been erased (logical state "1"), some of the ferroelectric storage transistors in the page are to be programmed to a second logical state of "0" based on the write data. In FIG. 6, it is assumed that the transistors denoted by the dotted boxes 44 are to be programmed. The other transistors are not programed and will retain the logical state associated with the erased state ("1").

To program the selected ferroelectric storage transistor in the selected page 52a, a word line voltage that is more negative than the source line and bit line voltages is used. Alternately, the source line voltage and the bit line voltage of the ferroelectric storage transistors to be programmed can be made more positive than the word line voltage. In embodiments of the present disclosure, the program operation of the ferroelectric storage transistors implements asymmetric programming. Asymmetric programming refers to using different source line voltage and the bit line voltage for the program operation. In the present embodiment, to program selected ferroelectric storage transistors (denoted by dotted boxes 44) in the selected page 52a, the selected global word line 42 is set to 0V. The bit line voltage for the selected ferroelectric storage transistors to be programmed is set to 1.8V while the bit line voltage for the unselected ferroelectric storage transistors is set to 0.8V. The source line voltage for all the ferroelectric storage transistors is also set to 0.8V. As thus configured, only the ferroelectric storage transistors with a negative gate-to-source voltage (e.g. −0.8V) and a large enough negative gate-to-drain voltage (e.g., −1.8V) will experience a high enough electric field at the drain terminal to flip the polarization state of the transistors to the programmed state (logical "0"). The other ferroelectric storage transistors in the selected page 52a, with a gate-to-drain voltage of only −0.8V, will retain their previously erased state (e.g. logical "1").

To inhibit program on the other unselected ferroelectric storage transistors, the unselected global word line 42b is biased to a voltage more positive than the voltage of the selected global word line 42a. For example, the unselected global word line 42b is biased to 0.8V. The source line voltage and the bit line voltage of the unselected pages 54a, 54b are driven to the same voltage as the unselected global word line 42b (e.g. 0.8V). As a result, a gate-to-source voltage of 0V is imposed across the unselected ferroelectric storage transistors in the unselected page 54b and these transistors will not be programmed. The ferroelectric storage transistors in the unselected page 54a have a negative gate-to-source voltage of −0.8V but a gate-to-drain voltage of only −0.8V, which is not sufficient to change the polarization state of these ferroelectric storage transistors. For the unselected ferroelectric storage transistors in the page 52b, the source line and the bit line voltages are biased to the same values as the transistors in page 52a by virtue of being the same set of NOR memory strings as the selected page 52a. However, these unselected ferroelectric storage transistors will not be programmed as their gate terminals are biased to the unselected global word line voltage (e.g. 0.8V) and the gate-to-source voltage across these unselected ferroelectric storage transistors is 0V, which keeps these transistors turned off. As a result, only the selected ferroelectric storage transistors (denoted by boxes 44) in page 52a are programmed.

In the memory array 50 of FIG. 6, the continuous channel results in parasitic transistor devices being formed in a region between two bit lines of two adjacent ferroelectric storage transistors in the Z-direction, as denoted by the dotted ovals 45a to 45f in FIG. 6. Each of these parasitic transistor devices includes a ferroelectric gate dielectric layer, a channel region and two bit lines acting as the conductive source/drain terminals. Although memory array 50 includes these parasitic transistor devices, their presence do not impact the memory operation. In particular, the parasitic transistor devices 45a to 45f will be erased during the erase operation. Then during the program operation, parasitic transistor devices (e.g. 45d) between two unselected ferroelectric storage transistors will not be programmed and parasitic transistor devices (e.g. 45a-c and 45e-f) that have at least one neighboring ferroelectric storage transistor selected for programming will become programmed at the same time. However, the programming of the parasitic transistor device increases the threshold voltage of the parasitic transistor devices which has the effect of turning off the programmed parasitic transistor devices for read operation. Therefore, the incidental programming of the parasitic transistor devices during the program operation does not impact the operation of the memory array 50.

Figure 7:
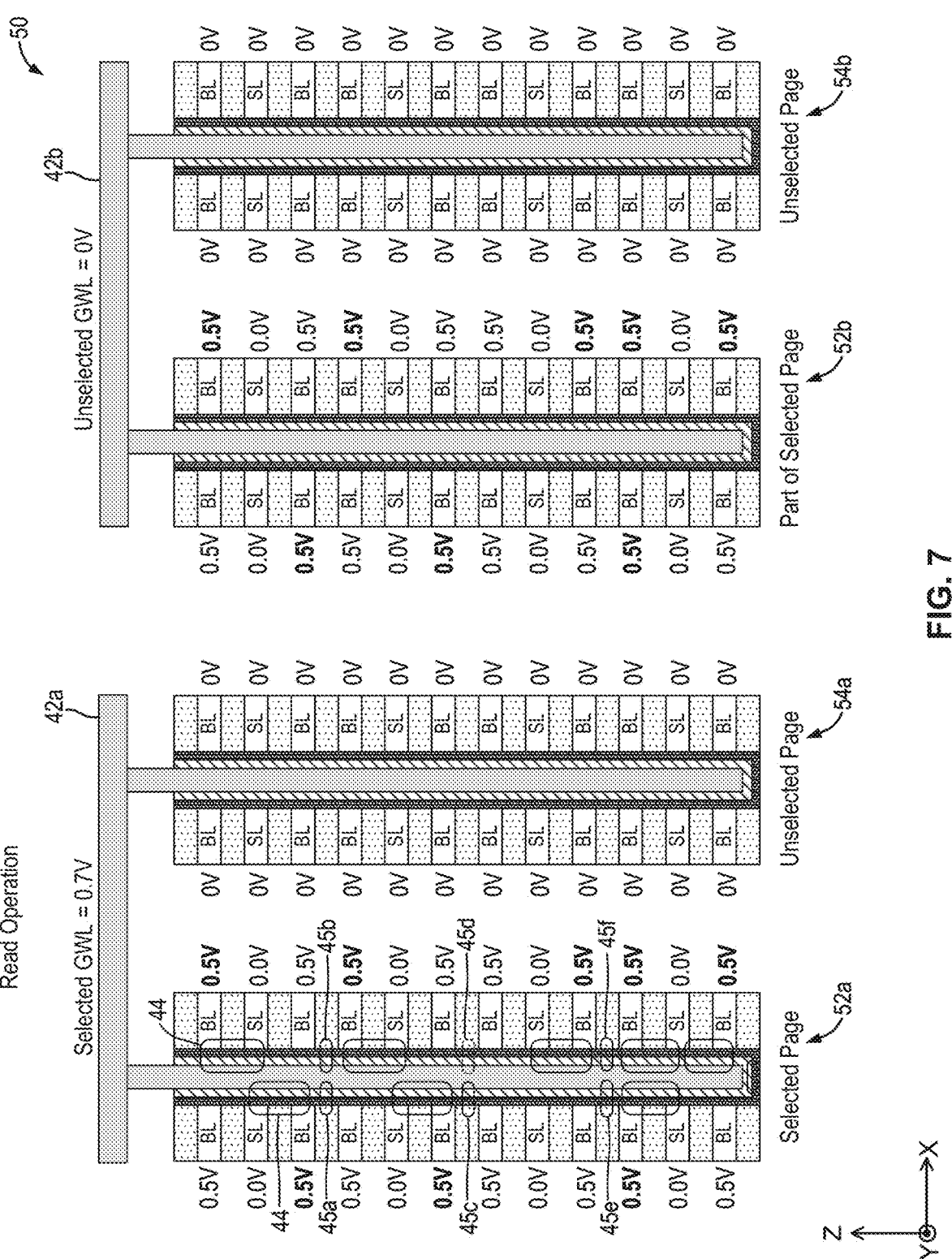
FIG. 7 illustrates a read operation that can be implemented in the 3-dimensional array of NOR memory strings following the write operation in FIGS. 5 and 6 in embodiments of the present invention.

FIG. 7 illustrates a read operation that can be implemented in the 3-dimensional array of NOR memory strings following the write operation in FIGS. 5 and 6 in embodiments of the present invention. Referring to FIG. 7, to read ferroelectric storage transistors from the selected page 52a, a small positive gate-to-source voltage is applied and a small positive bit line voltage is applied. In the present embodiment, the read operation is carried out by setting the selected global word line 42a to a positive voltage of 0.7V, setting the source line voltage to 0V, and setting the bit line voltage to 0.5V. As thus biased, a ferroelectric storage transistor that is in the erased state will be conducting and an "on" current Ion flows between the bit line and the source line of the erased storage transistors. Meanwhile, a ferroelectric storage transistor that is in the programmed state will be non-conducting and no current flows between the bit line and the source line of the programmed storage transistors, except for a small leakage current, referred to as an "off" current Ioff.

During the read operation, the unselected global word line 42b is set to 0V. The unselected memory pages 54a, 54b will have the bit line voltage and source line voltage set to 0V as well. For the unselected ferroelectric storage transistors in the page 52b belonging to the same NOR memory strings as the selected page 52a, the source line and the bit line voltages are biased to the same values as the transistors in page 52a. However, these unselected ferroelectric storage transistors will not be read as their gate terminals are biased to the unselected global word line voltage (e.g. 0V) and the gate-to-source voltage across these unselected ferroelectric storage transistors is 0V, which keeps these transistors turned off.

As thus biased, ferroelectric storage transistors in the selected page 52a that are erased will conduct current Ion while ferroelectric storage transistors in the selected page 52a that are programmed will conduct current Ioff. The bit lines of the ferroelectric storage transistors are connected to sense amplifiers to sense the cell current and to generate an output logical value indicative of the cell current. The parasitic transistor device between two bit lines will not impact the read operation, regardless of whether the parasitic device is erased or programmed. This is because the source-drain terminals of the parasitic transistor devices are biased to the same bit line voltage (0.5V) and so no current will flow in these parasitic transistor devices.

In some embodiments, the ferroelectric storage transistors in the three dimensional array of NOR memory strings can be induced to store multi-state data, that is, to store data of more than two polarization states, corresponding to more than two logical states. In one embodiment, the ferroelectric storage transistors are operated to store multi-state or multi-level data by erasing the ferroelectric storage transistors to a lower threshold voltage level, representing one polarization state, and then programming the ferroelectric storage transistors to two or more intermediate states, each state having a different threshold voltage level higher than the threshold voltage level associated with erased state.

In some embodiment, the ferroelectric storage transistors are erased using the bias conditions described above with reference to FIG. 5. For example, the selected global word line is driven to 2.2V, the selected bit lines and source lines are driven to 0V. The unselected global word line, unselected bit line and unselected source line are driven to 1.1V. With this biasing condition, the selected ferroelectric storage transistors are erased with a first threshold voltage being the lower or lowest threshold voltage for the ferroelectric storage transistors.

In some embodiments, the ferroelectric storage transistors in the same page (such as page 52a) are programmed to multiple logical states in a single program operation. That is, the threshold voltages of the ferroelectric storage transistors in the same page are increased from the erased threshold voltage level to different higher threshold voltage levels in the same program operation. Accordingly, only two write cycles (one erase and one program) are required to store multiple (or more than two) logical states in the ferroelectric storage transistors.

In one example, the biasing conditions used to program all the ferroelectric storage transistors in the same page to two program states include driving the selected global word line to 0V and driving the selected bit lines to 1.6V or 2V depending on the desired program state for the respective ferroelectric storage transistors. In this manner, the selected ferroelectric storage transistors can be programmed to two program states with different program threshold voltage levels in a single program operation, which together with the erase state results in a three logical states being stored in the ferroelectric storage transistors of the selected page. In another example, the biasing conditions used to program all the ferroelectric storage transistors in the same page to three program states include driving the selected global word line to 0V and driving the selected bit lines to 1.6V, 1.8V or 2V depending on the desired program state for the respective ferroelectric storage transistors. In this manner, the selected ferroelectric storage transistors can be programmed to three program states with different program threshold voltage levels in a single program operation, which together with the erase state results in a four logical states being stored in the ferroelectric storage transistors of the selected page. In the present examples, during the multi-state program operations, all source lines and unselected bit lines and unselected global word lines can be set to 0.8V. In other examples, selected ferroelectric storage transistors in a memory page can be programmed to any number of program states in the same program operation by applying different program voltages to the bit lines, such as voltage values between 1.6 and 2.0V. The selected ferroelectric storage transistors in a memory page can be programmed to a continuum of threshold voltage values by applying program voltage over a continuous voltage range, such as continuous program voltage values between 1.6V and 2.0V.

In other embodiments, the ferroelectric storage transistors in the same page (such as page 52a) are programmed to multiple logical states in separate program operations. That is, after the erase operation, the selected ferroelectric storage transistors are programmed to increase the threshold voltages to different levels in separate program operations. In one example, the selected global word line is driven to 0V. Then in a first program operation, a first group of selected bit lines is driven to 1.6V (VPP voltage) to program the associated ferroelectric storage transistors to a second logical state (the erase state being the first logical state). All source lines and unselected bit lines and unselected global word lines are set to a voltage value of 0.44*VPP, that is 0.7V. To program another logical state in second program operation, a second group of selected bit lines is driven to 2.0V (VPP voltage) to program the associated ferroelectric storage transistors to a third logical state. All source lines and unselected bit lines and unselected global word lines are set to a voltage value of 0.44*VPP, that is 0.88V. Successive program operations can be performed to program the selected ferroelectric storage transistors to any number of logical states using different VPP voltage values.

In the above description, voltage bias conditions are described and example voltage values are provided to illustrate the erase, program and read operations of the memory array of ferroelectric storage transistors. The voltages described above are illustrative only and not intended to be limiting. In other embodiments, other voltage values can be used to implement the voltage bias conditions for erase, program and read operations.

As described above, in embodiments of the present disclosure, the common source line of the memory structure can be left floating, or not electrically connected to any potential. Instead, the common source line can be pre-charged using one or both of the bit lines in the pair of NOR memory strings prior to erase, program and read operations. In one embodiment, the pre-charge operation set the bit line to a desired voltage through a pre-charge transistor and then the source line is charged from the bit line to a voltage to equal to the bit line voltage.

Bit Line Selection for Sense Amplifier

Returning to FIG. 1, the memory structure 10 is shown as including four active stacks with four bit lines on each layer or plane of the 8-layer three-dimensional memory structure. Ferroelectric storage transistors 20 are formed on both sides of each active stack to form a NOR memory string along each active strip. In actual implementation, the memory structure 10 may be formed with thousands of bit lines per layer (for example, 2048 bit lines) with each bit line being coupled to thousands of LWL structures to form thousands of ferroelectric storage transistors 20 (e.g., 4096 transistors) along the active strip as the NOR memory string.

In some embodiments, the storage transistors in the memory structure 10 are accessed in units of a memory page having a given byte size and the support circuitry formed in the semiconductor substrate 12 under the memory array includes sense amplifier circuits for outputting read data of the memory page byte size. In one example, the memory structure 10 may be accessed in memory page size of 64 byte or 512 bits. In that case, the supporting circuit under the memory array may include 512 sense amplifiers to output the 512 bits of read data. In some embodiments, a bit line selector is used to multiplex the thousands of bit lines in the memory structure to the given number of sense amplifiers to enable access to a page of memory data. For example, a bit line selector may be used to multiplex 16 k bit lines to 512 sense amplifiers.

Figure 8:
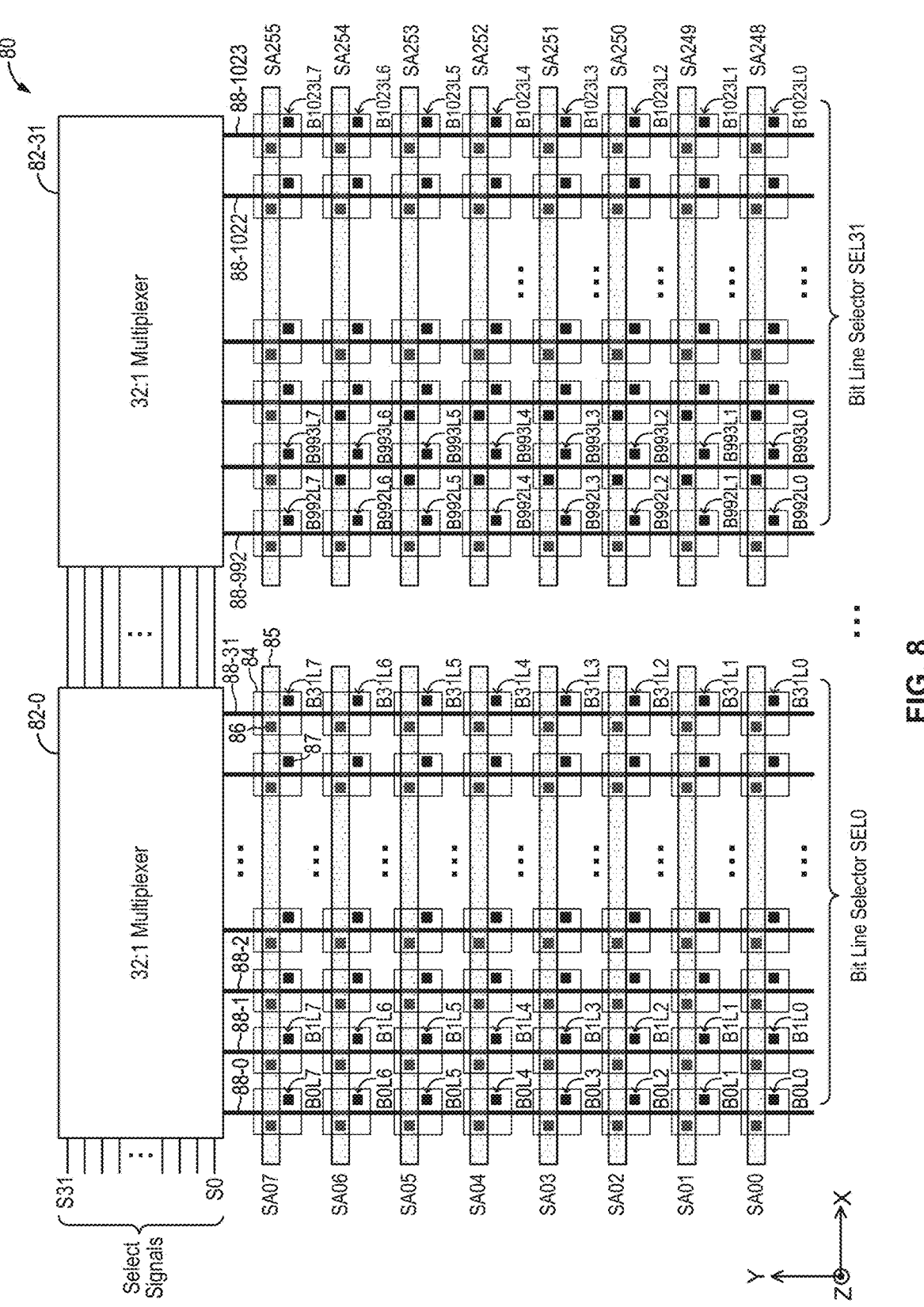
FIG. 8 illustrates a bit line selector which may be implemented in the three-dimensional array of NOR memory strings in embodiments of the present invention.

FIG. 8 illustrates a bit line selector which may be implemented in the three-dimensional array of NOR memory strings in embodiments of the present invention. In the embodiments described above, the ferroelectric storage transistors formed in an active stack belong to the same memory page and are accessed together. Referring to FIG. 8, a bit line selector circuit 80 is configured to enable the selection of bit lines across all layers of the memory array that belong to the same active stack, thereby selecting storage transistors belonging to the same memory page.

In the present embodiment, the bit line selector circuit 80 includes multiple bit line selectors SEL0 to SEL31. In the present illustration, only two selectors SEL0 and SEL31 are shown for simplicity. Each bit line selector SEL*n* includes a multiplexer 82 (e.g. multiplexer circuits 82-1, 82-2, etc.), where each multiplexer 82 selects one column of bit lines out of 32 columns. The multiplexer 82 may be referred to as a 32:1 mux or a 32:1 selector. In the present embodiment, the multiplexer 82 receive select signals S0 to S31 to select or activate one output terminal 88 out of 32 output terminals. For example, multiplexer 82-1 selects one output terminal out of 32 output terminals 88-0 to 88-31. Meanwhile, multiplexer 82-31 selects one output terminal out of 32 output terminals 88-992 to 88-1023. Each output terminal 88 is coupled to the gate terminal to a bank of pass transistors. Each bank of pass transistors receives at a first terminal bit line signals of the same column across all layers of the memory array. When the pass transistors are activated by the output terminal 88, the bit line signals are passed to the respective second terminals of the bank of pass transistors. The second terminals of the bank of pass transistors are to be connected, such as through a metal interconnect, to respective sense amplifier circuits.

For instance, at bit line selector SEL0, each output terminal 88-0 to 88-31 connects to a bank of pass transistors, where the pass transistors in each bank are connected to respective sense amplifier circuit SA00 to SA07. Each output terminal 88-0 to 88-31 connects to a different page of the ferroelectric storage transistors. For instance, output terminal 88-0 connects to the bit lines B0 across the layers L0 to L7 of the memory array and output terminal 88-31 connects to the bit lines B31 across the layers L0 to L7 of the memory array. Meanwhile bit line selector SEL31 includes a 32:1 multiplexer 82-31 with output terminals 88-992 to 88-1023, where the pass transistors in each bank are connected to respective sense amplifier circuit SA248 to SA255. Each output terminal 88-992 to 88-1023 connects to a different page of the ferroelectric storage transistors. For instance, output terminal 88-992 connects to the bit lines B992 across the layers L0 to L7 of the memory array and output terminal 88-1023 connects to the bit lines B1023 across the layers L0 to L7 of the memory array.

As thus configured, at the bit line selectors SEL0 to SEL31, the multiplexers 82-0 to 82-31 each selects one output terminal 88 in response to the select signals S0 to S31. As a result, one column of bit lines associated with each multiplexer is selected, where each selected column includes bit lines from all layers of the array. A total of 32 columns of bit lines are thus selected, with each column being coupled to respective sense amplifier circuits. In this example, the 32 selected columns of bit lines connect to 256 sense amplifier circuits SA0 to SA255 to provide 256 bits of read data.

The bit line selector circuit 80 described herein is illustrative only and not intended to be limiting. Various circuit configurations can be used to implement the bit line selection described herein. the bit line selector circuit 80 is provided herein as one exemplary embodiment.

Fabrication Process

FIGS. 9(*a*) to 9(*n*) illustrate a process for fabricating a memory structure including a 3-dimensional array of NOR memory strings of ferroelectric storage transistors according to embodiments of the present invention. FIGS. 9(*a*) to 9(*h*) illustrate vertical cross-sectional views (i.e., in an X-Z plane) of a portion of the 3-dimensional array of NOR memory strings. Each figure in FIGS. 9(*i*) to 9(*n*) includes two views: view (i) is a horizontal cross-sectional view (i.e., in an X-Y plane) along line A-A' in view (ii), and view (ii) is a vertical cross-sectional view (i.e., in an X-Z plane) along line A-A' in view (i).

Referring to FIG. 9(*a*), initially, a memory structure 100 is formed by successive depositions of (i) an isolation dielectric layer 104 and (ii) a sacrificial layer 106 on the planar surface of a semiconductor substrate 101 to form a multilayer structure. In some embodiments, a buffer layer 102 may be provided on the surface of the semiconductor substrate 101 before the isolation dielectric layers 104 and the sacrificial layer 106 are formed on the substrate 101. In some embodiments, the buffer layer 102 maybe a silicon oxycarbide (SiOC) layer or a silicon oxide (SiO$_2$) layer. In the present embodiment, the isolation dielectric layer 104 is a silicon oxide layer and may have a thickness of 30 nm. The sacrificial layer 106 is a silicon nitride layer and may have a thickness of 40 nm. The sacrificial layer 106 will be replaced by a conductive layer in metal replacement process in subsequent processing. FIG. 9(*a*) shows the memory structure 100 after the depositions of the initial layers of thin films. As described above, dimensions are provided in the present description for illustrative purposes and are not intended to be limiting. In actual implementation, any suitable thicknesses or dimensions may be used. The drawings are not necessarily to scale.

Referring to FIG. 9(*b*), a first set of trenches 108 are formed in memory structure 100 using, for example, an anisotropic etch after a photo-lithographical patterning step. In some examples, the trenches 108 may be 70 nm wide, with a spacing of 190 nm apart. Referring to FIG. 9(*c*), an amorphous metal oxide semiconductor layer 120 is then conformally deposited on the exposed sidewalls of the trenches 108. The amorphous metal oxide semiconductor layer 120 ("oxide semiconductor layer 120") maybe deposited using, for example, an atomic layer deposition (ALD) technique, a plasma-enhanced ALD technique or using physical vapor deposition (PVD). In particular, the oxide semiconductor layer 120 can be formed at a low processing temperature, such as lower than 400° C. In the present embodiment, the oxide semiconductor layer 120 is an indium gallium zinc oxide (InGaZnO, or "IGZO") layer. For example, IGZO deposition using thermal ALD or plasma enhanced ALD can be carried out at a processing temperature as low as 200° C. Other oxide semiconductor materials that may be used include indium zinc oxide (InZnO, or "IZO"), indium aluminum zinc oxide (IAlZnO) or indium tin zinc oxide (ITZO). In one embodiment, the oxide semiconductor layer 120 has a thickness of 10 nm. The oxide semiconductor layer 120 will become the channel region of the ferroelectric storage transistors to be formed.

In the present embodiment, the oxide semiconductor layer 120 as deposited is a continuous layer along the exposed sidewalls of trenches 108. In some embodiments, after the oxide semiconductor layer 120 is deposited, an etching process can be carried out to etch away the portion of the oxide semiconductor layer 120 at the bottom of the trenches 108, thereby separating the oxide semiconductor layer formed on the sidewalls of the trenches. Etching of the oxide semiconductor layer 120 from the bottom of trenches 108 is optional and may be included if certain specific memory page size is desired, as described above.

Figure 9A:
FIGS. 9(a) to 9(n) illustrate a process for fabricating a memory structure including a 3-dimensional array of NOR memory strings of ferroelectric storage transistors according to embodiments of the present invention.
Figure 9A:
Figure 9A:
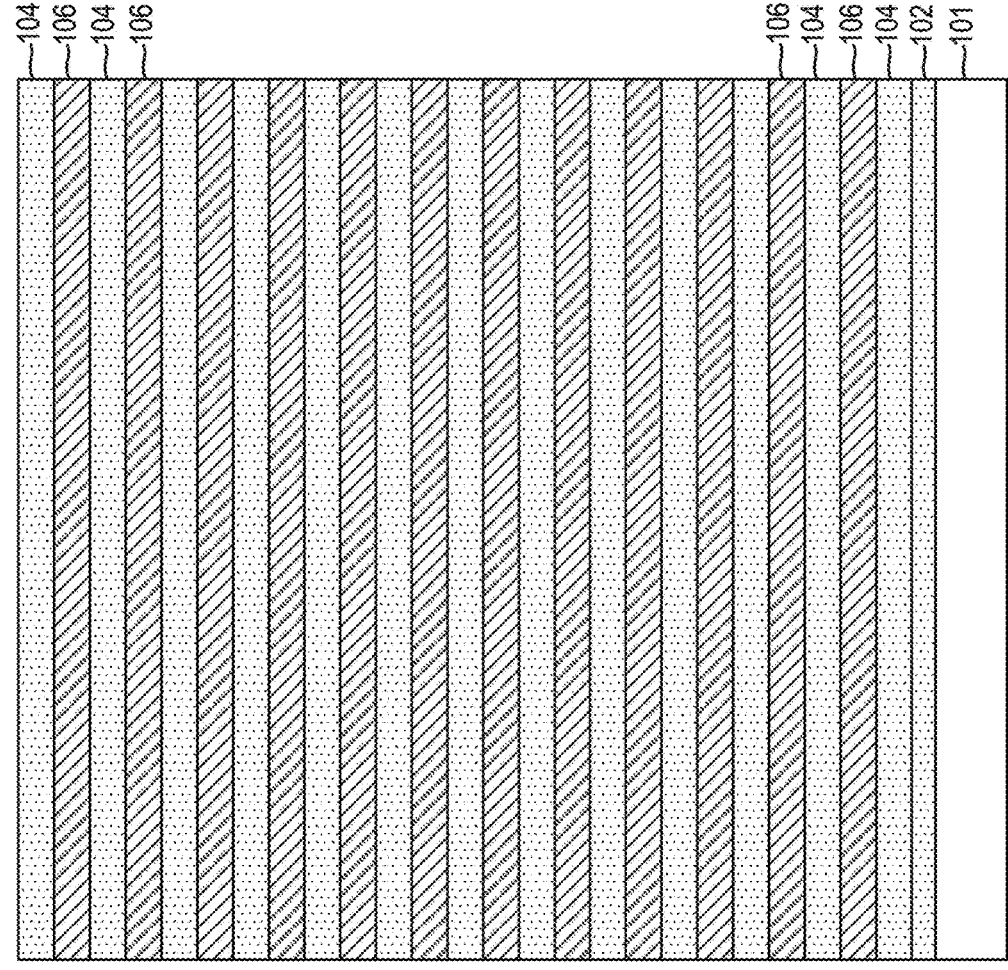
Figure 9A:
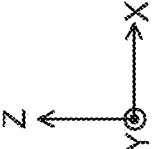
Figure 9B:
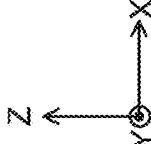
Figure 9C:
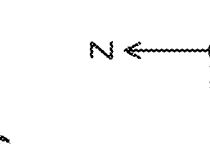
Figure 9D:
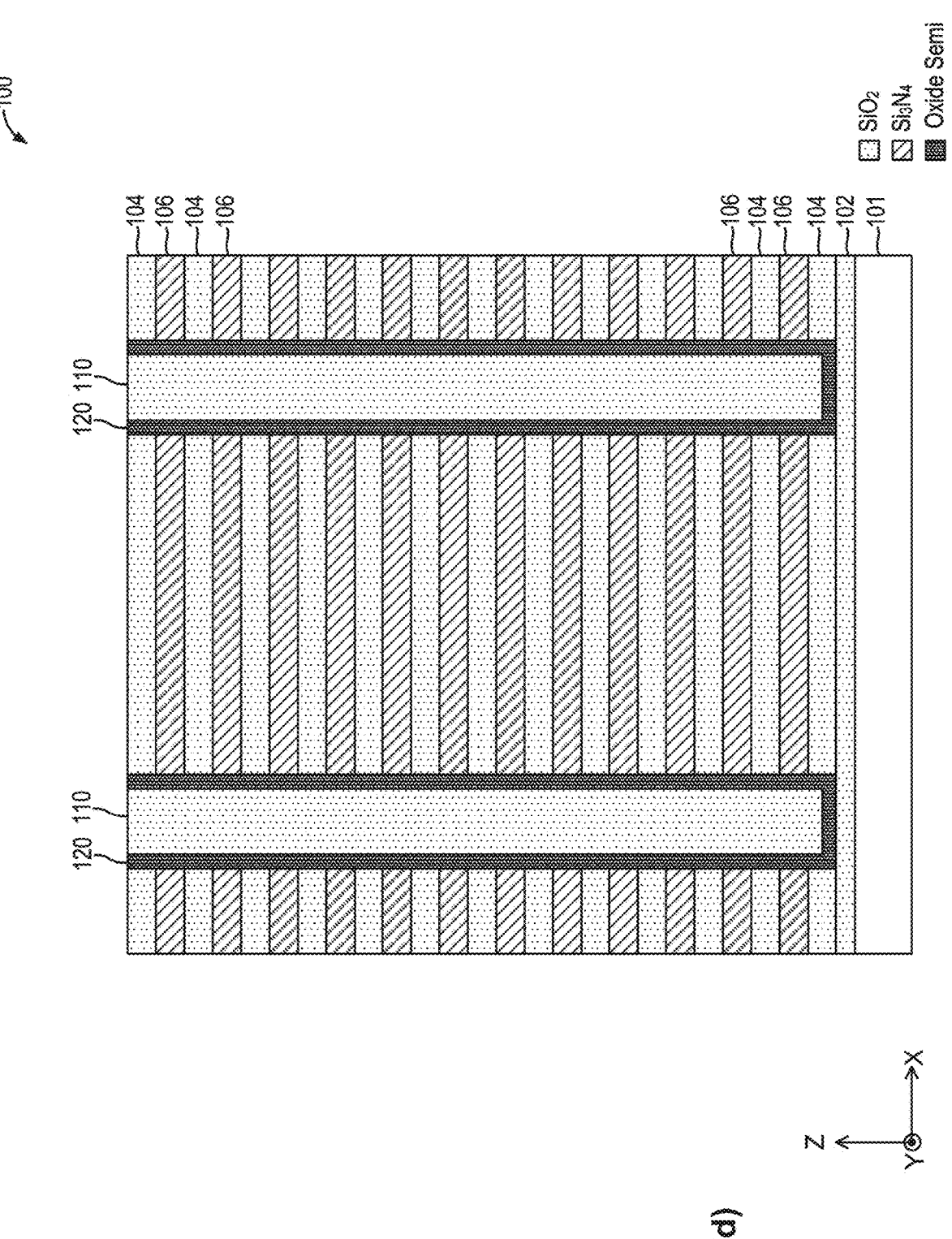

Referring to FIG. 9(d), trenches 108 are then filled by a dielectric material 110. In some embodiments, the dielectric material 110 is a silicon oxide material, such as $SiO_2$. Excess dielectric material may be removed from the top of memory structure 100 using, for example, chemical-mechanical polishing (CMP). FIG. 9(d) shows the resulting memory structure 100.

Figure 9E:
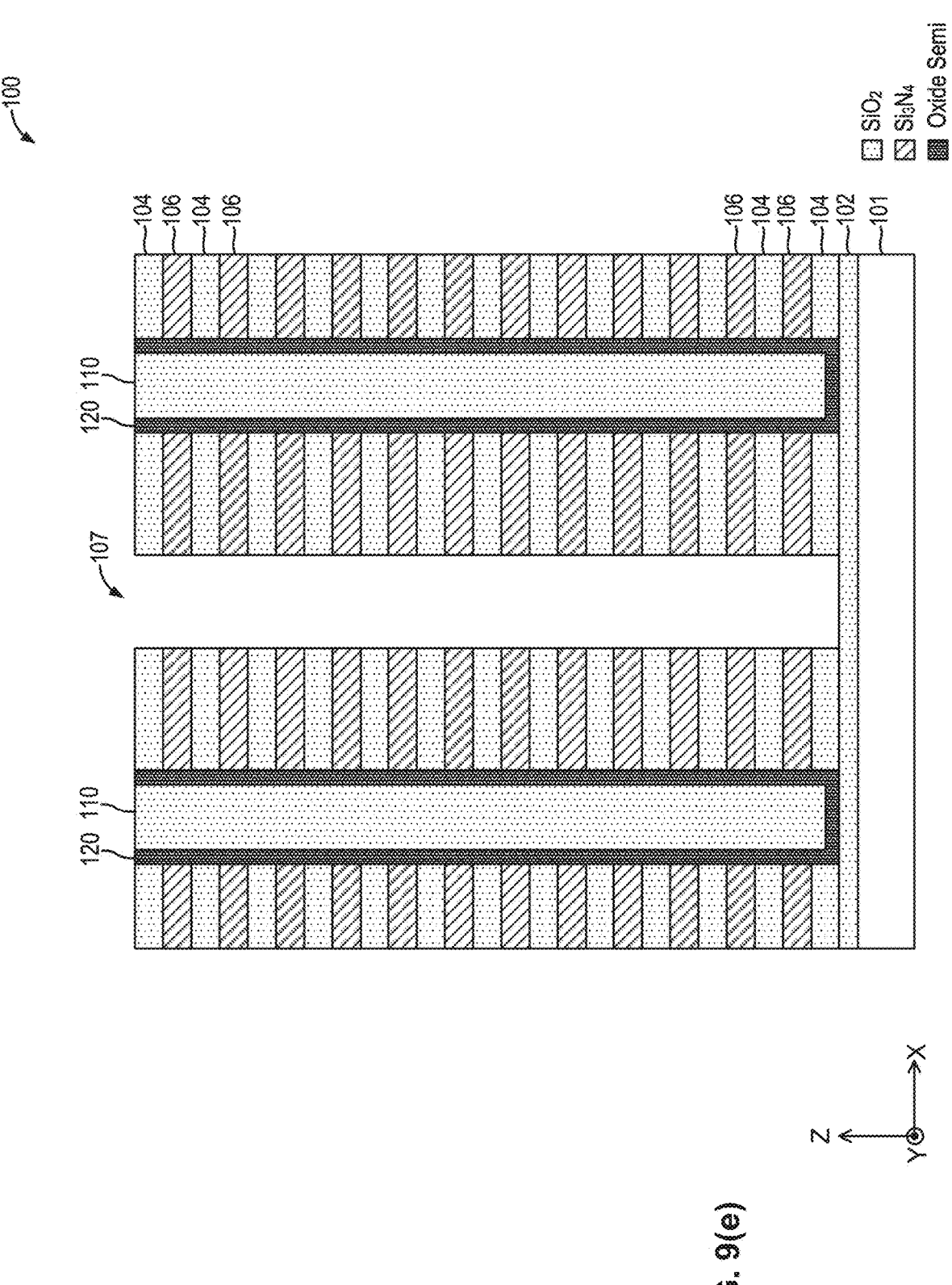

Referring to FIG. 9(e), with the mechanical support from dielectric material 110, a second set of trenches 109 are then cut using substantially the same technique as discussed in conjunction with FIG. 9(b) above. In some examples, the trenches 109 may be 70 nm wide. Each of the second set of trenches 109 is cut between an adjacent pair of the first set of trenches 108 and each of the second set of trenches 109 is cut substantially equidistant between an adjacent pair of the first set of trenches 108. As a result of trenches 108 and 109 being cut in the multilayer structure, stacks in the multilayer structure are formed which are referred to as "active stacks" in the present description. In some examples, the active stacks are each approximately 60 nm wide. The resulting narrow strips of layers 104 and 106 in the active stacks are referred herein as "active strips."

Figure 9F:
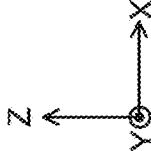
Figure 9G:
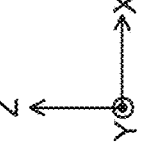

Thereafter, the sacrificial silicon nitride layer 106 is removed using, for example, a wet etch, thereby creating cavities between the isolation dielectric layer 104, as shown in FIG. 9(f). The cavities are filled by a conductive layer 112, as shown in FIG. 9(g). In some embodiments, the conductive layer 112 is a refractory metal layer, such as molybdenum (Mo) or tungsten (W). In other embodiments, the conductive layer 112 can be a metal layer selected from molybdenum, titanium, tungsten, lanthanum, tantalum, ruthenium, any silicide thereof, any nitride thereof, and any combination thereof. For example, the conductive layer 112 may be formed using, for example, an atomic layer deposition (ALD) technique. An etching step removes any of the deposited material from the sidewalls of trenches 109. In some examples, an isotropic wet etch is used to remove the deposited material from the sidewalls of trenches 109. In the present embodiment, the conductive layer 112 is a molybdenum layer and forms the source and drain terminals of the ferroelectric storage transistors to be formed.

Figure 9H:
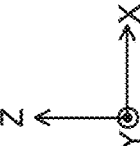

Thereafter, an amorphous metal oxide semiconductor layer 120 is then conformally deposited on the exposed sidewalls of the trenches 109, such as using an ALD process. The oxide semiconductor layer 120 may have a thickness of 10 nm. Trenches 109 are then filled by the dielectric material 110, such as $SiO_2$. Excess deposited materials may be removed from the top of memory structure 100, such as by CMP. The resulting memory structure 100 is shown in FIG. 9(h).

Figure 9I:
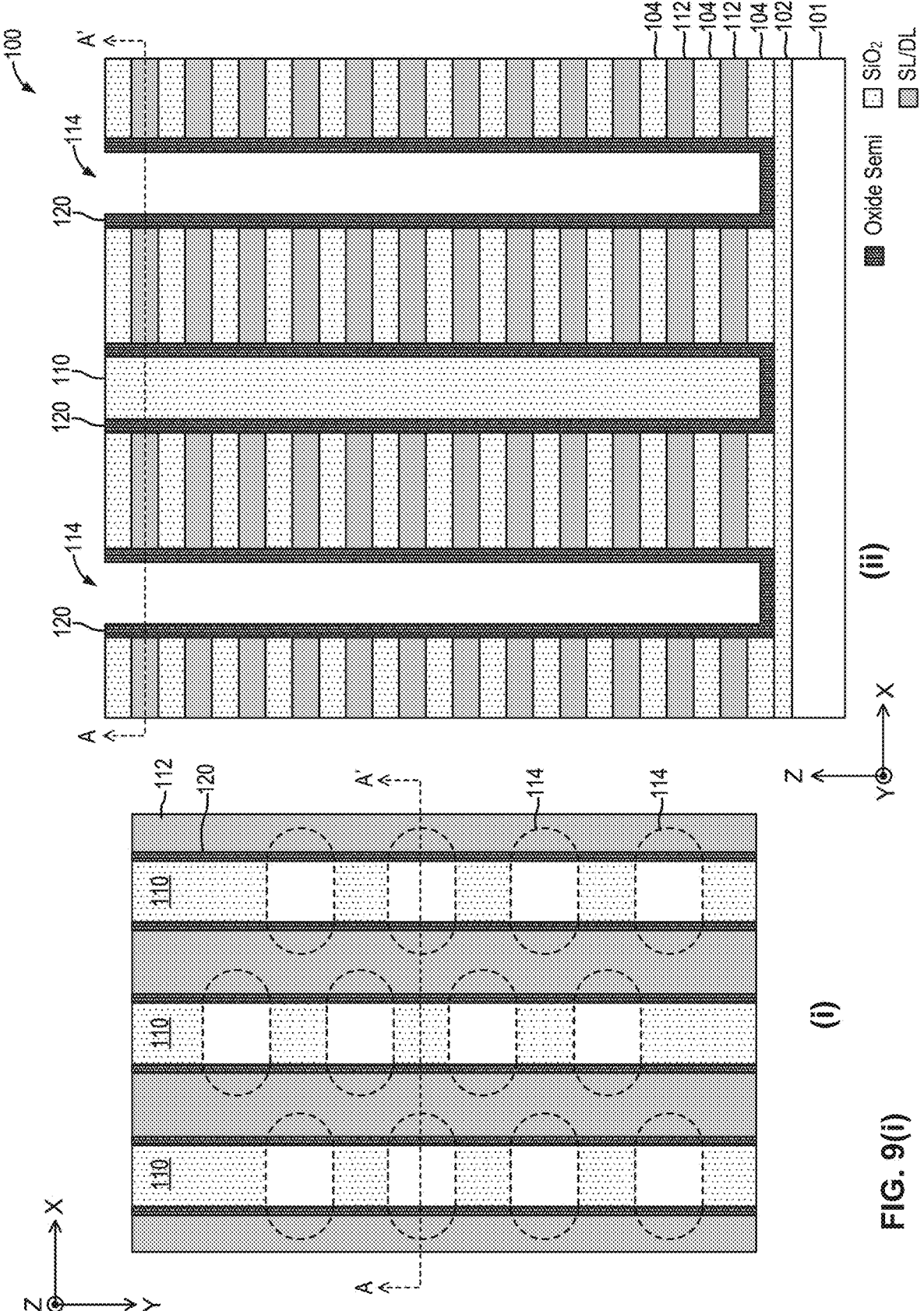
Figure 9I:
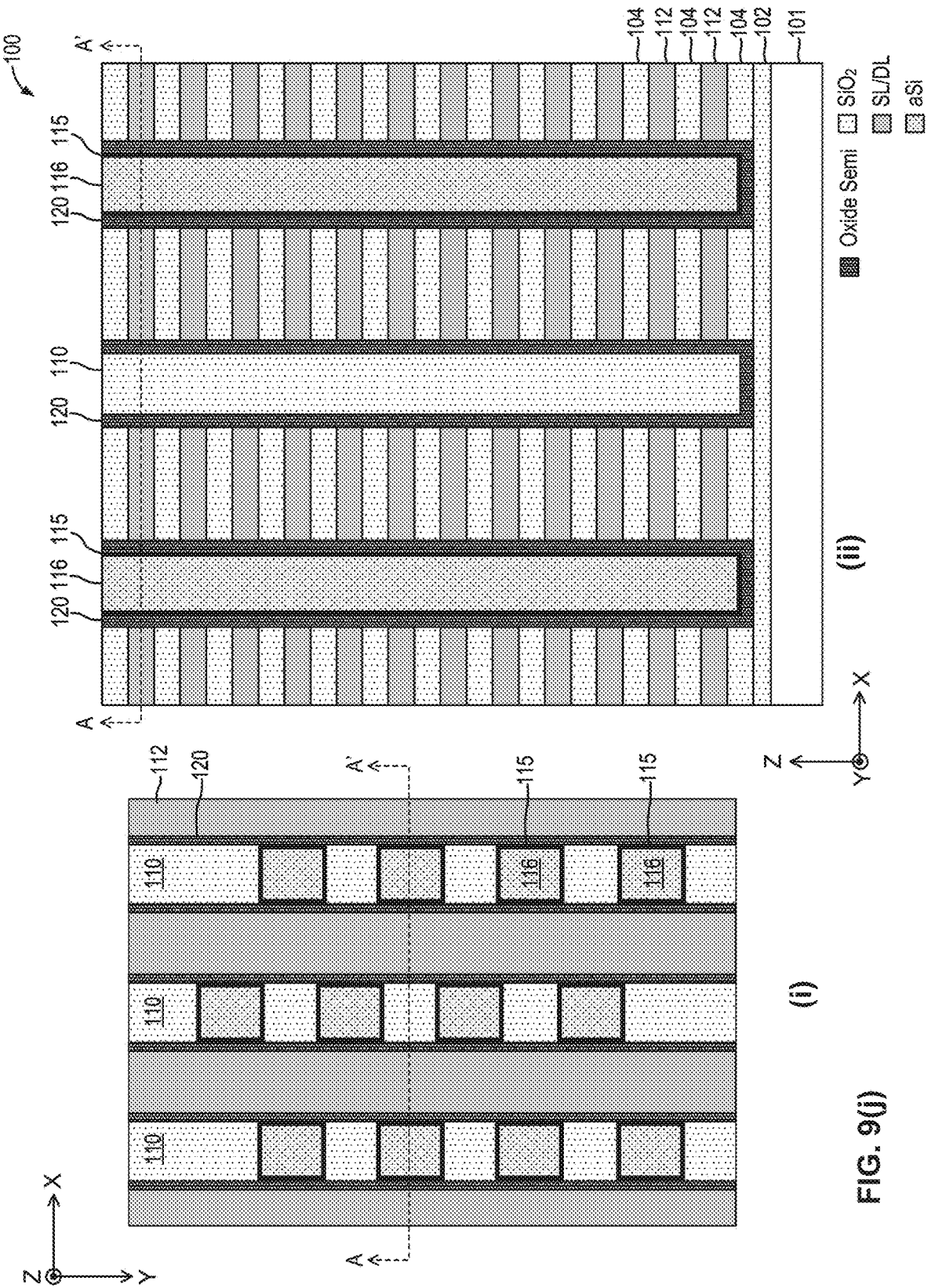
Figure 9K:
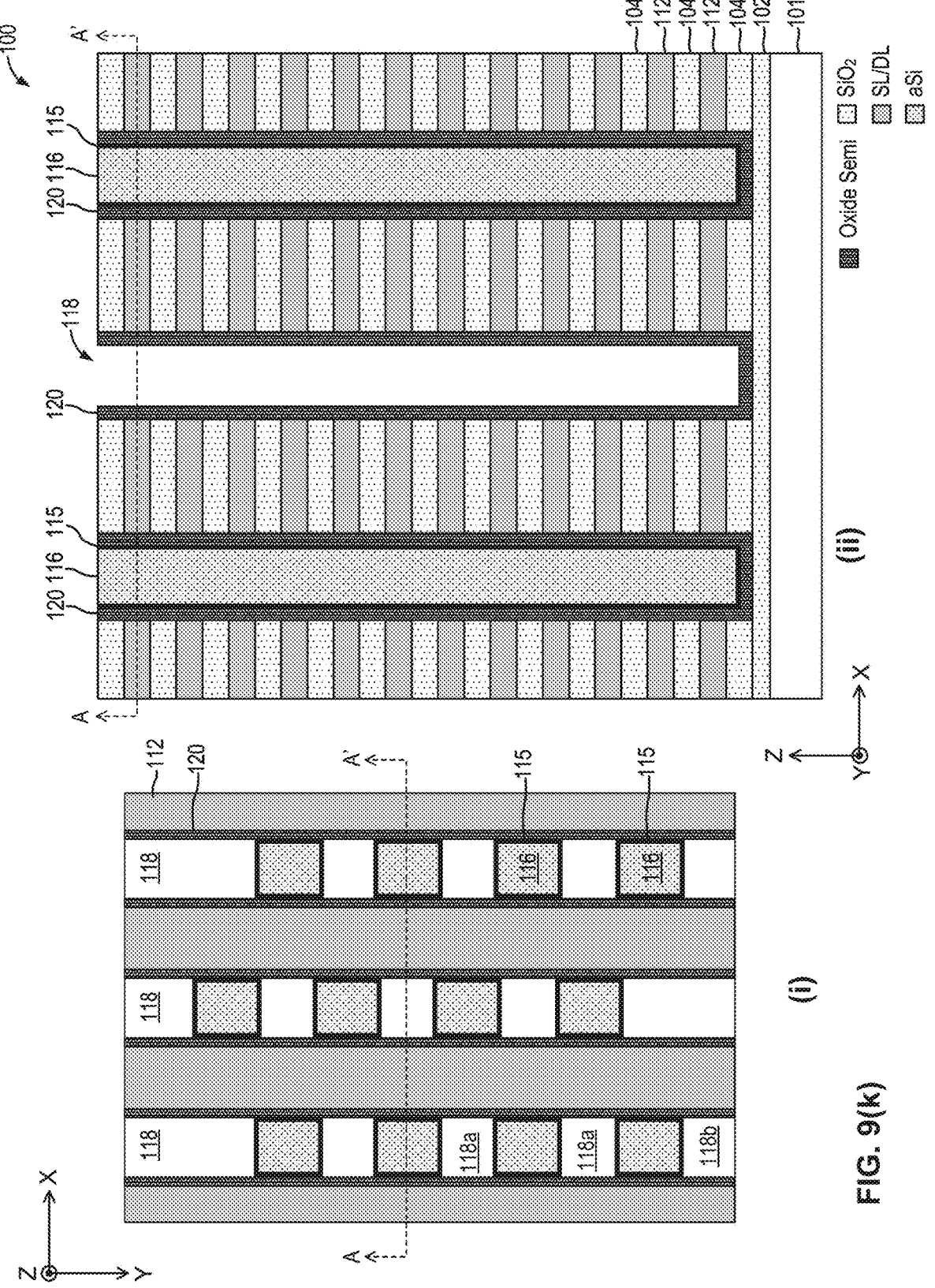
Figure 9I:
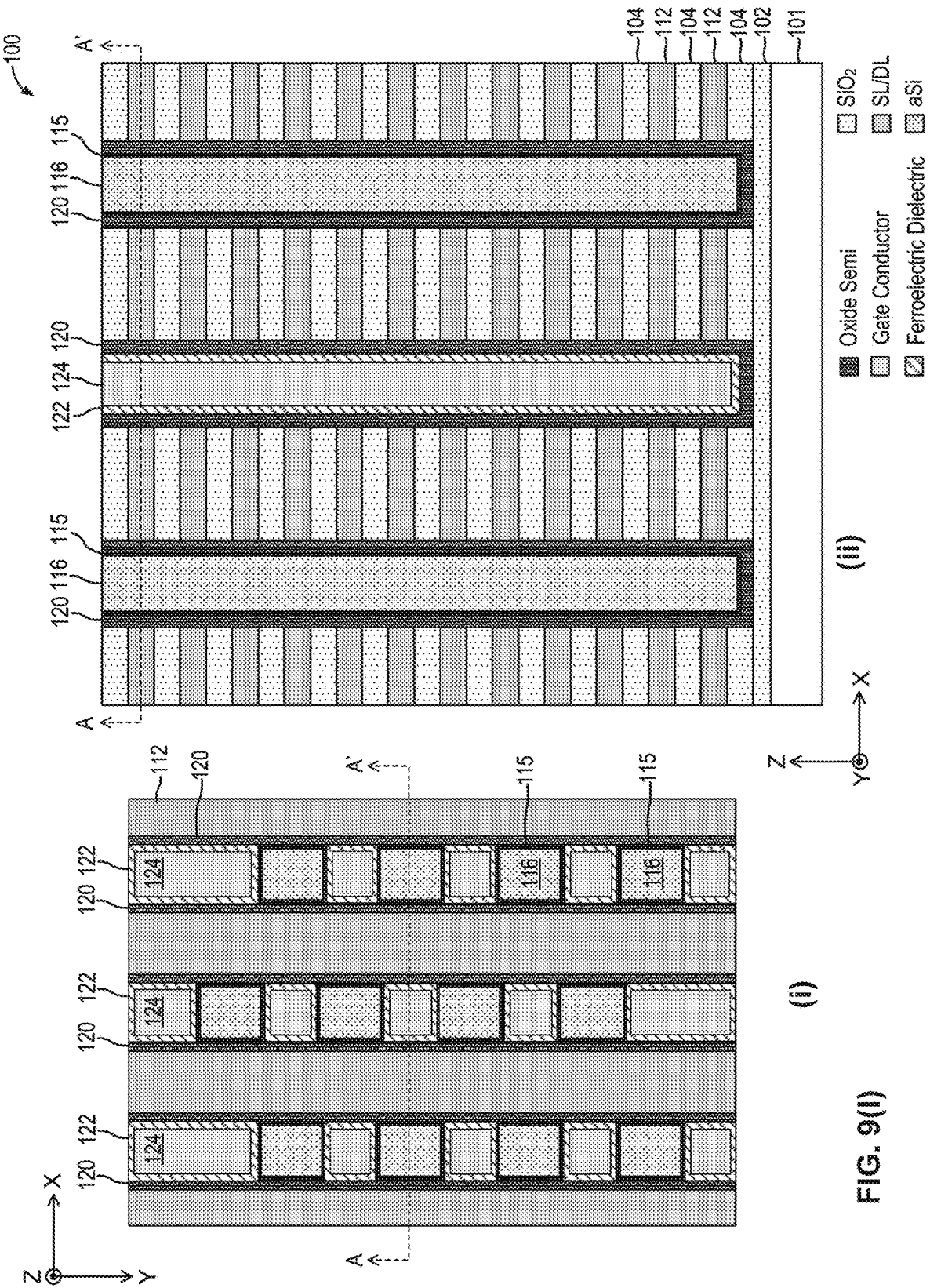

Referring to FIG. 9(i), thereafter, vias 114 are patterned and the dielectric material 110 exposed by the vias 114 are etched using, for example, an anisotropic etch. Vias 114 may be masked in an oval shape, as shown in the horizontal cross-sectional view (i) of FIG. 9(i). In some examples, the oval shaped mask opening may have a major axis of 100 nm along the X-direction and a minor axis of 60 nm along the Y-direction. Vias 114 are filled at a later time by a dielectric material so as to isolate adjacent storage transistors in an NOR memory strings to be formed. Referring to FIG. 9(j), vias 114 are then filled with a sacrificial silicon nitride liner 115 and a sacrificial amorphous silicon layer 116. Excess materials on top of memory structure 100 may be removed using, for example, CMP. With the vias 114 filled, the remainder of dielectric material 110 in trenches 108 and 109 is then removed using, for example, a wet etch step, as illustrated in FIG. 9(k). As a result, cavities 118 are formed in trenches 108 and 109 outside of the vias 114 which are now filled with sacrificial layers of silicon nitride liner 115 and amorphous silicon layer 116.

Referring to FIG. 9(l), a ferroelectric gate dielectric layer 122 is then conformally deposited on the exposed sidewalls of cavities 118. In some embodiments, the ferroelectric gate dielectric layer 122 is deposited by any one of suitable deposition methods including but not limited to chemical vapor deposition (CVD), low pressure chemical vapor deposition (LPCVD), physical vapor deposition (PVD) and atomic layer deposition (ALD). Other deposition methods such as evaporation and electrodeposition can also be used. In some embodiments, the ferroelectric gate dielectric layer 122 is a doped hafnium oxide ($HfO_2$) layer. In one embodiment, the hafnium oxide is doped with zirconium oxide ($ZrO_2$) to form a hafnium zirconium oxide layer (HfZrO or "HZO"). In another embodiment, the hafnium oxide is doped with silicon (Si), iridium (Ir) and lanthanum (La). In some embodiments, the ferroelectric gate dielectric layer 122 is a material selected from: zirconium-doped hafnium oxide (HZO), silicon-doped hafnium oxide (HSO), aluminum zirconium-doped hafnium oxide (HfZrAlO), aluminum-doped hafnium oxide (HfO2:Al), lanthanum-doped hafnium oxide (HfO2:La), hafnium zirconium oxynitride (HfZrON), hafnium zirconium aluminum oxide (HfZrAlO), and any hafnium oxide that includes zirconium impurities.

In one embodiment, the ferroelectric gate dielectric layer 122 has a thickness of 4 nm. In some embodiments, an interface dielectric layer (sometimes referred to as an "interfacial layer") is formed between the oxide semiconductor layer 120 and the ferroelectric gate dielectric layer 122. In some embodiments, the interface dielectric layer is formed using a material with a high permittivity (K) (also referred to as "high-K" material). In one example, the interface dielectric layer, if present, may be a silicon nitride ($Si_3N_4$) layer and has a thickness of 1 nm. The ferroelectric gate dielectric layer 122 may be deposited and then annealed to form the ferroelectric phase in the ferroelectric material. The ferroelectric gate dielectric layer 122 forms the gate dielectric layer of the ferroelectric storage transistors to be formed.

After the deposited ferroelectric gate dielectric layer 122 is annealed, cavities 118 are filled by a conductive layer 124, which may include successively deposited titanium nitride (TiN) liner and a tungsten (W) layer. The TiN liner may be formed using, for example, an atomic layer deposition (ALD) technique. In each of cavities 118, between adjacent vias 114 (now filled by sacrificial materials 115, 116), the conductive layer 124 provides a vertical local word line (LWL) that serves as gate electrode for each of the ferroelectric storage transistors that are vertically aligned in the same active stack. The structure resulting from the combination of the ferroelectric gate dielectric layer 122 and the conductive layer 124 is referred herein as the local word line (LWL) structure. Excess deposited materials may be removed from the top of memory structure 100, such as by CMP. FIG. 9(l) illustrates the resulting memory structure 100.

It is instructive to note that the memory structure 100 includes regular sized cavities 118a in a central portion of the memory structure and extended sized cavities 118b at the edges of the memory structure (FIG. 9(k)). As a result, the memory structure 100 includes LWL structures formed in the regular sized cavities 118a which are to be used to form the ferroelectric storage transistors of the NOR memory strings. The structures formed in the extended sized cavities 118b at the edges of the memory structure 100 can be dummy structures or they can be converted to non-memory transistors, such as pre-charge transistors, where applicable. The exact configuration of the memory structure 100 at the edges of the memory strings is not critical to the practice of the present invention.

Figure 9M:
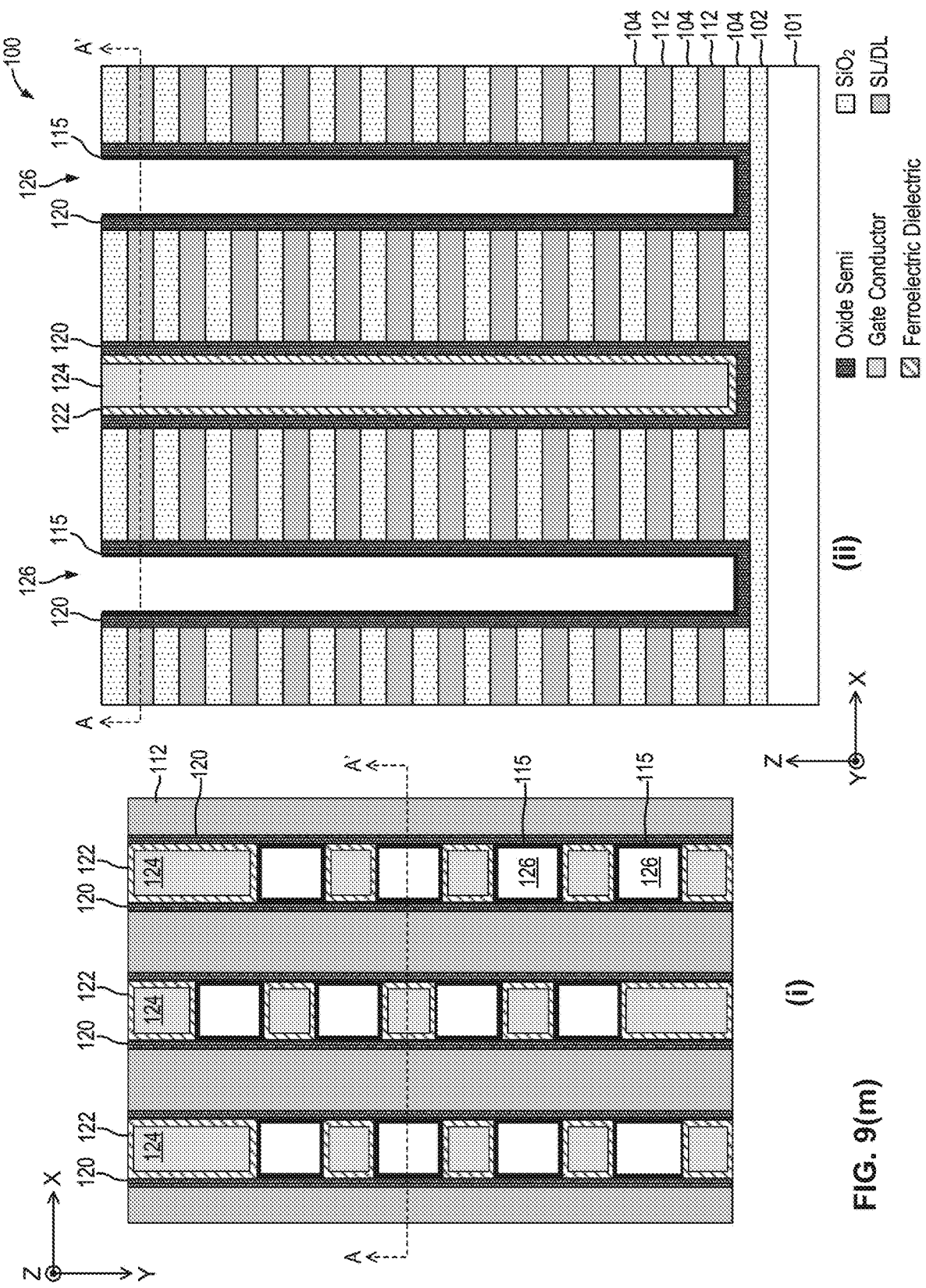

Referring to FIG. 9(m), subsequent to the LWL structures being formed, the sacrificial materials formed in the vias 114 are now removed, forming cavities 126. In the present embodiment, the amorphous silicon layer 116 is removed, such as by using a wet etch step. The silicon nitride liner 115 is left in the cavities 126. In other embodiments, the silicon nitride liner 115 may also be removed, such as by using a wet etch step.

Figure 9N:
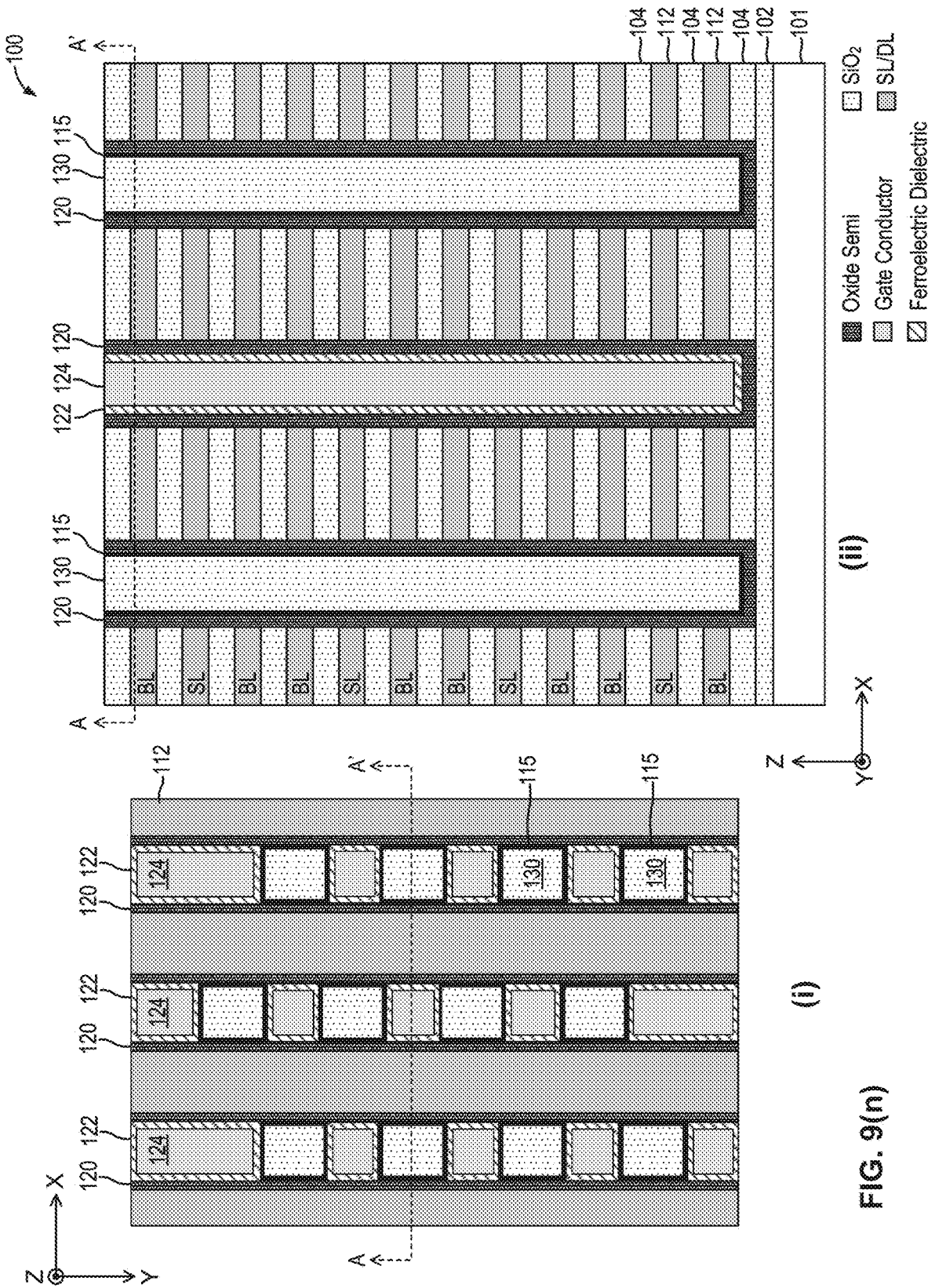

Referring to FIG. 9(n), a dielectric material 130 then fills the exposed vias 126. In some embodiments, the dielectric material 130 is silicon oxide, such as $SiO_2$. Excess material on top of memory structure 100 may be removed by CMP. The resulting memory structure 100 includes multiple layers of NOR memory strings of ferroelectric storage transistors formed in multiple active stacks to realize a memory device with large capacity. In particular, the ferroelectric storage transistors in the NOR memory strings are formed by the conductive layer 112 as the source and drain terminals, the oxide semiconductor layer 120 as the channel region, the ferroelectric gate dielectric layer 122 as the gate dielectric layer and the conductive layer 124 as the gate terminal or gate conductor. The memory structure 100 includes the oxide semiconductor layer 120 that is a continuous layer across all the layers of an active stack in the Z direction. Furthermore, the conductive layer 112 are arranged so that pairs of NOR memory strings share a common source line.

In the memory structure 100 of FIG. 9(n), the oxide semiconductor layer 120 is formed as a continuous layer across the active stacks and is further a continuous layer along the NOR memory strings, in the Y direction. Leaving the oxide semiconductor layer 120 between LWL structures does not impact the memory device because the regions between LWL structures are filled with dielectric materials only. However, in some embodiments, the oxide semiconductor layer 120 may be separated between LWL structures, as illustrated by the memory structure 30 of FIG. 2.

Figure 10A:
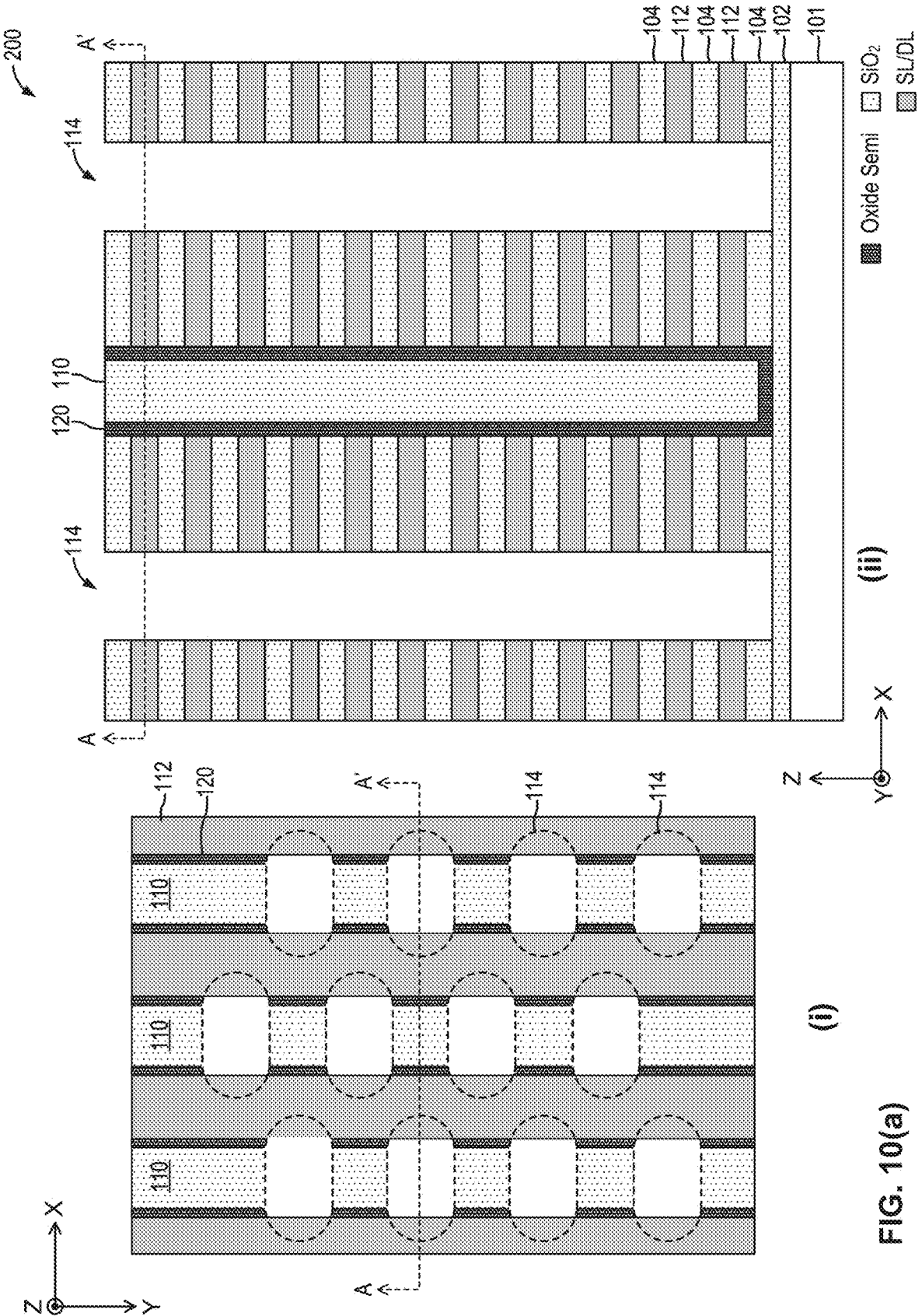
FIGS. 10(a) to 10(b) illustrate an alternative process for fabricating a memory structure including a 3-dimensional array of NOR memory strings of ferroelectric storage transistors according to embodiments of the present invention.
Figure 10B:
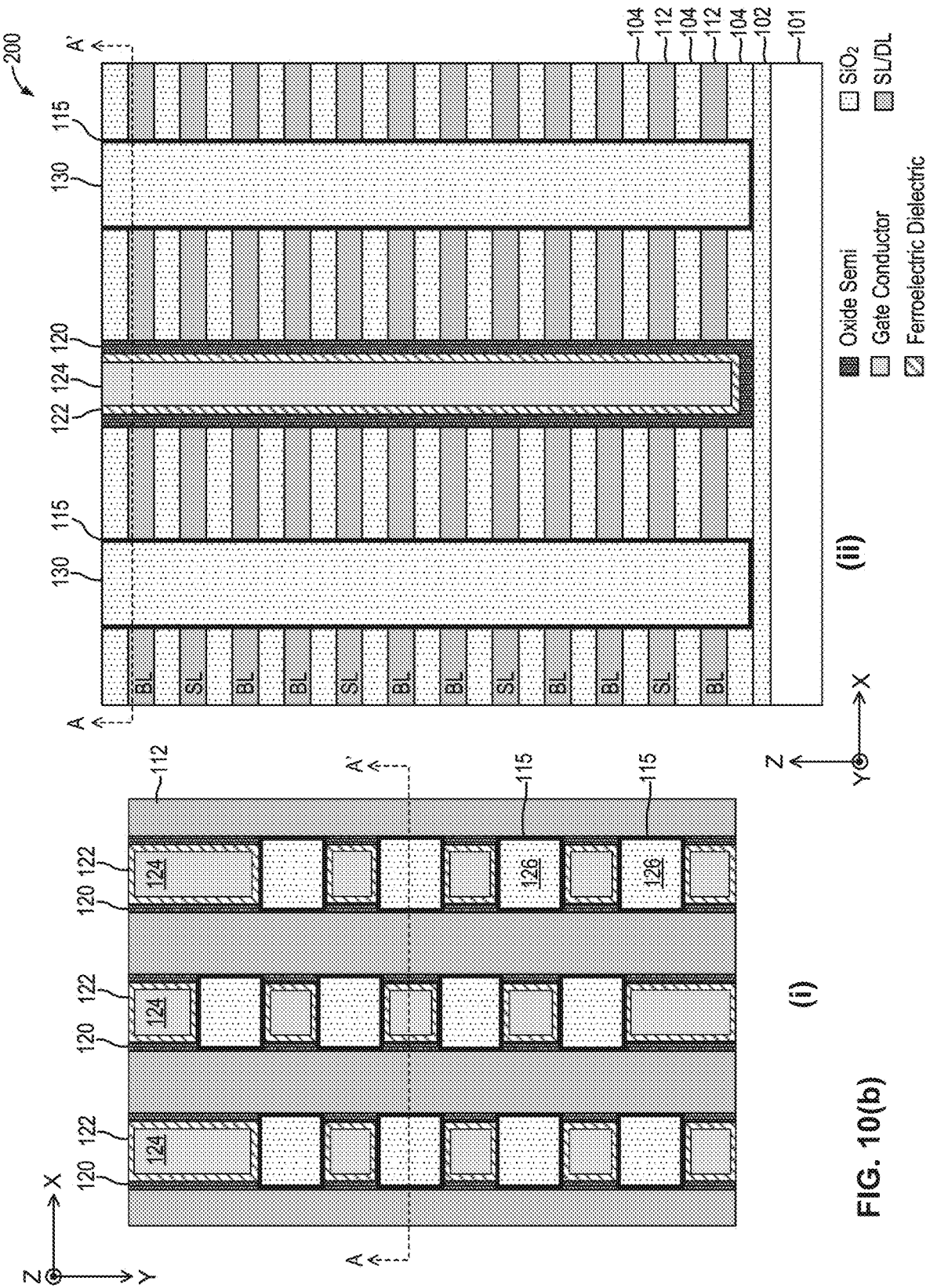

FIGS. 10(a) to 10(b) illustrate an alternative process for fabricating a memory structure including a 3-dimensional array of NOR memory strings of ferroelectric storage transistors according to embodiments of the present invention. Referring to FIG. 10(a), the memory structure 200 has been constructed in the same manner as described above with reference to FIGS. 9(a) to 9(h), with a resulting structure including alternating isolating dielectric layer 104 and conductive layer 112 and active stacks separated by trenches lined with the oxide semiconductor layer 120 and filled with the dielectric material 110, as shown in FIG. 9(h).

Thereafter, vias 114 are patterned and the dielectric material 110 exposed by the vias 114 are etched using, for example, an anisotropic etch. In the present embodiment, after the removal of the dielectric material 100 from vias 114, the exposed oxide semiconductor layer 120 in vias 114 is also removed, such as by an anisotropic dry etch or a wet etch process. As a result, the oxide semiconductor layer 120 remains only outside of the vias 114 and each segment of the oxide semiconductor layer 120 is separated from each other in the Y-direction, along the NOR memory strings to be formed. Subsequent processing steps described above with reference to FIGS. 9(j) to 9(n) are carried out to complete the fabrication of the memory structure 200. Referring to FIG. 10(b), LWL structures are formed in cavities between the vias 114. The LWL structures include the ferroelectric gate dielectric layer 122 and a conductive layer 124. The sacrificial material formed in vias 114 is replaced by a dielectric material 130, such as silicon oxide. As shown in the horizontal view (i) of FIG. 10(b), the oxide semiconductor layer 120 is separated along the NOR memory string in the Y-direction and is only provided adjacent each LWL structure.

Figure 11:
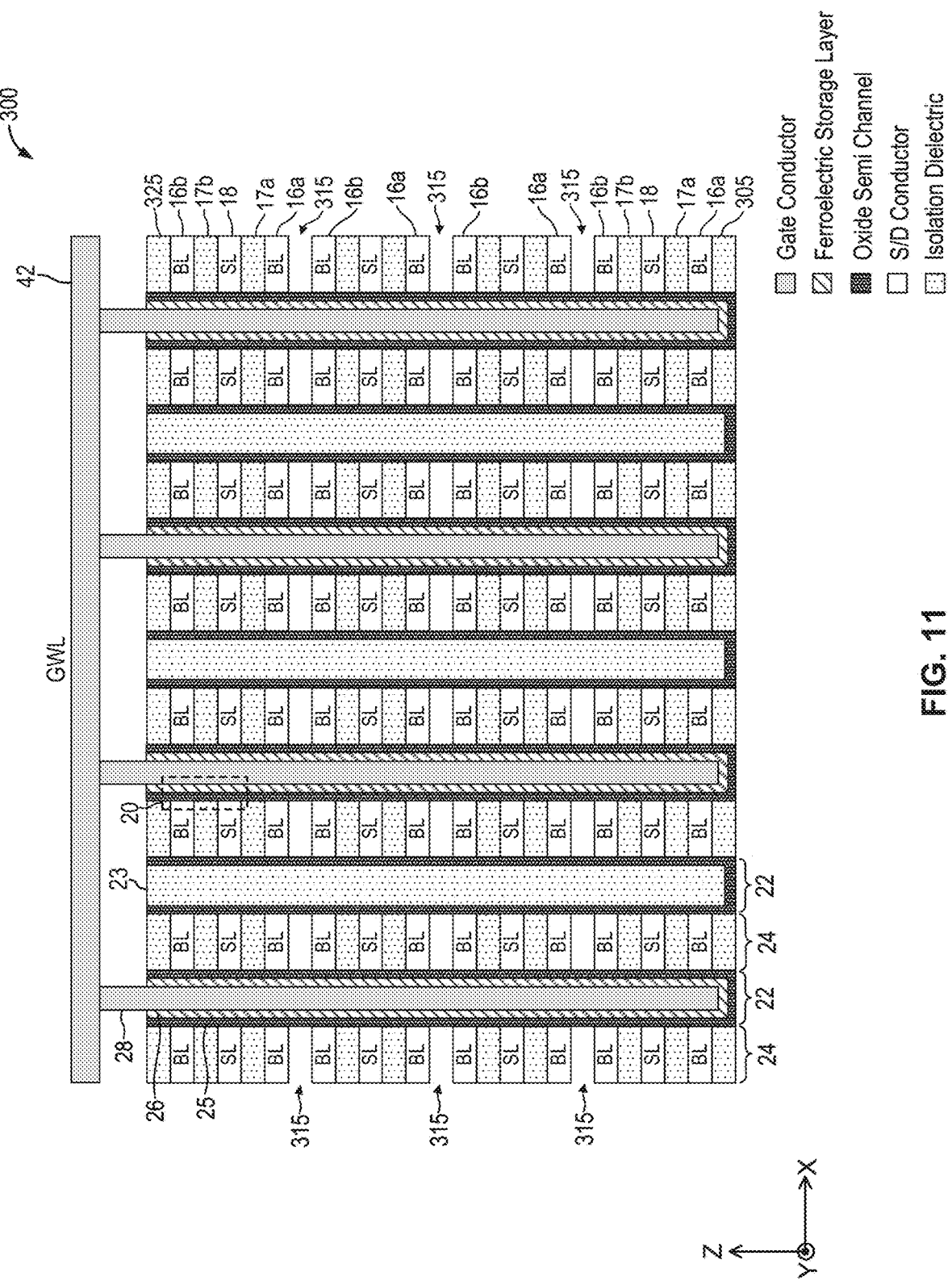
FIG. 11 is a cross-sectional view of a portion of a memory structure including the 3-dimensional array of NOR memory strings isolated by air gap cavities in embodiments of the present invention.

In embodiments of the present invention, the memory structure can be constructed using air gap as the insulation between pairs of NOR memory strings sharing a common source line. Air gaps have a dielectric constant approximately 1.0, which is considerably lower than most dielectric materials, thereby effectively reducing the parasitic capacitance between the bit line of one pair of NOR memory strings and the bit line of the adjacent pair of NOR memory string in the Z-direction. The air gaps improve the isolation between adjacent NOR memory string pairs and enhance the performance of the memory device formed therefrom. FIG. 11 is a cross-sectional view of a portion of a memory structure including the 3-dimensional array of NOR memory strings isolated by air gap cavities in embodiments of the present invention. Like elements in FIGS. 1, 3 and 11 are given like reference numerals to simplify the discussion. Referring to FIG. 11, a memory structure 300 includes a three dimensional array of NOR memory strings of ferroelectric storage transistors formed on a semiconductor substrate (not shown in FIG. 11). In the present embodiment, a pair of active stacks of NOR memory strings 24 bordering the same narrow trench 22 share a common oxide semiconductor channel region 25, a ferroelectric gate dielectric layer 26 and a gate electrode 28. The oxide semiconductor channel region 25 formed in one narrow trench 22 is isolated from the oxide semiconductor channel region 25 formed in the other narrow trenches 22. Each active stack 24 has ferroelectric storage transistors formed on both sides of the stack. In the case the LWL structures are staggered in the Y-direction, adjacent narrow trenches 22 have storage transistors that are formed offset from each other in the Y-direction such that an active stack 24 does not include storage transistors that are formed directly across the active stack in the X-direction. Local word line structures formed in each trench 22 are isolated from each other by a dielectric material 23.

In memory structure 300, each pair of active layers includes a first common bit line (first conductive layer 16a) and a common source line (second conductive layer 18), separated by an isolation layer 17a, and a second common bit line (third conductive layer 16b), separated from the common source line 18 by an isolation layer 17b, to form first and second NOR memory strings. In embodiments of the present disclosure, each pair of first and second NOR memory strings are separated from the other pairs in the Z-direction by an air gap or a cavity 315, also referred herein as an "air gap cavity." In this manner, the air gap 315 insulates adjacent bit lines in each active stack of the memory structure. The three dimensional array of NOR memory strings may include a bottom isolation layer 305 formed under the memory array to isolate the first conductive layer 16a from the semiconductor substrate. The three dimensional array of NOR memory strings may further include a top isolation layer 325 formed above the three dimensional array to isolate the memory array from conductive connectors formed above the memory array.

In the present description, an air gap refers to a cavity formed in the memory structure that is void of any materials. In some embodiments, the air gap 315 can be formed by replacing some of the isolation dielectric layers with an air-gap sacrificial layer during the multi-layer successive deposition process, such as that shown in FIG. 9(a). For example, in the multi-layer structure of FIG. 9(a), every third layer of the isolation dielectric layer 140, not counting the bottommost isolation dielectric layer, can be replaced by the air-gap sacrificial layer. In some embodiments, the air-gap sacrificial layer is a material with high etch selectivity to the conductive material used to form the source lines and bit lines 16a, 16b and 18, and also selective to the isolation material 17a, 17b used to isolate the source line and from the bit lines in a memory string. In some embodiments, the air-gap sacrificial layer can be a material selected from germanium (Ge), silicon germanium (SiGe), or carbon (C).

Subsequently, after the formation of the local word line structure in trenches 22, such as after the process of FIG. 9(n) where the memory structure 300 is formed including the oxide semiconductor channel 25, the ferroelectric gate dielectric layer 26 and the gate electrode 28, the air-gap sacrificial layer can then be etched away, such as through one or more shafts formed in the narrow trenches 22 at designated locations. The air-gap sacrificial layer can be etched using isotropic dry etch or wet etch or ashing in the case of a carbon sacrificial layer. The local word line structures and the dielectric material 23 formed in the trenches 22 between the active stacks 24 provide support for the active stacks 24. The air-gap sacrificial layer along the length of the NOR memory strings in the Y-direction is etched away to create long narrow cavities 315, referred herein as "air gaps" or "air gap cavities." that are bounded by adjacent bit line conductors. As thus formed, the memory structure 300 includes periodic air gaps 315 formed within the array, between each adjacent pair of bit line conductors 16b and 16a. These periodic air gaps 315 have a dielectric constant of approximately 1.0, which is considerably lower than the dielectric constant of insulating dielectric materials that can be used for the bit line isolation. For example, silicon oxide ($SiO_2$) has a dielectric constant of 4.0, as compared to the dielectric constant of 1.0 of the air gaps. With the use of the cavities or air gaps 315 as an insulating layer between adjacent bit lines, the parasitic capacitance between pairs of adjacent bit lines in the Z-direction is drastically reduced.

In some embodiments, after the air-gap sacrificial layer is removed, an air gap liner layer can be deposited to seal the surfaces exposed by the air gaps 315. For example, the air gap liner layer can be applied to seal the exposed conductive materials forming the common bit lines 16a and 16b and the exposed surface of the oxide semiconductor channel region 25. In some embodiments, the air gap liner layer is a dielectric material and, in some examples, the air gap liner layer is a silicon nitride layer or a silicon oxide layer lining the exposed surface created by the air gap cavities 315.

Figure 12:
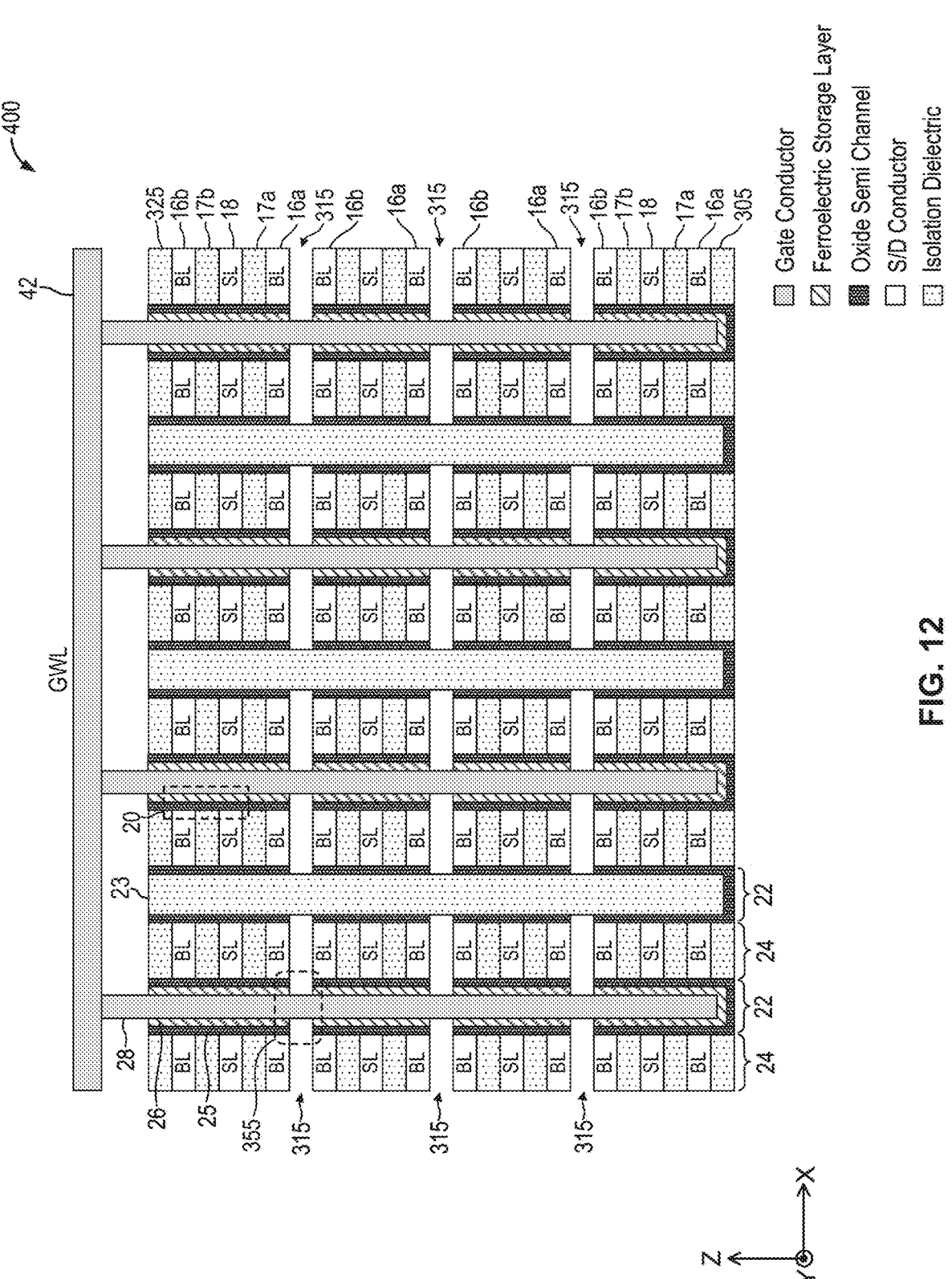
FIG. 12 is a cross-sectional view of a portion of a memory structure including the 3-dimensional array of NOR memory strings wherein the ferroelectric transistors are isolated by air gap cavities in alternate embodiments of the present invention.

In alternate embodiments, the cavities or air gaps 315 can be advantageously applied to segment the oxide semiconductor channel 25 at the region between adjacent pairs of NOR memory strings. Furthermore, in some embodiments, the cavities or air gaps 315 can be further applied to segment the ferroelectric gate dielectric layer 26 as well to isolate the ferroelectric gate dielectric layer to each pair of NOR memory strings. FIG. 12 is a cross-sectional view of a portion of a memory structure including the 3-dimensional array of NOR memory strings wherein the ferroelectric transistors are isolated by air gap cavities in alternate embodiments of the present invention. Like elements in FIGS. 11 and 12 are given like reference numerals to simplify the discussion. Referring to FIG. 12, a memory structure 400 is formed in substantially the same manner as the memory structure 300 in FIG. 11 to include air gaps or air gap cavities 315 between adjacent pairs of NOR memory strings. In memory structure 400, the formation of the air gap cavities 315 provide access to further etch away the exposed sidewalls of the oxide semiconductor channel 25. In some embodiments, the air gaps 315 are further used to etch away the exposed sidewalls of the ferroelectric gate dielectric layer 26. In some embodiments, the oxide semiconductor channel sidewall and the ferroelectric gate dielectric layer sidewall are etched or removed by a wet etch or an isotropic dry etch. The etch process of the oxide semiconductor channel sidewall and the ferroelectric gate dielectric layer sidewall should be selective to the bit line conductor layers 16a, 16b so that the bit line conductor layers 16a and 16b are minimally impacted by the etch process. After the etch process, the oxide semiconductor channel region and the ferroelectric gate dielectric layer between adjacent pairs of bit line conductors 16b, 16a are removed, as shown by the dotted circle 355. As a result, the oxide semiconductor channel 25 and the ferroelectric gate dielectric layer 26 are isolated to each pair of NOR memory strings in an active stack 24. Such isolation is beneficial to reduce parasitic capacitances as well elimination of interference between adjacent pairs of NOR memory strings in an active stack 24 (i.e. in the Z-direction). In embodiments of the present disclosure, the air cap cavities can be used to remove or segment only the oxide semiconductor channel 25 and the ferroelectric gate dielectric layer 26 can left remaining as a continuous layer.

As described above with reference to FIG. 11, an air gap liner layer can be deposited to seal the surfaces exposed by the air gaps 315. In particular, an air gap liner layer can be applied to seal the exposed conductive materials forming the common bit lines 16a and 16b, the exposed surface of the oxide semiconductor channel region as well as the exposed surface of the ferroelectric gate dielectric layer 26 in the air gap cavities 315. In some embodiments, the air gap liner layer can be a dielectric material, such as silicon nitride or silicon oxide.

In some embodiments, the memory structures 300, 400 in FIGS. 11 and 12 can be formed using sacrificial layers in place of the isolation layers 17a, 17b with the sacrificial layers being replaced by cavities or air gaps in later processing steps. In that case, the memory structure is formed with cavities or air gaps between each pair of source line and bit line. In this manner, the parasitic capacitance between an adjacent source line and bit line conductors is reduced. When sacrificial layers are replaced by cavities, the oxide semiconductor channel 25 and the ferroelectric gate dielectric layer 26 are preserved as they form the channel region and the gate dielectric of the ferroelectric storage transistor. In some embodiments, an air gap liner layer can be applied to seal the exposed surfaces of the air gap cavities.

In the above described embodiments, the ferroelectric storage transistors of the three dimensional array of NOR memory strings use an oxide semiconductor material to form the channel region. In further embodiments of the present invention, the NOR memory strings can be formed using a polysilicon material for the channel region. That is, the oxide semiconductor channel region 25 described in any of the above embodiments can be replaced by a polysilicon channel. In that case, an interface dielectric layer is added between the polysilicon channel region and the ferroelectric gate dielectric layer. In one embodiment, the interface dielectric layer is a silicon oxide layer ($SiO_2$), a silicon nitride layer ($Si_3N_4$), or an aluminum oxide layer.

In some embodiments, the source layer and the drain layer can be each formed using a conductive layer (such as metal) with or without a heavily doped polysilicon layer as the source or drain region. In one embodiment, the polysilicon channel is a heavily doped N-type layer to form a junctionless channel. The heavily doped N-type channel region forms a depletion mode ferroelectric transistor, in the same manner as an oxide semiconductor channel. In one embodiment, the polysilicon channel is doped with N-type dopants at a dopant concentration of about $2\text{-}5\times10^{18}$ $cm^{-3}$. The heavily doped N-type channel region enables direct contact with the metal conductors forming the source layer and the drain layer, eliminating the need for a polysilicon source-drain layer.

Figure 13:
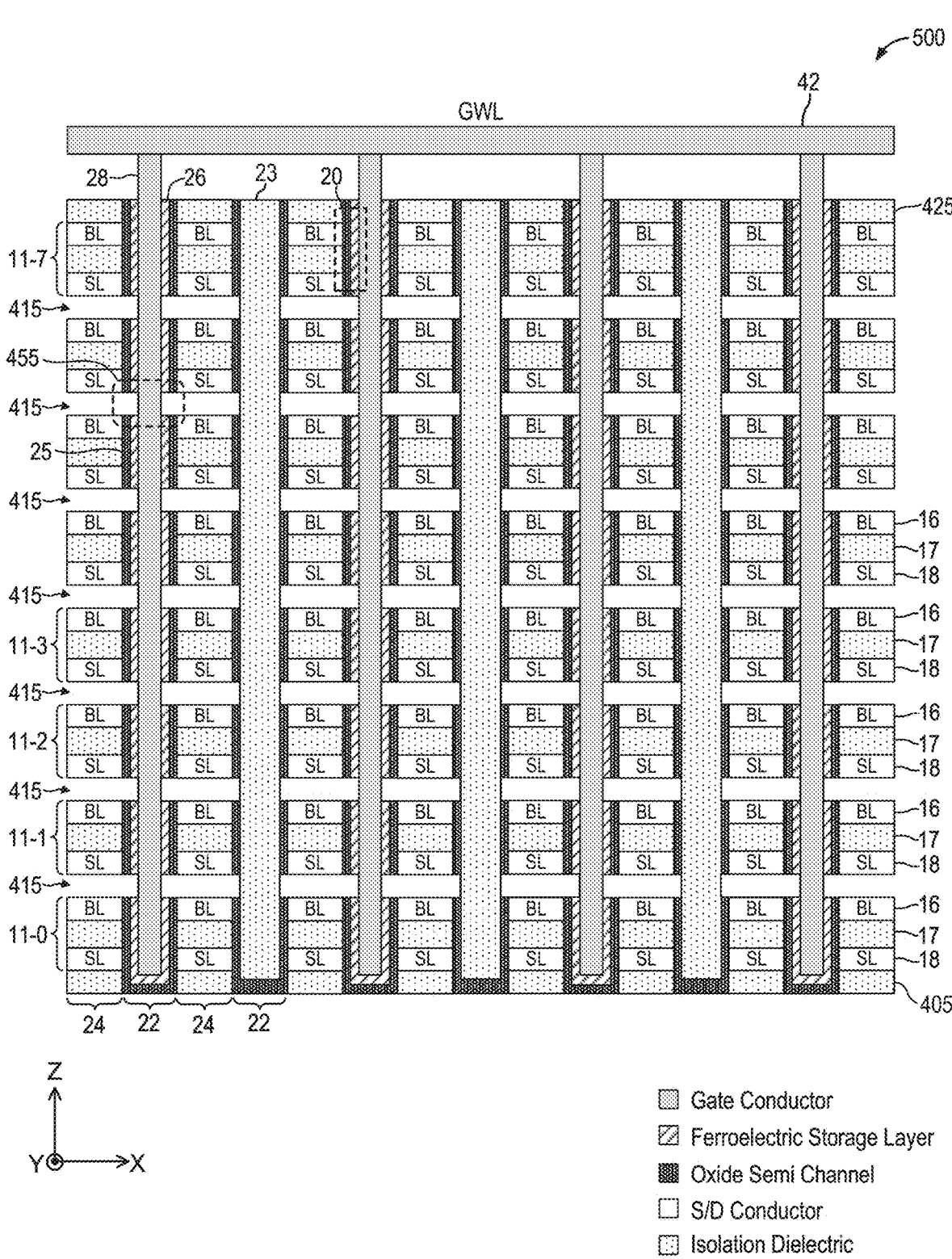
FIG. 13 is a cross-sectional view of a portion of a memory structure including the 3-dimensional array of NOR memory strings wherein the ferroelectric transistors are isolated by air gap cavities in alternate embodiments of the present invention.

In other aspects of the present disclosure, the air gap cavities can be applied in a memory structure for isolating individual NOR memory strings in an active stack. FIG. 13 is a cross-sectional view of a portion of a memory structure including the 3-dimensional array of NOR memory strings wherein the ferroelectric transistors are isolated by air gap cavities in alternate embodiments of the present invention. Like elements in FIGS. 1, 3 and 13 are given like reference numerals to simplify the discussion. Referring to FIG. 13, a memory structure 500 includes a three dimensional array of NOR memory strings of ferroelectric storage transistors formed on a semiconductor substrate (not shown in FIG. 13). The memory structure 500 is constructed using alternating conductive layers as the common bit lines and the common source lines. Therefore, adjacent pairs of NOR memory strings do not share a common source line, as in the above described embodiments. Accordingly, the memory structure 500 includes active stacks formed by individual NOR memory strings 11-0 to 11-7, each NOR memory string having its own common bit line 16 and common source line 18, separated by an isolation layer 17. In the present embodiment, each NOR memory string is formed adjacent to its own oxide semiconductor channel region 25 and ferroelectric gate dielectric layer 26. A pair of active stacks of NOR memory strings 24 bordering the same narrow trench 22 share a gate conductor 28. Each active stack 24 has ferroelectric storage transistors formed on both sides of the stack. In the case the LWL structures are staggered in the Y-direction, adjacent narrow trenches 22 have storage transistors that are formed offset from each other in the Y-direction such that an active stack 24 does not include storage transistors that are formed directly across the active stack in the X-direction. Local word line structures formed in each trench 22 are isolated from each other by a dielectric material 23.

In memory structure 500, each active layer, such as active layer 11-0 to 11-7, includes a common bit line (first conductive layer 16) and a common source line (second conductive layer 18), separated by the isolation layer 17 to form a NOR memory string. In embodiments of the present disclosure, each NOR memory strings are separated from the other NOR memory strings in the Z-direction by an air gap or air cap cavity 415. In this manner, the air gap cavity 415 insulates adjacent ferroelectric storage transistors in each active stack of the memory structure. The three dimensional array of NOR memory strings may include a bottom isolation layer 405 formed under the memory array to isolate the conductive layer 18 from the semiconductor substrate. The three dimensional array of NOR memory strings may further include a top isolation layer 425 formed above the three dimensional array to isolate the memory array from conductive connectors formed above the memory array.

The memory structure 500 is formed in substantially the same manner as the memory structure 300 in FIG. 11 to include air gaps or cavities for isolating the NOR memory strings. In some embodiments, the air gaps 415 in memory structure 500 can be formed by replacing some of the isolation layers with an air-gap sacrificial layer during the multi-layer successive deposition process, such as that shown in FIG. 9(a). For example, in the multi-layer structure of FIG. 9(a), every other layer of the isolation dielectric layer 140, not counting the bottommost isolation dielectric layer, can be replaced by the air-gap sacrificial layer. Subsequently, after the formation of the local word line structure in trenches 22, such as after the process of FIG. 9(n) where the memory structure 500 is formed including the oxide semiconductor channel 25, the ferroelectric gate dielectric layer 26 and the gate electrode 28, the air-gap sacrificial layer can then be etched away, such as through one or more shafts formed in the narrow trenches 22 at designated locations. The air-gap sacrificial layer can be etched using isotropic dry etch or wet etch or ashing in the case of a carbon sacrificial layer. The local word line structures and the dielectric material 23 formed in the trenches 22 between the active stacks 24 provide support for the active stacks 24. The air-gap sacrificial layer along the length of the NOR memory strings in the Y-direction is etched away to create the long narrow air gap cavities 415, that are bounded by adjacent bit line/source line conductors. Furthermore, in the present embodiment, the air gap cavities 415 are used as access to further etch away the exposed sidewalls of the oxide semiconductor channel 25 as well as the exposed sidewalls of the ferroelectric gate dielectric layer 26. In this manner, the oxide semiconductor channel 25 and the ferroelectric gate dielectric layer 26 are isolated to each NOR memory string. As thus formed, the memory structure 500 includes periodic air gaps 415 formed within the array, between each adjacent bit line 16 and source line 18 of adjacent NOR memory strings in an active stack. The periodic air gaps 415 has low dielectric constant which is beneficial to reduce the parasitic capacitance between the bit lines and sources lines in adjacent NOR memory strings in an active stack (Z-direction). Furthermore, by using the air gap cavities 415 to segment the oxide semiconductor channel and the ferroelectric gate dielectric layer to each NOR memory string, parasitic capacitances are further reduced and interference between adjacent of NOR memory strings in an active stack 24 (i.e. in the Z-direction) is minimized. In some embodiments, an air gap liner layer can be applied to seal the exposed surfaces of the air gap cavities.

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps.

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A three dimensional memory structure formed above a planar surface of a semiconductor substrate, the memory structure comprising:

a plurality of stacks of thin-film ferroelectric field-effect transistors (FeFETs) being organized as a plurality of stacks of NOR memory strings extending along a first direction substantially parallel to the planar surface of the semiconductor substrate, the NOR memory strings of each stack being provided one on top of another along a second direction substantially normal to the planar surface, the FeFETs within each NOR memory string sharing a common source layer and a common drain layer with each layer extending along the first direction, wherein (i) each stack of NOR memory strings comprises a plurality of memory string pairs arranged one on top of another along the second direction, each memory string pair being isolated from the other memory string pairs by a first isolation layer; (ii) each memory string pair comprises a first common drain layer, a first common source layer, and a second common drain layer, which are arranged in order and spaced apart from each other in the second direction by a second isolation layer; (iii) each memory string pair comprises a first NOR memory string formed by the first common drain layer and the first common source layer and a second NOR memory string formed by the second common drain layer and the first common source layer; (iv) a semiconductor layer is provided along the second direction and in contact with the common source layers and the common drain layers in the respective stack, wherein the semiconductor layer provided between adjacent common source layer and common drain layer in the second direction forms a channel region for the FeFETs of the respective NOR memory string; (v) a ferroelectric gate dielectric layer is provided adjacent the semiconductor layer and extending along the second direction; and (vi) a plurality of conductors are provided adjacent the ferroelectric gate dielectric layer between adjacent stacks of NOR memory strings and extending along the second direction, each conductor serving as a common gate electrode for respective FeFETs in the NOR memory strings of the adjacent stacks.

2. The memory structure of claim 1, wherein the ferroelectric gate dielectric layer comprises a ferroelectric polarization layer provided adjacent each conductor as a continuous layer in the second direction.

3. The memory structure of claim 1, wherein the semiconductor layer comprises a doped N-type polysilicon layer and the FeFETs each comprises a depletion mode transistor, wherein the memory structure further comprises an interface dielectric layer provided between the N-type polysilicon layer and the ferroelectric gate dielectric layer.

4. The memory structure of claim 3, wherein the interface dielectric layer comprises one or more of: a silicon nitride layer and an aluminum oxide layer.

5. The memory structure of claim 1, wherein the semiconductor layer comprises an oxide semiconductor layer.

6. The memory structure of claim 5, wherein the oxide semiconductor layer comprises one of an indium zinc oxide (IZO) layer and an indium gallium zinc oxide (IGZO) layer.

7. The memory structure of claim 5, wherein the ferroelectric gate dielectric layer contacts the oxide semiconductor layer directly substantially without an interface dielectric layer therebetween.

8. The memory structure of claim 1, wherein the semiconductor layer is provided as a continuous layer along the sidewall of each respective stack of NOR memory strings.

9. The memory structure of claim 8, wherein the semiconductor layer comprises a continuous layer formed on opposing sidewalls of adjacent stacks of NOR memory strings.

10. The memory structure of claim 9, wherein the semiconductor layer associated with a pair of adjacent stacks of NOR memory strings is isolated from the semiconductor layer associated with other pairs of adjacent stacks of NOR memory strings.

11. The memory structure of claim 1, wherein the semiconductor layer and the ferroelectric gate dielectric layer are formed adjacent a respective conductor between adjacent stacks and the semiconductor layer is isolated in the first direction from the semiconductor layer associated with other conductors provided between the same adjacent stacks.

12. The memory structure of claim 1, wherein the first isolation layer comprises air gap cavities.

13. The memory structure of claim 12, wherein the air gap cavities extend to the ferroelectric gate dielectric layer of the FeFETs in a stack of NOR memory strings, the semiconductor layer being provided only adjacent each memory string pair in the stack and being segmented by the air gap cavities between adjacent memory string pairs.

14. The memory structure of claim 13, wherein the air gap cavities extend to the conductor forming the common gate electrode of the FeFETs in a stack of NOR memory strings, the semiconductor layer and the ferroelectric gate dielectric layer being provided only adjacent each memory string pair in the stack and being segmented by the air gap cavities between adjacent memory string pairs.

15. The memory structure of claim 12 wherein the second isolation layer comprises air gap cavities.

16. The memory structure of claim 1, wherein the first isolation layer has a first dimension in the second direction and the second isolation layer has a second dimension in the second direction, the second dimension being the channel length of the FeFET.

17. The memory structure of claim 16, wherein the first dimension of the first isolation layer is less than the second dimension of the second isolation layer.

18. The memory structure of claim 16, wherein the first dimension of the first isolation layer is 30 nm and the second dimension of the second isolation layer has a value between 30 to 80 nm.

19. The memory structure of claim 1, wherein the common source layer and the common drain layer each comprises a metal layer.

20. The memory structure of claim 19, wherein the semiconductor layer associated with the FeFETs in each NOR memory string contacts the metal layers forming the common source layer and the common drain layer to provide a junction-less channel region for each FeFET.

21. The memory structure of claim 19, wherein the metal layer comprises one or more of: molybdenum, titanium, tungsten, lanthanum, tantalum, ruthenium, any silicide thereof, any nitride thereof, and any combination thereof.

22. The memory structure of claim 1, wherein the common drain layer of each NOR memory string functions as a common bit line for each NOR memory string.

23. The memory structure of claim 1, wherein the plurality of conductors each comprises a titanium nitride layer.

24. The memory structure of claim 23, wherein the plurality of conductors each comprises the titanium nitride layer formed adjacent the ferroelectric gate dielectric layer and a tungsten layer formed adjacent the titanium nitride layer.

25. The memory structure of claim 1, wherein the ferroelectric gate dielectric layer comprises a doped hafnium oxide layer.

26. The memory structure of claim 25, wherein the doped hafnium oxide layer comprises one or more of: zirconium-doped hafnium oxide (HZO), silicon-doped hafnium oxide (HSO), aluminum zirconium-doped Hafnium oxide (HfZrAlO), aluminum-doped hafnium oxide (HfO2:Al), lanthanum-doped hafnium oxide (HfO2:La), hafnium zirconium oxynitride (HfZrON), hafnium zirconium aluminum oxide (HfZrAlO) and any hafnium oxide that includes zirconium impurities.

27. The memory structure of claim 1, wherein each FeFET is electrically placed in a first polarization state by applying a first voltage to both the common source layer and the common drain layer and a second voltage to the associated common gate electrode; and each FeFET is electrically placed in a second polarization state by applying a third voltage to the common drain layer, a fourth voltage to the common source layer and a fifth voltage to the associated common gate electrode, the third voltage being different from the fourth voltage.

28. The memory structure of claim 1, wherein each FeFET is electrically placed in a first polarization state by applying a first voltage to both the common source layer and the common drain layer and at least a second voltage to the associated common gate electrode; and each FeFET is electrically placed in more than two polarization states by applying voltages to the common drain layer, the common source layer and the associated common gate electrode, the voltages having a different voltage range for each of the more than two polarization states.

29. The memory structure of claim 28, wherein the more than two polarization states comprise a continuum of analog states.

30. The memory structure of claim 27, wherein FeFETs formed in a column in the second direction in a respective stack of NOR memory strings are grouped to form a page of memory cells, the page of memory cells being placed in the first polarization state together by application of the first voltage to the respective common source layer and the common drain layer and application of the second voltage to the respective common gate electrode.

31. The memory structure of claim 27, wherein the common source layers of the NOR memory strings are electrically floating and a respective common source layer is biased to a given voltage during a precharge phase and is left floating afterwards.

32. The memory structure of claim 1, wherein each stack of NOR memory strings comprises FeFETs formed on the sidewalls on both sides of the stack.

33. The memory structure of claim 1, wherein circuitry for supporting memory operations is formed at the planar surface of the semiconductor substrate underneath the plurality of stacks of FeFETs.

34. The memory structure of claim 33, wherein the circuitry for supporting memory operations includes both analog and digital circuits.

35. The memory structure of claim 33, wherein the circuitry for supporting memory operations implements erase, program and read operations for the plurality of stacks of FeFETs in response to erase, program and read commands provided to the memory structure.

36. The memory structure of claim 33, further comprising a layer of interconnect conductors formed above and in electrically connection with the NOR memory strings and the circuitry for supporting memory operations, the layer of interconnect conductors being provided for routing control and data signals among the NOR memory strings and the circuitry for supporting memory operations.

37. The memory structure of claim 36, wherein the circuitry for supporting memory operations comprises two or more of: word line driver circuits, bit line driver circuits, input/output driver circuits, address decoders, sense amplifiers, voltage sources for generating operating voltages for the memory operation, latches, registers, or other memory elements, and a state machine for managing the memory operations at the FeFETs of the NOR memory strings.

38. The memory structure of claim 37, wherein the circuitry for supporting memory operations is coupled to a memory controller formed on a separate semiconductor substrate to receive the command and data signals from the memory controller.

39. The memory structure of claim 1, wherein each FeFET has a data retention time longer than 1 hour and a program/erase cycle endurance greater than $10^8$ program/erase cycles.

40. A three dimensional memory structure formed above a planar surface of a semiconductor substrate, the memory structure comprising:

a plurality of thin-film ferroelectric field-effect transistors (FeFETs) formed above the semiconductor substrate and arranged in one or more parallel planes, wherein (i) the thin-film FeFETs are organized as NOR memory strings, each NOR memory string extending along a first direction substantially parallel to the planar surface of the semiconductor substrate; (ii) the NOR memory strings are arranged in two directions: (a) as stacks of NOR memory strings, each stack including NOR memory strings arranged one on top of another along a second direction substantially normal to the planar surface and (b) as rows of NOR memory strings arranged along a third direction substantially orthogonal to both the first direction and the second direction; (iii) the FeFETs within each NOR memory string share a common source layer and a common drain layer, the common source layer and the common drain layer are arranged along the second direction and each extending along the first direction; (iv) pairs of adjacent NOR memory strings in the second direction within each stack share the same common source layer, adjacent pairs of NOR memory strings within each stack being isolated from the other pairs by a first isolation layer; (v) an oxide semiconductor layer is provided in contact with the common source layers and the common drain layers in the respective stack and extending along the second direction, the oxide semiconductor layer provided between adjacent common source layer and common drain layer in the second direction forming a channel region for the FeFETs of the respective NOR memory string; (vi) a ferroelectric gate dielectric layer is provided adjacent the oxide semiconductor layer and extending along the second direction; and (vii) a plurality of conductors are provided adjacent the ferroelectric gate dielectric layer between adjacent stacks of NOR memory strings and extending along the second direction, each conductor serving as a common gate electrode for respective FeFETs in the NOR memory strings of the adjacent stacks.

41. The memory structure of claim 40, wherein the ferroelectric gate dielectric layer comprises a ferroelectric polarization layer provided adjacent each conductor as a continuous layer in the second direction.

42. The memory structure of claim 40, wherein the oxide semiconductor layer is provided as a continuous layer in the second direction adjacent the common source layers and the common drain layers of each respective stack of NOR memory strings.

43. The memory structure of claim 40, wherein the common source layer and the common drain layer of the FeFETs within each NOR memory string are arranged spaced apart in the second direction by a second isolation layer, the second isolation layer having a second dimension in the second direction being the channel length of the FeFET.

44. The memory structure of claim 40, wherein the oxide semiconductor layer comprises one of an indium zinc oxide (IZO) layer and an indium gallium zinc oxide (IGZO) layer.

45. The memory structure of claim 40, wherein the oxide semiconductor layer and the ferroelectric gate dielectric layer are formed adjacent a respective conductor and the oxide semiconductor layer is isolated in the first direction from the oxide semiconductor layer associated with other conductors arranged along the first direction.

46. The memory structure of claim 40, wherein the first isolation layer comprises air gap cavities.

47. The memory structure of claim 46, wherein the air gap cavities extend to the ferroelectric gate dielectric layer of the FeFETs in a stack of NOR memory strings, the oxide semiconductor layer being provided only adjacent each memory string pair in the stack and being segmented by the air gap cavities between adjacent memory string pairs.

48. The memory structure of claim 46, wherein the air gap cavities extend to the conductor forming the common gate electrode of the FeFETs in a stack of NOR memory strings, the oxide semiconductor layer and the ferroelectric gate dielectric layer being provided only adjacent each memory string pair in the stack and being segmented by the air gap cavities between adjacent memory string pairs.

49. The memory structure of claim 40, wherein the common source layer and the common drain layer each comprises a metal layer; and wherein the oxide semiconductor layer associated with the FeFETs in each NOR memory string contacts the metal layers forming the common source layer and the common drain layer to provide a junction-less channel region for each FeFET.

50. The memory structure of claim 40, wherein the ferroelectric gate dielectric layer comprises a doped hafnium oxide layer.

51. The memory structure of claim 40, wherein each FeFET is electrically placed in a first polarization state by applying a first voltage to both the common source layer and the common drain layer and a second voltage to the associated common gate electrode; and each FeFET is electrically placed in a second polarization state by applying a third voltage to the common drain layer, a fourth voltage to the common source layer and a fifth voltage to the associated common gate electrode, the third voltage being different from the fourth voltage.

52. The memory structure of claim 51, wherein the common source layers of the NOR memory strings are electrically floating and a respective common source layer is biased to a given voltage during a precharge phase and is left floating afterwards.

\* \* \* \* \*